United States Patent
Yamazaki et al.

(10) Patent No.: US 11,726,376 B2
(45) Date of Patent: Aug. 15, 2023

(54) DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Yukinori Shima, Gunma (JP); Kenichi Okazaki, Tochigi (JP); Natsuko Takase, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/461,994

(22) PCT Filed: Nov. 16, 2017

(86) PCT No.: PCT/IB2017/057151
§ 371 (c)(1),
(2) Date: May 17, 2019

(87) PCT Pub. No.: WO2018/096425
PCT Pub. Date: May 31, 2018

(65) Prior Publication Data
US 2019/0317374 A1    Oct. 17, 2019

(30) Foreign Application Priority Data

Nov. 23, 2016  (JP) .............................. JP2016-227338
May 19, 2017  (JP) .............................. JP2017-099484

(51) Int. Cl.
*G02F 1/1368*    (2006.01)
*G02F 1/1343*    (2006.01)
(Continued)

(52) U.S. Cl.
CPC ........ *G02F 1/1368* (2013.01); *G02F 1/13439* (2013.01); *G02F 1/136277* (2013.01);
(Continued)

(58) Field of Classification Search
CPC ............... G02F 1/1368; G02F 1/13685; G02F 1/136286; G02F 1/136295; G02F 1/13454;
(Continued)

(56) References Cited

U.S. PATENT DOCUMENTS 6,922,217 B2 *  7/2005  Kim .................... G02F 1/13454
349/43
7,674,650 B2    3/2010  Akimoto et al.
(Continued)

FOREIGN PATENT DOCUMENTS

CN    101853883 A    10/2010
CN    101997006 A    3/2011
(Continued)

OTHER PUBLICATIONS

International Search Report (Application No. PCT/IB2017/057151) dated Feb. 13, 2018.
(Continued)

*Primary Examiner* — Paisley L Wilson
(74) *Attorney, Agent, or Firm* — Fish & Richardson P.C.

(57) ABSTRACT

A liquid crystal display device with a high aperture ratio is provided. A liquid crystal display device with low power consumption is provided.
The display device includes a display portion and a driver circuit portion. The display portion includes a liquid crystal element, a first transistor, a scan line, and a signal line. The driver circuit portion includes a second transistor. The liquid crystal element includes a pixel electrode, a liquid crystal layer, and a common electrode. Each of the scan line and the
(Continued)

signal line is electrically connected to the first transistor. The scan line and the signal line each include a metal layer. The structure of the first transistor is different from that of the second transistor. The first transistor is electrically connected to the pixel electrode. The first transistor includes a first region connected to the pixel electrode. The pixel electrode, the common electrode, and the first region have a function of transmitting visible light. Visible light passes through the first region and the liquid crystal element and is emitted to the outside of the display device.

18 Claims, 37 Drawing Sheets

(51) Int. Cl.
- *G02F 1/1362* (2006.01)
- *H01L 27/12* (2006.01)
- *H01L 29/786* (2006.01)
- *G02F 1/1345* (2006.01)
- *G02F 1/1333* (2006.01)

(52) U.S. Cl.
CPC .... *G02F 1/136286* (2013.01); *H01L 27/1225* (2013.01); *H01L 27/1251* (2013.01); *H01L 29/78648* (2013.01); *G02F 1/13338* (2013.01); *G02F 1/13454* (2013.01); *G02F 1/13685* (2021.01); *G02F 1/133388* (2021.01); *G02F 1/136295* (2021.01); *G02F 2202/103* (2013.01); *G02F 2202/104* (2013.01)

(58) Field of Classification Search
CPC ........... G02F 1/133388; H01L 27/1225; H01L 27/1229; H01L 27/1251; H01L 29/78645; H01L 29/78648
See application file for complete search history.

(56) References Cited

U.S. PATENT DOCUMENTS

| | | | |
|---|---|---|---|
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,354,674 B2 | 1/2013 | Kimura | |
| 8,384,085 B2 | 2/2013 | Kimura et al. | |
| 8,395,156 B2 | 3/2013 | Miyairi et al. | |
| 8,466,463 B2 | 6/2013 | Akimoto et al. | |
| 8,476,744 B2 | 7/2013 | Miyairi et al. | |
| 8,497,507 B2 | 7/2013 | Yang | |
| 8,629,069 B2 | 1/2014 | Akimoto et al. | |
| 8,669,550 B2 | 3/2014 | Akimoto et al. | |
| 8,742,422 B2 | 6/2014 | Sakakura et al. | |
| 8,790,959 B2 | 7/2014 | Akimoto et al. | |
| 8,796,069 B2 | 8/2014 | Akimoto et al. | |
| 8,829,511 B2* | 9/2014 | Hsieh | H01L 27/1225 |
| | | | 257/43 |
| 9,041,202 B2 | 5/2015 | Kimura | |
| 9,058,889 B2 | 6/2015 | Miyake | |
| 9,099,562 B2 | 8/2015 | Akimoto et al. | |
| 9,356,098 B2* | 5/2016 | Yamazaki | H01L 27/1251 |
| 9,397,255 B2 | 7/2016 | Kimura | |
| 9,437,831 B2 | 9/2016 | Yamazaki et al. | |
| 9,494,830 B2 | 11/2016 | Yamazaki et al. | |
| 9,559,316 B2 | 1/2017 | Yamazaki et al. | |
| 9,559,317 B2 | 1/2017 | Yamazaki et al. | |
| 9,601,516 B2 | 3/2017 | Sakakura et al. | |
| 9,853,161 B2 | 12/2017 | Shiota | |
| 9,939,692 B2 | 4/2018 | Yamazaki et al. | |
| 10,126,585 B2 | 11/2018 | Kimura et al. | |
| 10,191,345 B2* | 1/2019 | Lius | G02F 1/13624 |
| 10,192,897 B2* | 1/2019 | Lin | H01L 29/41733 |
| 10,211,235 B2* | 2/2019 | Suzumura | G03F 7/00 |
| 10,304,962 B2 | 5/2019 | Akimoto et al. | |
| 10,310,347 B2* | 6/2019 | Ishida | G02F 1/1368 |
| 10,312,315 B2 | 6/2019 | Yamazaki et al. | |
| 10,355,067 B2 | 7/2019 | Yamazaki et al. | |
| 10,551,662 B2 | 2/2020 | Kimura et al. | |
| 10,580,797 B2 | 3/2020 | Kimura | |
| 10,763,322 B2 | 9/2020 | Yamazaki et al. | |
| 10,847,432 B2* | 11/2020 | Ka | H01L 22/34 |
| 10,854,697 B2 | 12/2020 | Yamazaki et al. | |
| 10,872,947 B2 | 12/2020 | Yamazaki et al. | |
| 10,879,331 B2 | 12/2020 | Yamazaki et al. | |
| 11,004,925 B2 | 5/2021 | Yamazaki et al. | |
| 11,133,332 B2 | 9/2021 | Kimura | |
| 2008/0308805 A1 | 12/2008 | Akimoto et al. | |
| 2010/0193785 A1 | 8/2010 | Kimura | |
| 2010/0244037 A1* | 9/2010 | Shiota | H01L 29/78618 |
| | | | 257/72 |
| 2011/0031499 A1 | 2/2011 | Kimura et al. | |
| 2011/0104851 A1 | 5/2011 | Akimoto et al. | |
| 2011/0121290 A1 | 5/2011 | Akimoto et al. | |
| 2013/0157393 A1 | 6/2013 | Kimura | |
| 2014/0340608 A1* | 11/2014 | Yamazaki | H01L 29/78648 |
| | | | 349/47 |
| 2015/0168776 A1 | 6/2015 | Song et al. | |
| 2016/0363797 A1 | 12/2016 | Kimura et al. | |
| 2017/0186774 A1 | 6/2017 | Sakakura et al. | |
| 2017/0330902 A1 | 11/2017 | Kimura | |
| 2019/0051759 A1 | 2/2019 | Akimoto et al. | |
| 2019/0157314 A1 | 5/2019 | Kimura | |
| 2021/0257432 A1 | 8/2021 | Yamazaki et al. | |
| 2022/0005840 A1 | 1/2022 | Kimura | |

FOREIGN PATENT DOCUMENTS

| | | |
|---|---|---|
| CN | 106062619 A | 10/2016 |
| EP | 3012820 A | 4/2016 |
| JP | 07-249778 A | 9/1995 |
| JP | 2007-096055 A | 4/2007 |
| JP | 2007-123861 A | 5/2007 |
| JP | 2008-166789 A | 7/2008 |
| JP | 2009-033145 A | 2/2009 |
| JP | 2011-054942 A | 3/2011 |
| JP | 2011-077513 A | 4/2011 |
| JP | 2011-133873 A | 7/2011 |
| JP | 2011-155256 A | 8/2011 |
| JP | 2014-039247 A | 2/2014 |
| JP | 2015-014786 A | 1/2015 |
| JP | 2015-026830 A | 2/2015 |
| JP | 2015-062236 A | 4/2015 |
| JP | 2015-187701 A | 10/2015 |
| JP | 2016-167083 A | 9/2016 |
| KR | 2009-0119705 A | 11/2009 |
| KR | 2011-0015388 A | 2/2011 |
| KR | 2015-0071536 A | 6/2015 |
| KR | 2016-0125483 A | 10/2016 |
| TW | 201123423 | 7/2011 |
| TW | 201533637 | 9/2015 |
| WO | WO-2014/196550 | 12/2014 |
| WO | WO-2014/203711 | 12/2014 |
| WO | WO-2015/083029 | 6/2015 |
| WO | WO-2015/129057 | 9/2015 |

OTHER PUBLICATIONS

Written Opinion (Application No. PCT/IB2017/057151) dated Feb. 13, 2018.

Chinese Office Action (Application No. 201780070861.9) dated Sep. 16, 2021.

Indian Office Action (Application No. 201917022005) dated Jul. 21, 2021.

* cited by examiner

FIG. 2A1
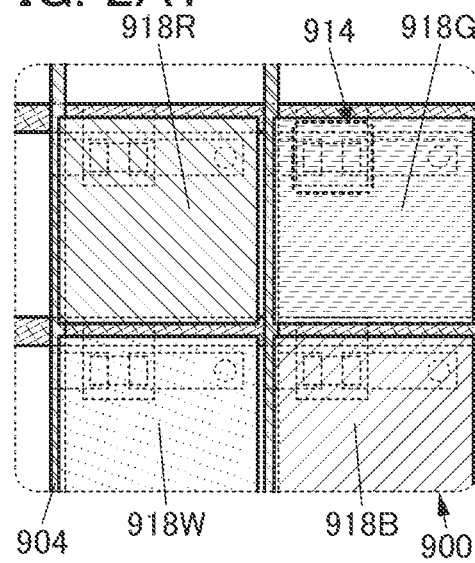
FIG. 2A2
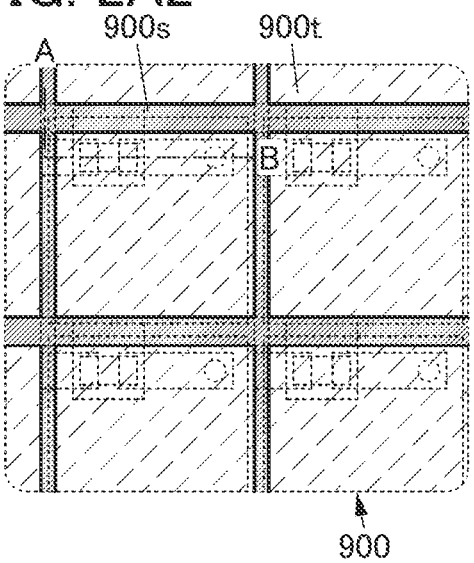
FIG. 2B
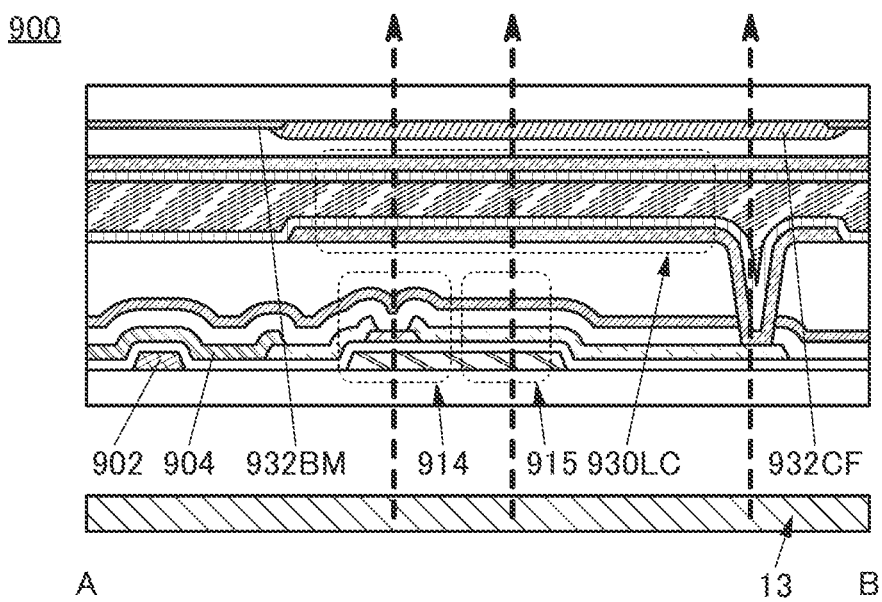

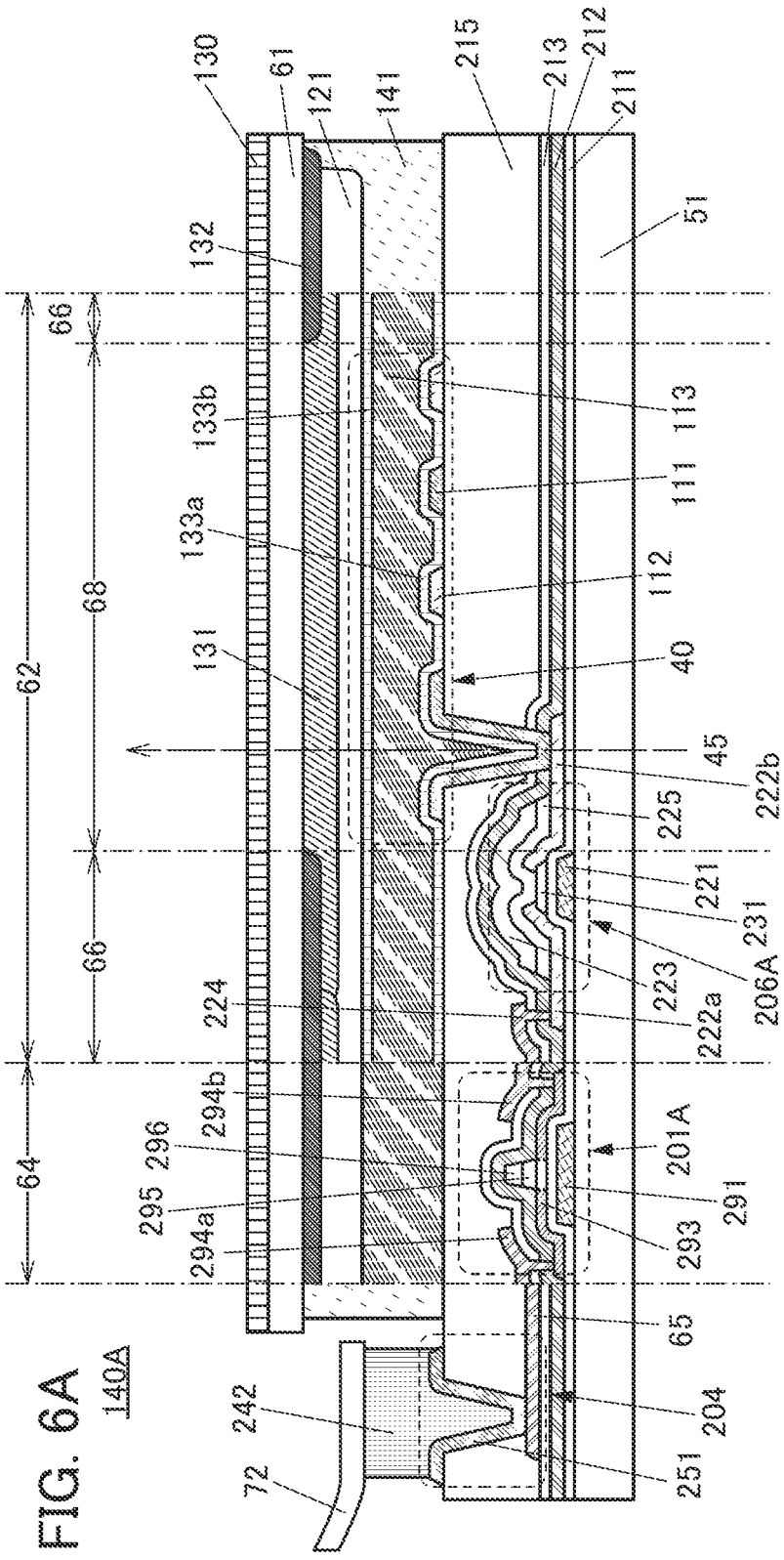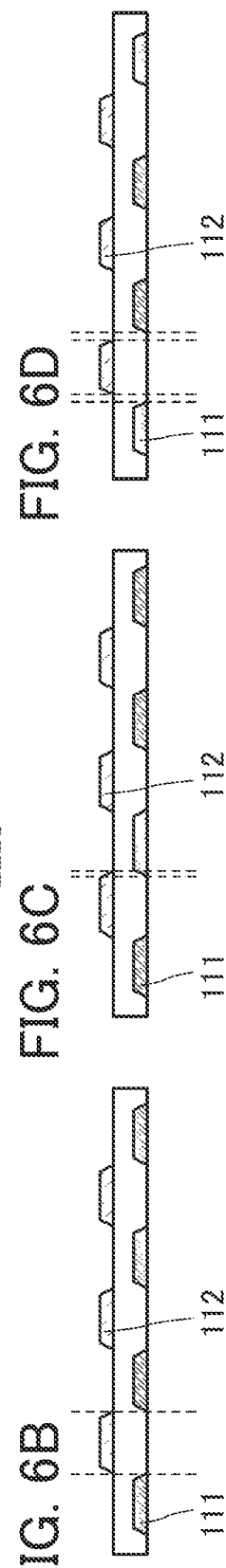

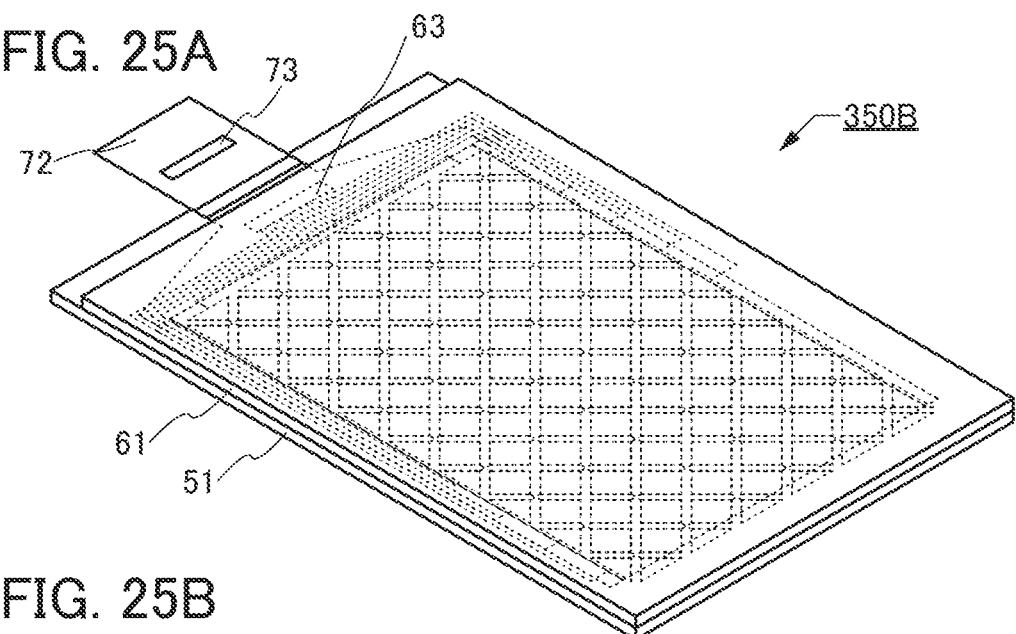
FIG. 25A
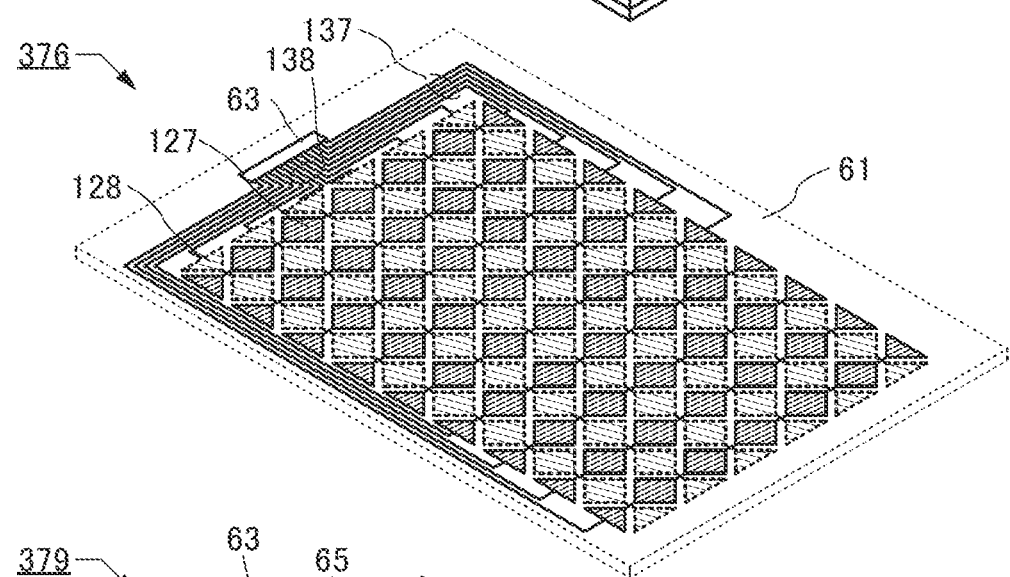
FIG. 25B
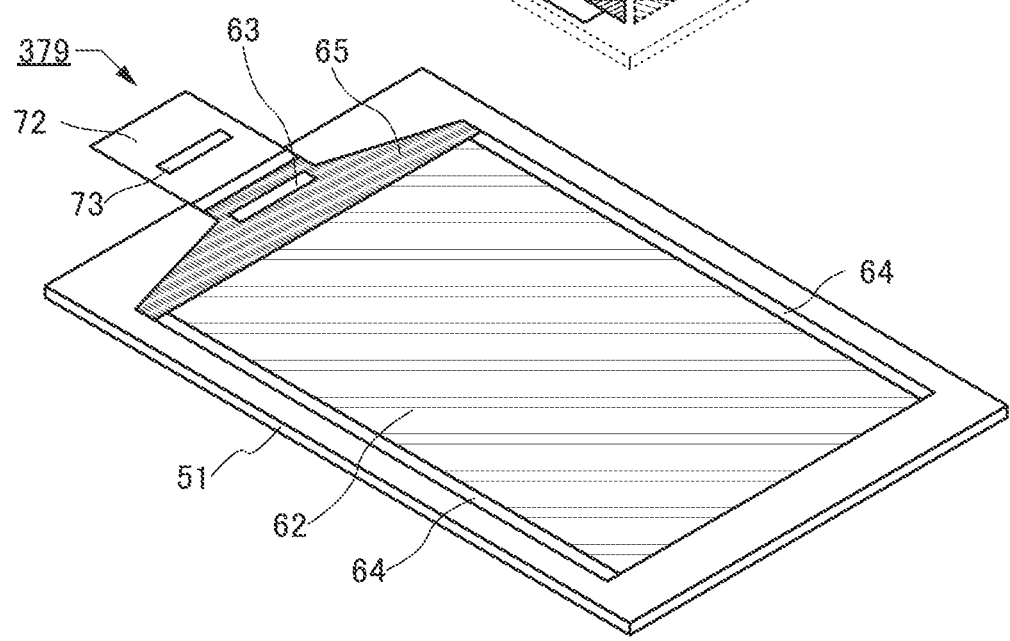

DISPLAY DEVICE, DISPLAY MODULE, AND ELECTRONIC DEVICE

CROSS REFERENCE TO RELATED APPLICATIONS

This application is a U.S. National Phase Application under 35 U.S.C. § 371 of International Application PCT/IB2017/057151, filed on Nov. 16, 2017, which claims the benefit of foreign priority applications filed in Japan as Application No. 2016-227338 on Nov. 23, 2016 and Application No. 2017-099484 on May 19, 2017, all of which are incorporated by reference.

TECHNICAL FIELD

Embodiments of the present invention relate to a liquid crystal display device, a display module, and an electronic device. One embodiment of the present invention relates to a method for manufacturing a liquid crystal display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

Transistors used for most flat panel displays such as liquid crystal display devices and light-emitting display devices are formed using silicon semiconductors, such as amorphous silicon, single crystal silicon, and polycrystalline silicon, which are formed over glass substrates. The transistors using silicon semiconductors are also used in integrated circuits (ICs) and the like.

In recent years, attention has been focused on a technique using a metal oxide exhibiting semiconductor characteristics for a transistor, instead of a silicon semiconductor. Note that in this specification, a metal oxide exhibiting semiconductor characteristics is referred to as an oxide semiconductor. For example, Patent Document 1 and Patent Document 2 disclose a technique in which a transistor using zinc oxide or an In—Ga—Zn-based oxide as an oxide semiconductor is manufactured and used for a switching element or the like of a pixel of a display device.

PRIOR ART DOCUMENT

Patent Document

[Patent Document 1] Japanese Published Patent Application No. 2007-123861
[Patent Document 2] Japanese Published Patent Application No. 2007-96055

SUMMARY OF THE INVENTION

Problems to be Solved by the Invention

An object of one embodiment of the present invention is to provide a liquid crystal display device with a high aperture ratio. An object of one embodiment of the present invention is to provide a liquid crystal display device with low power consumption. An object of one embodiment of the present invention is to provide a liquid crystal display device with high resolution. An object of one embodiment of the present invention is to provide a liquid crystal display device with a narrow frame. An object of one embodiment of the present invention is to provide a liquid crystal display device with high reliability.

An object of one embodiment of the present invention is to provide a method for manufacturing a liquid crystal display device at low cost with high mass productivity. An object of one embodiment of the present invention is to manufacture a liquid crystal display device using a large-sized substrate. An object of one embodiment of the present invention is to simplify a manufacturing process of a liquid crystal display device.

Note that the descriptions of these objects do not disturb the existence of other objects. One embodiment of the present invention does not need to achieve all the objects. Other objects can be derived from the descriptions of the specification, the drawings, and the claims.

Means for Solving the Problems

One embodiment of the present invention is a display device including a display portion and a driver circuit portion. The display portion includes a liquid crystal element, a first transistor, a scan line, and a signal line. The driver circuit portion includes a second transistor. The liquid crystal element includes a pixel electrode, a liquid crystal layer, and a common electrode. Each of the scan line and the signal line is electrically connected to the first transistor. The scan line and the signal line each include a metal layer. The structure of the first transistor is different from that of the second transistor. The first transistor is electrically connected to the pixel electrode. The first transistor includes a first region connected to the pixel electrode. The pixel electrode, the common electrode, and the first region have a function of transmitting visible light. Visible light passes through the first region and the liquid crystal element and is emitted to the outside of the display device.

Here, structures are exemplified in which a first transistor and the second transistor have different structures. As an example, a structure can be given in which the first transistor is a bottom-gate transistor and the second transistor is a top-gate transistor. As an example, a structure can be given in which a channel region of the first transistor contains a metal oxide and a channel region of the second transistor contains silicon. As an example, a structure can be given in which the channel region of the first transistor and the channel region of the second transistor contain the same materials and the materials have different crystal structures.

The scan line preferably includes a portion overlapping with the channel region of the first transistor.

The first region preferably contains a metal oxide.

The channel region and the first region of the first transistor may contain a metal oxide. In that case, the metal oxide in the first region preferably contains one or more kinds of metal elements contained in the metal oxide in the channel region.

One embodiment of the present invention is a display module including the display device having any of the above structures, where a connector such as a flexible printed circuit (hereinafter also referred to as FPC) board or a TCP (Tape Carrier Package) is attached or an IC is implemented by a COG (Chip On Glass) method, a COF (Chip On Film) method, or the like.

One embodiment of the present invention is an electronic device including the above display module and at least any one of an antenna, a battery, a housing, a camera, a speaker, a microphone, and an operation button.

Effect of the Invention

One embodiment of the present invention can provide a liquid crystal display device with a high aperture ratio. Another embodiment of the present invention can provide a liquid crystal display device with low power consumption. Another embodiment of the present invention can provide a liquid crystal display device with high resolution. Another embodiment of the present invention can provide a liquid crystal display device with a narrow frame. Another embodiment of the present invention can provide a liquid crystal display device with high reliability.

One embodiment of the present invention can provide a method for manufacturing a liquid crystal display device at low cost with high mass productivity. One embodiment of the present invention can manufacture a liquid crystal display device using a large-sized substrate. One embodiment of the present invention can simplify a manufacturing process of a liquid crystal display device.

Note that the descriptions of the effects do not disturb the existence of other effects. One embodiment of the present invention does not need to have all the effects. Other effects can be derived from the descriptions of the specification, the drawings, and the claims.

BRIEF DESCRIPTION OF THE DRAWINGS

FIGS. 2A1, 2A2, and 2B are top views and a cross-sectional view illustrating an example of a display device.

FIGS. 6A-6D are cross-sectional views illustrating examples of display devices.

FIGS. 25A and 25B are perspective views illustrating an example of a display device.

MODE FOR CARRYING OUT THE INVENTION

Figure 1A:
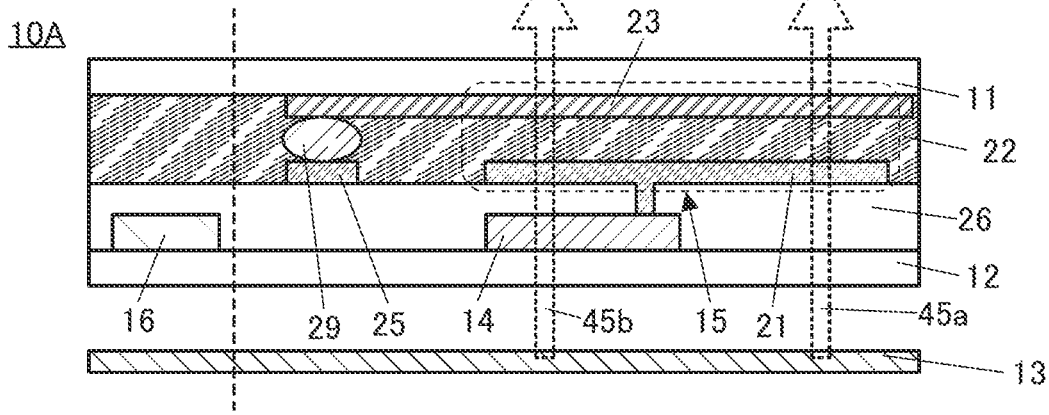
FIGS. 1A-1C are cross-sectional views illustrating examples of display devices.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, an OS FET can also be called a transistor including a metal oxide or an oxide semiconductor.

In this specification and the like, metal oxides containing nitrogen are also collectively referred to as a metal oxide in some cases. Moreover, metal oxides containing nitrogen may be referred to as a metal oxynitride.

Embodiment 1

In this embodiment, display devices of embodiments of the present invention will be described with reference to FIG. 1 to FIG. 25.

Structure Example 1 of Display Device

First, the display device of this embodiment will be described with reference to FIG. 1 and FIG. 2.

The display device of this embodiment includes a display portion and a driver circuit portion. The display portion includes a liquid crystal element and a first transistor. The driver circuit portion includes a second transistor. The liquid crystal element includes a pixel electrode, a liquid crystal layer, and a common electrode. The structure of the first transistor is different from that of the second transistor. The first transistor is electrically connected to the pixel electrode. The first transistor includes a first region. The pixel electrode, the common electrode, and the first region have a function of transmitting visible light. Visible light passes through the first region and the liquid crystal element and is emitted to the outside of the display device. The first region of the transistor may be a region connected to the pixel electrode, for example.

In the display device of this embodiment, the first transistor includes a region transmitting visible light. For example, a contact portion between the first transistor and the pixel electrode transmits visible light; thus, the contact portion can be provided in a display region. Accordingly, the aperture ratio of a pixel can be increased and the light extraction efficiency can be increased. Since the light extraction efficiency in the pixel can be increased, the luminance of a backlight unit can be reduced. As a result, the power consumption of the display device can be reduced. Furthermore, high resolution of the display device can be achieved.

In the display device of this embodiment, the transistor structure of the display portion is different from the transistor structure of the driver circuit portion. Thus, transistors with respective suitable structures can be employed for the display portion and the driver circuit portion. In addition, some of manufacturing steps for the transistor in the driver circuit portion can also serve as some of manufacturing steps for the transistor in the display portion. Accordingly, an increase in the number of manufacturing steps for the display device can be inhibited. Furthermore, a decrease in the yield due to an increase in the number of steps can be inhibited. For example, in the method for manufacturing a display device of this embodiment, a gate electrode of the transistor in the display portion and a gate electrode of the transistor in the driver circuit portion can be formed in the same process.

The display portion further includes a scan line and a signal line. Each of the scan line and the signal line is electrically connected to the first transistor. The scan line and the signal line each include a metal layer. With the use of metal layers for the scan line and the signal line, the resistance of the scan line and the signal line can be reduced. Metal layers are also used for the transistor, a wiring, and the like in the driver circuit portion. The scan line and the signal line are preferably formed in the same process as the transistor, the wiring, and the like in the driver circuit portion.

The scan line preferably includes a portion overlapping with a channel region of the first transistor. Depending on a material for the channel region of the first transistor, light irradiation changes the characteristics of the first transistor in some cases. When the scan line includes a portion overlapping with the channel region of the first transistor, the channel region can be prevented from being irradiated with external light, light from the backlight, or the like. As a result, the reliability of the first transistor can be increased.

FIG. 1 shows cross-sectional views of display devices of this embodiment.

A display device 10A illustrated in FIG. 1(A) includes a substrate 11, a substrate 12, a transistor 14, a transistor 16, a liquid crystal element 15, and the like. A backlight unit 13 is positioned on the substrate 12 side of the display device 10A.

The transistor 14 is provided in a display portion of the display device 10A. The transistor 16 is provided in a driver circuit portion of the display device 10A. The transistor 14 and the transistor 16 include different portions. The two transistors have different kinds of semiconductor layers, shapes, or the like. Providing transistors with respective suitable structures for the display portion and the driver circuit can improve the performance of the display device.

The liquid crystal element 15 includes a pixel electrode 21, a liquid crystal layer 22, and a common electrode 23. The pixel electrode 21 is electrically connected to the transistor 14 through an opening provided in the insulating layer 26. Over the insulating layer 26, a conductive layer 25 formed using the same process and the same material as those for the pixel electrode 21 is provided. The conductive layer 25 is electrically connected to the common electrode 23 through a connector 29.

Light 45a from the backlight unit 13 is emitted to the outside of the display device 10A through the substrate 12, the insulating layer 26, the pixel electrode 21, the liquid crystal layer 22, the common electrode 23, and the substrate 11. As materials for these layers that transmit the light 45a, visible-light-transmitting materials are used.

Light 45b from the backlight unit 13 is emitted to the outside of the display device 10A through the substrate 12, the transistor 14, the insulating layer 26, the pixel electrode 21, the liquid crystal layer 22, the common electrode 23, and the substrate 11. In the display device 10A, the transistor 14 electrically connected to the liquid crystal element 15 includes a region transmitting visible light. Thus, a region where the transistor 14 is provided can also be used as a display region. Therefore, the aperture ratio of a pixel can be increased. As the aperture ratio is increased, the light extraction efficiency can be increased. Accordingly, the power consumption of the display device can be reduced. Furthermore, the display device can have high resolution.

The display device of this embodiment can be used for a display device in which a touch sensor is mounted (also referred to as an input/output device or a touch panel).

Figure 1B:
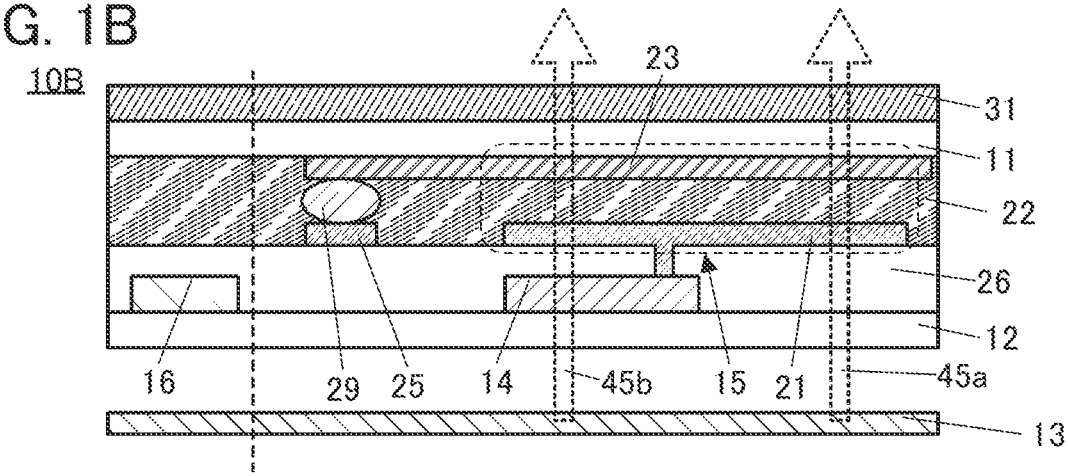

A display device 10B illustrated in FIG. 1(B) has a structure in which a touch sensor unit 31 is provided on the substrate 11 side of the display device 10A.

Figure 1C:
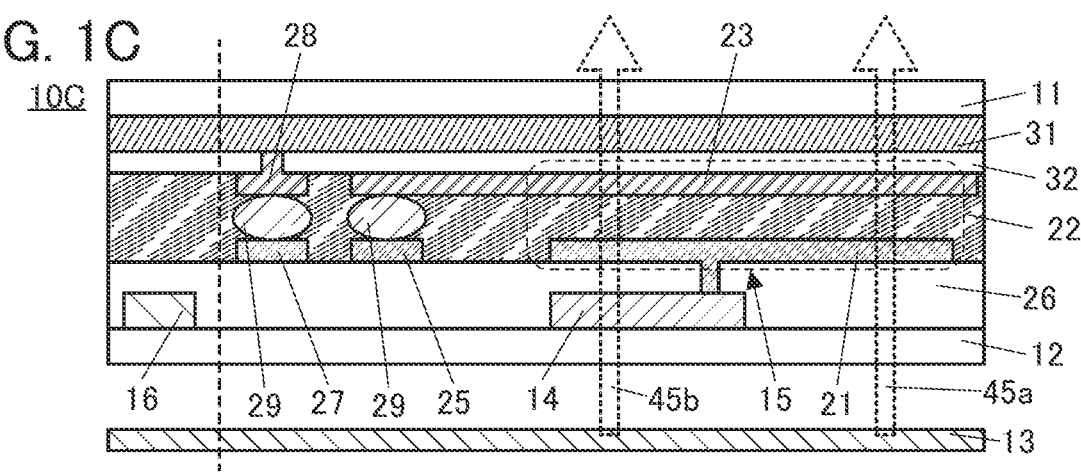

A display device 10C illustrated in FIG. 1(C) has a structure in which the touch sensor unit 31 and an insulating layer 32 are provided between the substrate 11 and the common electrode 23 of the display device 10A. The display device 10C further includes a conductive layer 27 and a conductive layer 28.

Over the insulating layer 26, the conductive layer 27 formed using the same process and the same material as those for the pixel electrode 21 is provided. The conductive layer 28 formed using the same process and the same material as those for the common electrode 23 is provided in contact with the insulating layer 32. The conductive layer 28 is electrically connected to the touch sensor unit 31. The conductive layer 28 is electrically connected to the conductive layer 27 through the connector 29. Thus, by one or more FPCs connected on the substrate 12 side, both a signal for driving the liquid crystal element 15 and a signal for driving the touch sensor unit 31 can be supplied to the display device 10C. An FPC or the like does not need to be connected on the substrate 11 side; thus, the structure of the display device can be further simplified. Compared with the case where FPCs are connected on both the substrate 11 side and the substrate 12 side, the display device can easily be incorporated into an electronic device and the number of components can be reduced.

In the display device 10C, the touch sensor unit 31 can be provided between the pair of substrates; thus, the number of substrates can be reduced, resulting in a reduction in weight and thickness of the display device.

[Pixel]

Next, a pixel included in the display device of this embodiment will be described with reference to FIG. 2.

FIG. 2(A1) shows a schematic top view of a pixel 900. The pixel 900 in FIG. 2(A1) includes four subpixels. FIG. 2(A1) shows an example in which the subpixels are arranged two by two in vertical and horizontal directions in the pixel 900. Each of the subpixels is provided with a transmissive liquid crystal element 930LC (not illustrated in FIGS. 2(A1) and (A2)), a transistor 914, and the like. In FIG. 2(A1), the pixel 900 is provided with two wirings 902 and two wirings 904. In the subpixels in FIG. 2(A1), display regions (a display region 918R, a display region 918G, a display region 918B, and a display region 918W) of the liquid crystal element are illustrated.

The pixel 900 includes the wiring 902, the wiring 904, and the like. The wiring 902 serves as a scan line, for example. The wiring 904 serves as a signal line, for example. The wiring 902 and the wiring 904 intersect with each other at a portion.

The transistor 914 serves as a selection transistor. A gate of the transistor 914 is electrically connected to the wiring 902. One of a source and a drain of the transistor 914 is electrically connected to the wiring 904, and the other is electrically connected to the liquid crystal element 930LC.

Here, the wiring 902 and the wiring 904 have a light-blocking property. A visible-light-transmitting film is preferably used for layers other than the wirings, that is, layers constituting the transistor 914, a wiring connected to the transistor 914, a contact portion, a capacitor, and the like.

FIG. 2(A2) is an example clearly showing the pixel 900 in FIG. 2(A1) divided into a transmissive region 900*t* transmitting visible light and a light-blocking region 900*s* blocking visible light. The transistor is thus formed using a visible-light-transmitting film, whereby an area except a portion where the wiring 902 and the wiring 904 are provided can serve as the transmissive region 900*t*. The transmissive region of the liquid crystal element can overlap with the transistor, the wiring connected to the transistor, the contact portion, the capacitor, and the like, and thus, the aperture ratio of the pixel can be increased.

Note that as the proportion of the area of the transmissive region to the area of the pixel increases, the amount of transmitted light can be increased. The proportion of the area of the transmissive region to the area of the pixel is, for example, higher than or equal to 1% and lower than or equal to 95%, preferably higher than or equal to 10% and lower than or equal to 90%, more preferably higher than or equal to 20% and lower than or equal to 80%. The proportion of the area of the transmissive region to the area of the pixel is particularly preferably higher than or equal to 40% or higher than or equal to 50%, more preferably higher than or equal to 60% and lower than or equal to 80%.

FIG. 2(B) shows a cross-sectional view corresponding to a section along dashed-dotted line A-B in FIG. 2(A2). Note that FIG. 2(B) also shows cross sections of the liquid crystal element 930LC, a coloring film 932CF, a light-blocking film 932BM, a capacitor 915, and the like, which are not shown in the top view.

As shown in FIG. 2(B), light from the backlight unit 13 is emitted in the direction indicated by dashed arrows. The light from the backlight unit 13 is extracted to the outside through the contact portion between the transistor 914 and the liquid crystal element 930LC, the transistor 914, the capacitor 915, and the like. Therefore, films included in the transistor 914 and the capacitor 915, and the like also preferably transmit visible light. As the area of the transmissive region of the transistor 914, the capacitor 915, and the like increases, light from the backlight unit 13 can be used more efficiently.

Note that as illustrated in FIG. 2(B), light from the backlight unit 13 may be extracted to the outside through the coloring film 932CF. The light extracted through the coloring film 932CF can be colored in a desired color. The coloring film 932CF can be selected from coloring films of red (R) green (G), blue (B), cyan (C), magenta (M), yellow (Y), and the like.

In FIG. 2(B), light from the backlight unit 13 enters the transistor 914, the capacitor 915, and the like, first. Then, the light having passed through the transistor 914, the capacitor 915, and the like enters the liquid crystal element 930LC. Then, light having passed through the liquid crystal element 930LC is extracted to the outside through the coloring film 932CF.

For the transistors, wirings, capacitors, and the like illustrated in FIG. 2, the materials described below can be used. Note that these materials can also be used for a visible-light-transmitting semiconductor layer and a visible-light-transmitting conductive layer in each of the structure examples described in this embodiment.

A semiconductor film included in the transistor can be formed using a visible-light-transmitting semiconductor material. Examples of the visible-light-transmitting semiconductor material include a metal oxide and an oxide semiconductor. The oxide semiconductor preferably contains at least indium. In particular, indium and zinc are preferably contained. Moreover, in addition to them, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

A conductive film included in the transistor can be formed using a visible-light-transmitting conductive material. The visible-light-transmitting conductive material preferably contains one or more kinds selected from indium, zinc, and tin. Specific examples of the visible-light-transmitting conductive material include an In oxide, an In—Sn oxide (also referred to as ITO: Indium Tin Oxide), an In—Zn oxide, an In—W oxide, an In—W—Zn oxide, an In—Ti oxide, an In—Sn—Ti oxide, an In—Sn—Si oxide, a Zn oxide, and a Ga—Zn oxide, and the like.

For the conductive film included in the transistor, an oxide semiconductor that contains an impurity element, for example, and has reduced resistance may be used. The oxide semiconductor with reduced resistance can be referred to for an oxide conductor (OC).

For example, as for an oxide conductor, oxygen vacancies are formed in an oxide semiconductor, hydrogen is added to the oxygen vacancies, and a donor level is formed in the vicinity of the conduction band; the formation of the donor level in the oxide semiconductor increases the conductivity of the oxide semiconductor, so that the oxide semiconductor becomes a conductor.

Note that an oxide semiconductor has a large energy gap (e.g., an energy gap of 2.5 eV or larger), and thus has a visible-light-transmitting property. An oxide conductor is an oxide semiconductor having a donor level in the vicinity of the conduction band, as described above. Therefore, an oxide conductor is less likely to be influenced by absorption due to the donor level, and has a visible-light-transmitting property comparable to that of an oxide semiconductor.

The oxide conductor preferably contains one or more kinds of metal elements contained in the semiconductor film of the transistor. When the oxide semiconductors including the same metal element is used for two or more layers included in the transistor, the same manufacturing apparatus (e.g., a deposition apparatus or a processing apparatus) can be used in two or more steps, resulting in a reduction in manufacturing cost.

The structure of the pixel in the display device described in this embodiment enables efficient use of light emitted from the backlight unit. Thus, the excellent display device with reduced power consumption can be provided.

Structure Example 2 of Display Device

Next, display devices of this embodiment will be described with reference to FIG. 3 to FIG. 8.

First, a display device 100A will be described with reference to FIG. 3 to FIG. 5.

Figure 3:
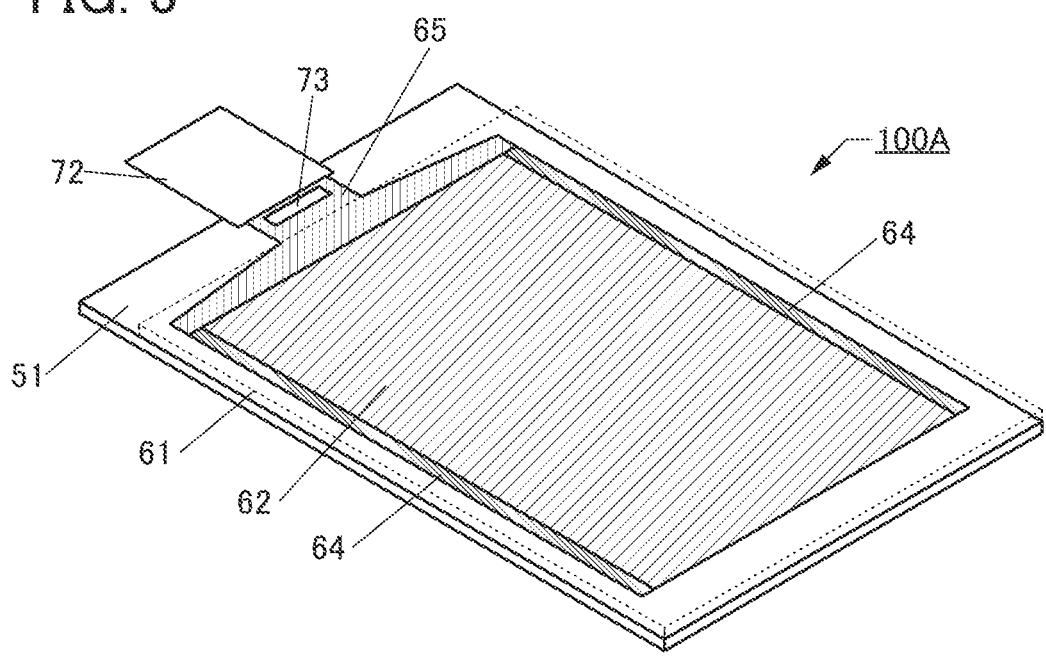
FIG. 3 is a perspective view illustrating an example of a display device.

FIG. 3 is a perspective view of the display device 100A. For clarity, components such as a polarizer 130 are not shown in FIG. 3. FIG. 3 illustrates a substrate 61 with dashed lines.

Figure 4:
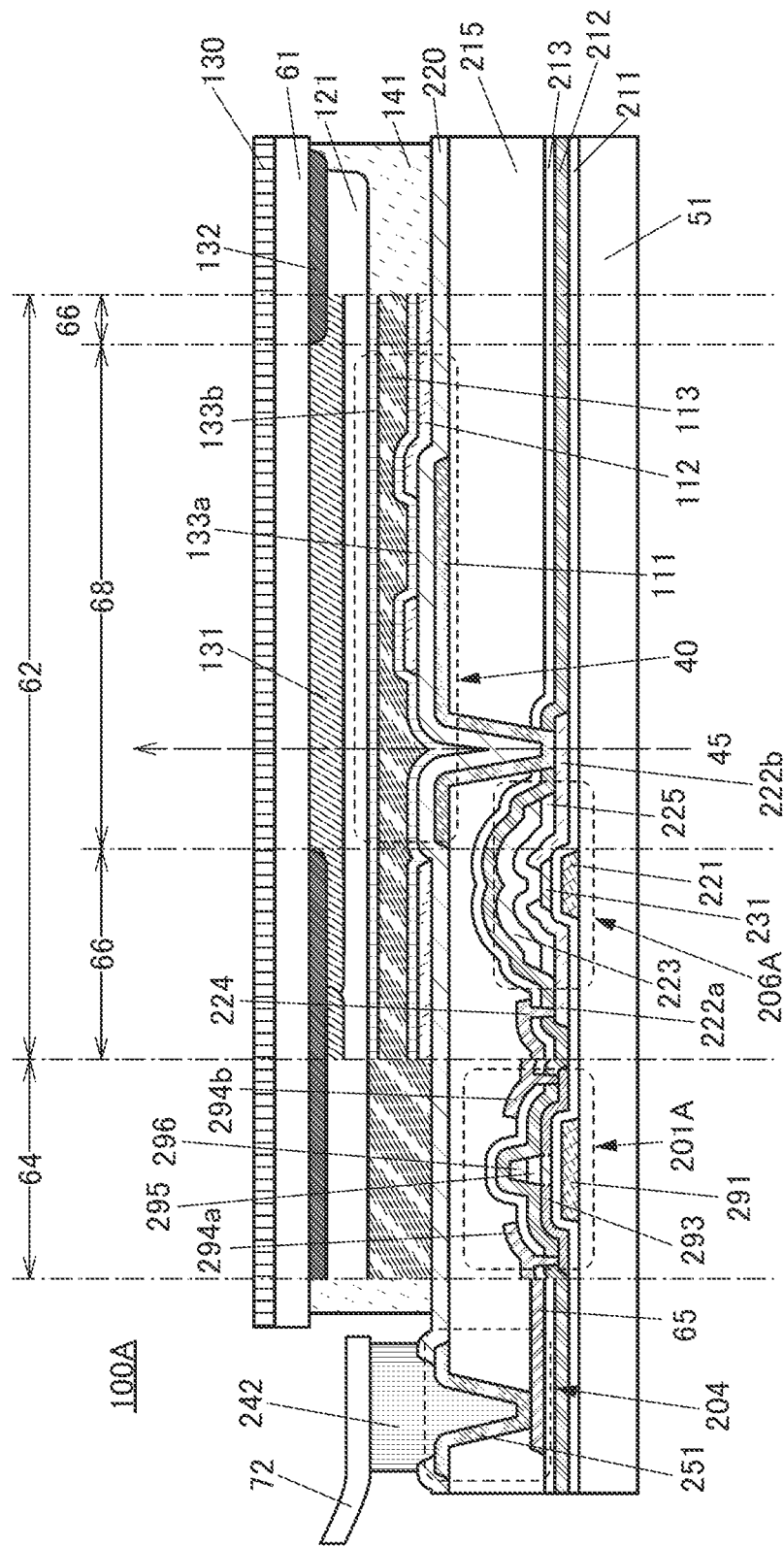
FIG. 4 is a cross-sectional view illustrating an example of a display device.

FIG. 4 is a cross-sectional view of the display device 100A.

FIG. 5 shows cross-sectional views illustrating a method for manufacturing a transistor 201A and a transistor 206A included in the display device 100A.

The display device 100A illustrated in FIG. 3 includes a display portion 62 and a driver circuit portion 64. An FPC 72 and an IC 73 are mounted on the display device 100A.

The display portion 62 includes a plurality of pixels and has a function of displaying images.

The pixel includes a plurality of subpixels. For example, the display portion 62 can display a full-color image by having one pixel composed of a subpixel exhibiting a red color, a subpixel exhibiting a green color, and a subpixel exhibiting a blue color. Note that the colors exhibited by subpixels are not limited to red, green, and blue. For example, a subpixel exhibiting a color such as white, yellow, magenta, or cyan may be used for the pixel. Note that in this specification and the like, a subpixel is simply referred to as a pixel in some cases.

The display device 100A may include one or both of a scan line driver circuit and a signal line driver circuit. The display device 100A may include none of the scan line driver circuit and the signal line driver circuit. When the display device 100A includes a sensor such as a touch sensor, the display device 100A may include a sensor driver circuit. In this embodiment, the driver circuit portion 64 is exemplified as including the scan line driver circuit. The scan line driver circuit has a function of outputting a scan signal to a scan line included in the display portion 62.

In the display device 100A, the IC 73 is mounted on a substrate 51 by a mounting method such as a COG method. The IC 73 includes, for example, one or more of a signal line driver circuit, a scan line driver circuit, and a sensor driver circuit.

The FPC 72 is electrically connected to the display device 100A. The IC 73 and the driver circuit portion 64 are supplied with signals and power from the outside through the FPC 72. Furthermore, signals can be output to the outside from the IC 73 through the FPC 72.

An IC may be mounted on the FPC 72. For example, an IC including one or more of a signal line driver circuit, a scan line driver circuit, and a sensor driver circuit may be mounted on the FPC 72.

A wiring 65 supplies signals and power to the display portion 62 and the driver circuit portion 64. The signals and power are input to the wiring 65 from the IC 73, or from the outside through the FPC 72.

FIG. 4 is a cross-sectional view of the display device 100A including the display portion 62, the driver circuit portion 64, and the wiring 65. In FIG. 4 and the subsequent cross-sectional views of the display devices, a display region 68 in a subpixel and a non-display region 66 around the display region 68 are shown as the display portion 62.

The display device 100A is an example of a transmissive liquid crystal display device using a liquid crystal element with a horizontal electric field mode.

As illustrated in FIG. 4, the display device 100A includes the substrate 51, the transistor 201A, the transistor 206A, a liquid crystal element 40, an alignment film 133a, an alignment film 133b, a connection portion 204, an adhesive layer 141, a coloring layer 131, a light-blocking layer 132, an overcoat 121, the substrate 61, the polarizer 130, and the like.

The display device 100A includes the transistor 206A in the display portion 62. The display device 100A also includes the transistor 201A in the driver circuit portion 64.

The transistor 206A includes a region transmitting visible light, and the region is included in the display region 68. The transistor 206A includes a region blocking visible light, and the region is included in the non-display region 66.

Meanwhile, the transistor 201A is provided in the driver circuit portion 64; thus, it does not matter whether a region transmitting visible light is included.

The transistor 206A includes a conductive layer 221, an insulating layer 211, a semiconductor layer 231, a conductive layer 222a, a conductive layer 222b, an insulating layer 225, and a conductive layer 223.

The transistor 201A includes a conductive layer 291, the insulating layer 211, a semiconductor layer 293, a conductive layer 294a, a conductive layer 294b, an insulating layer 295, and a conductive layer 296.

The semiconductor layer 231 overlaps with the conductive layer 221 with the insulating layer 211 therebetween. The semiconductor layer 231 overlaps with the conductive layer 223 with the insulating layer 225 therebetween.

Figure 5A:
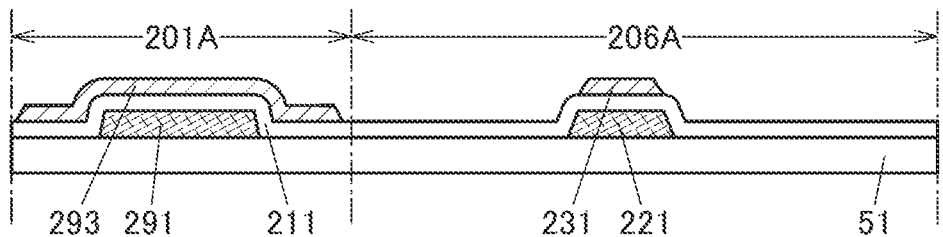
FIGS. 5A-5E are cross-sectional views illustrating an example of a method for manufacturing a transistor.

The semiconductor layer 293 overlaps with the conductive layer 291 with the insulating layer 211 therebetween. The semiconductor layer 293 overlaps with the conductive layer 296 with the insulating layer 295 therebetween. The semiconductor layer 293 includes a channel region 293a and a pair of low-resistance regions 293b (also referred to as a source region and a drain region) as illustrated in FIG. 5(D). Note that in this specification, the drawings, and the like, the channel region 293a and the low-resistance regions 293b are collectively referred to as the semiconductor layer 293 in some cases. The channel region 293a is provided between the pair of low-resistance regions 293b. As illustrated in FIG. 4 and FIG. 5(E), one of the pair of low-resistance regions 293b is electrically connected to the conductive layer 294a, and the other is electrically connected to the conductive layer 294b.

The semiconductor layer 231 and the semiconductor layer 293 contain a metal oxide. The semiconductor layer 231 preferably contains indium and is more preferably an In—M—Zn oxide (M is Al, Ti, Ga, Y, Zr, La, Ce, Nd, Sn, or Hf) film. The details of the metal oxide will be described later.

Each of the conductive layer 222a and the conductive layer 222b is connected to the semiconductor layer 231. One of the conductive layer 222a and the conductive layer 222b serves as a source, and the other serves as a drain. The conductive layer 222a is electrically connected to a signal line 224. The conductive layer 222b is electrically connected to a pixel electrode 111.

The conductive layer 222a and the conductive layer 222b are formed using a conductive material transmitting visible light. Thus, a connection portion between the pixel electrode 111 and the transistor can be provided in the display region 68. Accordingly, the aperture ratio of the subpixel can be increased. In addition, the power consumption of the display device can be reduced.

The conductive layer 221 and the conductive layer 296 each serve as a gate. The conductive layer 221 preferably serves as a gate and a scan line.

The conductive layer 223 and the conductive layer 291 each serve as a back gate.

One of the conductive layer 294a and the conductive layer 294b serves as a source and the other serves as a drain.

The resistivity of the visible-light-transmitting conductive material that can be used for the conductive layer 222a and the conductive layer 222b is higher than that of a visible-light-blocking conductive material such as copper or aluminum, in some cases. A bus line such as a scan line or a signal line is preferably formed using a conductive material (metal material) with low resistivity to prevent signal delay. Note that a visible-light-transmitting conductive material can be used for the bus line, depending on the size of a pixel, the width of the bus line, the thickness of the bus line, and the like.

Specifically, the conductive layer 221, the conductive layer 291, the signal line 224, the conductive layer 294a, and the conductive layer 294b are preferably formed using a conductive material with low resistivity. Each of the conductive layers is preferably formed using a conductive material with low resistivity, such as a metal or an alloy. The conductive layers may be formed using a visible-light-blocking conductive material.

When a conductive layer blocking visible light is used for the conductive layer 221 and the conductive layer 291, the channel region in the semiconductor layer 231 and the channel region in the semiconductor layer 293 can be prevented from being irradiated with light from a backlight. The overlapping of the channel region of the semiconductor layer and the conductive layer blocking visible light can reduce variations in the characteristics of the transistor due to light. Thus, the transistor can be more reliable.

The light-blocking layer 132 is provided on the substrate 61 side relative to the semiconductor layer 231, and the conductive layer 221 blocking visible light is provided on the substrate 51 side relative to the semiconductor layer 231; thus, the channel region can be prevented from being irradiated with external light and light from the backlight.

In one embodiment of the present invention, the conductive layer blocking visible light may overlap with part of the semiconductor layer and does not necessarily overlap with another part of the semiconductor layer. For example, the conductive layer blocking visible light needs to overlap with at least the channel region.

The insulating layer 211, the insulating layer 225, and the insulating layer 295 each serve as a gate insulating layer.

Each of the transistor 201A and the transistor 206A is a transistor provided with gates above and below the channel.

The conductive layer 221 and the conductive layer 223 are preferably electrically connected to each other. Similarly, the conductive layer 291 and the conductive layer 296 are preferably electrically connected to each other. A transistor where two gates are electrically connected to each other can have higher field-effect mobility and thus have a higher on-state current than other transistors. Consequently, a circuit capable of high-speed operation can be fabricated. Furthermore, the area occupied by a circuit portion can be reduced. The use of the transistor having a high on-state current can reduce signal delay in wirings and can reduce display unevenness even in a display device in which the number of wirings is increased because of an increase in size or resolution. In addition, the area occupied by the circuit portion can be reduced, whereby the display device can have a narrower frame. Moreover, with the use of such a structure, a highly reliable transistor can be obtained.

As each of the conductive layer 223 and the conductive layer 296, a single layer of one of a metal material and an oxide conductor, or a stack of both a metal material and an oxide conductor can be used.

The transistor 206A can have a structure using an oxide semiconductor layer as the semiconductor layer 231 and an oxide conductor (OC) layer (hereinafter also referred to as an oxide conductive layer) as the conductive layer 223. Similarly, the transistor 201A can have a structure using an oxide semiconductor layer as the semiconductor layer 293 and an oxide conductive layer as the conductive layer 296. In that case, the oxide semiconductor layer and the oxide conductive layer are preferably formed using an oxide semiconductor.

The transistor 201A and the transistor 206A are covered with an insulating layer 212, an insulating layer 213, and an insulating layer 215. Note that the insulating layer 212 and the insulating layer 213 can be considered as the components of the transistors. The transistors are preferably covered with insulating layers that have an effect of inhibiting the diffusion of impurities to the semiconductors included in the transistors. The insulating layer 215 can serve as a planarization layer.

Each of the insulating layer 211, the insulating layer 225, and the insulating layer 295 preferably includes an excess oxygen region. When the gate insulating layer includes an excess oxygen region, excess oxygen can be supplied into the channel region. Since oxygen vacancies that might be formed in the channel region can be filled with excess oxygen, a highly reliable transistor can be provided.

The insulating layer 212 preferably contains nitrogen or hydrogen. The insulating layer 212 and the low-resistance region of the semiconductor layer 293 are in contact with each other; thus, nitrogen or hydrogen in the insulating layer 212 is added to the low-resistance region. The addition of nitrogen or hydrogen to the low-resistance region increases its carrier density. Alternatively, when the insulating layer 213 contains nitrogen or hydrogen and the insulating layer 212 transmits nitrogen or hydrogen, nitrogen or hydrogen may be added to the low-resistance region.

The transistor 201A has a structure with field-effect mobility and an on-state current higher than those of the transistor 206A. The transistor 201A has a smaller parasitic capacitance than the transistor 206A. Therefore, the transistor can operate at a high speed even with a small size. The driver circuit portion 64 can be reduced in size. Thus, the area of a non-display region of the display device can be reduced, and the display device can have a narrower frame.

Here, the channel length of the transistor 206A is the distance between the conductive layer 222a and the conductive layer 222b, and the channel length of the transistor 201A is the length of the conductive layer 296. In actual transistor characteristics, however, the distance between a pair of low-resistance regions of the semiconductor layer 293 corresponds to the effective channel length of the transistor 201A. Depending on the process conditions, the low-resistance region and the channel region are not separated at the end portion of the conductive layer 296; in some cases, the low-resistance region extends beyond the end portion of the conductive layer 296 in the channel direction. In that case, the effective channel length of the transistor 201A is shortened, resulting in an effect of an apparent increase in field-effect mobility. This also indicates that the transistor 201A has a structure with high field-effect mobility and a high on-state current.

In each of the transistor 201A and the transistor 206A, a metal oxide is used for the semiconductor layer.

Owing to its low off-state current, the transistor using a metal oxide allows long-term retention of charge accumulated in a capacitor through the transistor. The use of such a transistor in a pixel allows a driver circuit to stop with the gray level of a displayed image maintained. As a result, the display device with significantly reduced power consumption can be obtained.

Furthermore, when a metal oxide is included in the semiconductor layer of the transistor, the withstand voltage between the source and the drain can be increased. As a result, the reliability of the transistor can be increased.

The transistors preferably contain a metal oxide that is highly purified to inhibit the formation of oxygen vacancies. This can reduce the off-state current of the transistors. In the transistors of the pixels, for example, an electrical signal such as an image signal can be held for a longer period of time, and the interval between writing operations can be set longer when the power is on. Accordingly, the frequency of refresh operations can be reduced, resulting in an effect of reducing power consumption.

In one embodiment of the present invention, the transistor in the display portion 62 and the transistor in the driver circuit portion 64 are formed over the same substrate. As the transistor in the driver circuit portion 64, a transistor capable of operating at high speed can be formed. That is, a semiconductor device separately formed with a silicon wafer or the like does not need to be used as the driver circuit, which enables a reduction in the number of components of the display device. In addition, the use of the transistor capable of operating at high speed also in the display portion 62 can enable a high-quality image to be provided.

The liquid crystal element 40 is provided in the display region 68. The liquid crystal element 40 is a liquid crystal element using an FFS (Fringe Field Switching) mode.

The liquid crystal element 40 includes the pixel electrode 111, a common electrode 112, and a liquid crystal layer 113. The alignment of the liquid crystal layer 113 can be controlled with the electric field generated between the pixel electrode 111 and the common electrode 112. The liquid crystal layer 113 is positioned between the alignment film 133a and the alignment film 133b.

The pixel electrode 111 is electrically connected to the conductive layer 222b.

The common electrode 112 may have a top-surface shape (also referred to as a planar shape) that is comb-like or a top-surface shape that is provided with a slit. One or more openings can be provided in the common electrode 112.

An insulating layer 220 is provided between the pixel electrode 111 and the common electrode 112. The pixel electrode 111 includes a portion that overlaps with the common electrode 112 with the insulating layer 220 therebetween. The common electrode 112 is not placed over the pixel electrode 111 in some areas of a region where the pixel electrode 111 and the coloring layer 131 overlap with each other.

An alignment film in contact with the liquid crystal layer 113 is preferably provided. The alignment film can control the alignment of the liquid crystal layer 113. In the display device 100A, the alignment film 133a is positioned between the liquid crystal layer 113 and each of the common electrode 112 and the insulating layer 220, and the alignment film 133b is positioned between the overcoat 121 and the liquid crystal layer 113.

Liquid crystal materials include a positive liquid crystal material with a positive dielectric anisotropy ($\Delta \varepsilon$) and a negative liquid crystal material with a negative dielectric anisotropy. Either of the materials can be used in one embodiment of the present invention, and an optimal liquid crystal material can be used according to the employed mode and design.

Note that an element using an FFS mode is used as the liquid crystal element 40 here; however, the liquid crystal element 40 is not limited to this, and liquid crystal elements using a variety of modes can be used. For example, a liquid crystal element using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used.

As the display device 100A, a normally black liquid crystal display device, for example, a transmissive liquid crystal display device using a vertical alignment (VA) mode may be used. As the vertical alignment mode, a MVA (Multi-Domain Vertical Alignment) mode, a PVA (Patterned Vertical Alignment) mode, an ASV (Advanced Super View) mode, or the like can be used.

Note that the liquid crystal element is an element that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case of employing a horizontal electric field mode, liquid crystal exhibiting a blue phase for which an alignment film is not used may be used. The blue phase is a liquid crystal phase, which is generated just before a cholesteric phase changes into an isotropic phase while the temperature of cholesteric liquid crystal is increased. Since the blue phase appears only in a narrow temperature range, a liquid crystal composition in which a chiral material is mixed at 5 wt. % or more is used for the liquid crystal layer 113 in order to improve the temperature range. The liquid crystal composition that contains liquid crystal exhibiting a blue phase and a chiral material has a high response speed and exhibits optical isotropy. In addition, the liquid crystal composition that contains liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

Since the display device 100A is a transmissive liquid crystal display device, a conductive material transmitting visible light is used for both the pixel electrode 111 and the common electrode 112. In addition, a conductive material transmitting visible light is used for one or more of the conductive layers included in the transistor 206A. Accordingly, at least part of the transistor 206A can be provided in the display region 68. In FIG. 4, the case in which a conductive material transmitting visible light is used for the conductive layer 222b is illustrated as an example.

For example, a material containing one or more kinds selected from indium (In), zinc (Zn), and tin (Sn) is preferably used as the conductive material transmitting visible light. Specifically, visible-light-transmitting conductive materials such as indium oxide, indium tin oxide (ITO), indium zinc oxide, indium oxide containing tungsten, indium zinc oxide containing tungsten, indium oxide containing titanium, ITO containing titanium, zinc oxide (ZnO), ZnO containing gallium, and ITO containing silicon (ITSO) can be enumerated. Note that a film containing graphene can be used as well. The film containing graphene can be formed, for example, by reducing a film containing graphene oxide. Alternatively, the above-described oxide conductor (OC) obtained by reducing the resistance of a metal oxide that can be used as a material of the semiconductor layer can be used.

An oxide conductive layer is preferably used for one or more of the conductive layer 222b, the pixel electrode 111, and the common electrode 112. The oxide conductive layer preferably contains one or more kinds of metal elements that are contained in the semiconductor layer of the transistor 206A. For example, the conductive layer 222b preferably contains indium and is more preferably an In—M—Zn oxide (M is Al, Ti, Ga, Y, Zr, La, Ce, Nd, Sn, or Hf) film. Similarly, each of the pixel electrode 111 and the common electrode 112 preferably contains indium and is more preferably an In-M-Zn oxide film.

An oxide semiconductor may be used to form one or more of the conductive layer 222b, the pixel electrode 111, and the common electrode 112. When oxide semiconductors containing the same metal element are used for two or more layers included in the display device, the same manufacturing apparatus (e.g., a deposition apparatus or a processing apparatus) can be used in two or more steps, resulting in a reduction in manufacturing cost.

An oxide semiconductor is a semiconductor material whose resistance can be controlled by oxygen vacancies in the film and/or the concentration of impurities such as hydrogen and water in the film. Thus, the resistivity of the oxide conductive layer can be controlled by selecting treatment for increasing the amount of oxygen vacancies and/or impurity concentration or treatment for reducing oxygen vacancies and/or impurity concentration, for an oxide semiconductor layer.

Note that such an oxide conductive layer formed using an oxide semiconductor can also be referred to as an oxide semiconductor layer having a high carrier density and a low resistance, an oxide semiconductor layer having conductivity, or an oxide semiconductor layer having high conductivity.

The manufacturing cost can be reduced by forming the oxide semiconductor layer and the oxide conductive layer using the same metal element. For example, the manufacturing cost can be reduced by using a metal oxide target with the same metal composition. By using the metal oxide target with the same metal composition, the etching gas or etchant, which is the same as that used in the processing of the oxide semiconductor layer, can be used. Note that even when the oxide semiconductor layer and the oxide conductive layer contain the same metal elements, the layers have different compositions in some cases. For example, in some cases, a metal element in a film is released during the manufacturing process of the display device, resulting in a different metal composition.

For example, when a silicon nitride film containing hydrogen is used for the insulating layer 220 and an oxide semiconductor is used for the pixel electrode 111, the conductivity of the oxide semiconductor can be increased by the hydrogen that is supplied from the insulating layer 220.

In the display device 100A, the coloring layer 131 and the light-blocking layer 132 are provided closer to the substrate 61 than the liquid crystal layer 113 is. The coloring layer 131 is positioned in a portion that overlaps with at least the display region 68 of a subpixel. In the non-display region 66 of the pixel (subpixel), the light-blocking layer 132 is provided. The light-blocking layer 132 overlaps with at least part of the transistor 206A.

The overcoat 121 is preferably provided between the liquid crystal layer 113 and each of the coloring layer 131 and the light-blocking layer 132. The overcoat 121 can inhibit the diffusion of impurities contained in the coloring layer 131, the light-blocking layer 132, and the like to the liquid crystal layer 113.

The substrate 51 and the substrate 61 are attached to each other with the adhesive layer 141. The liquid crystal layer 113 is encapsulated in a region that is surrounded by the substrate 51, the substrate 61, and the adhesive layer 141.

When the display device 100A serves as a transmissive liquid crystal display device, two polarizers are positioned such that the display portion 62 is sandwiched between the two polarizers. FIG. 4 illustrates the polarizer 130 on the substrate 61 side. Light 45 from a backlight positioned more outward than the polarizer provided on the substrate 51 side enters the display device 100A through the polarizer. In this case, the optical modulation of the light can be controlled by controlling the alignment of the liquid crystal layer 113 with a voltage applied between the pixel electrode 111 and the common electrode 112. That is, the intensity of light emitted through the polarizer 130 can be controlled. Furthermore, the coloring layer 131 absorbs incident light except for light in a specific wavelength range; consequently, the emitted light is light exhibiting red, blue, or green, for example.

In addition to the polarizer, a circular polarizer can be used, for example. As the circular polarizer, a stack of a linear polarizer and a quarter-wave retardation plate can be used, for example. The circular polarizer can reduce the viewing angle dependence of display of the display device.

The liquid crystal element 40 is preferably driven using a guest-host liquid crystal mode. When the guest-host liquid crystal mode is used, a polarizer does not need to be used. Since light absorption due to the polarizer can be reduced, light extraction efficiency can be increased and display of the display device can be bright.

In the connection portion 204, the wiring 65 and a conductive layer 251 are connected to each other, and the conductive layer 251 and a connector 242 are connected to each other. That is, in the connection portion 204, the wiring 65 is electrically connected to the FPC 72 through the conductive layer 251 and the connector 242. With such a structure, signals and power can be supplied from the FPC 72 to the wiring 65.

The wiring 65 can be formed using the same material and the same process as those for the conductive layers 294a and 294b included in the transistor 201A and the signal line 224 included in the transistor 206A. The conductive layer 251 can be formed using the same material and the same process as those for the pixel electrode 111 included in the liquid crystal element 40. Thus forming the conductive layers constituting the connection portion 204 using the same material and the same process as those for the conductive layers used in the display portion 62 and the driver circuit portion 64 is preferable because an increase in the number of steps can be avoided.

The driver circuit portion 64 and the display portion 62 may each include transistors with a plurality of structures. For example, a transistor having a structure in which two gates are electrically connected to each other is preferably used for one or more of a shift register circuit, a buffer circuit, and a protection circuit included in the scan line driver circuit.

[Method for Manufacturing Transistor 201A and Transistor 206A]

Next, a method for manufacturing the transistor 201A and the transistor 206A in the display device 100A will be described with reference to FIG. 5.

The thin films included in the display device (the insulating film, the semiconductor film, the conductive film, and the like) can be formed by a sputtering method, a chemical vapor deposition (CVD) method, a vacuum evaporation method, a pulsed laser deposition (PLD) method, an atomic layer deposition (ALD) method, or the like. As examples of the CVD method, a plasma-enhanced CVD (PECVD) method or a thermal CVD method can be given. As an example of the thermal CVD method, a metal organic chemical vapor deposition (MOCVD: Metal Organic CVD) method can be given.

The thin films included in the display device (the insulating film, the semiconductor film, the conductive film, and the like) can each be formed by a method such as spin coating, dipping, spray coating, inkjet printing, dispensing, screen printing, offset printing, a doctor knife, slit coating, roll coating, curtain coating, or knife coating.

The thin films included in the display device can be processed using a photolithography method or the like. Alternatively, island-shaped thin films may be formed by a film formation method using a blocking mask. Alternatively, the thin films may be processed by a nanoimprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed and then exposed to light and developed to be processed into a desired shape.

As light used for light exposure in a photolithography method, for example, an i-line (a wavelength of 365 nm), a g-line (a wavelength of 436 nm), an h-line (a wavelength of 405 nm), and light in which the i-line, the g-line, and the h-line are mixed can be given. Alternatively, ultraviolet light, KrF laser light, ArF laser light, or the like can be used. Light exposure may be performed by a liquid immersion exposure technique. Examples of light used for light exposure include extreme ultraviolet light (EUV) and X-rays. Instead of the light used for light exposure, an electron beam may be used. It is preferable to use extreme ultraviolet light, X-rays, or an electron beam because extremely minute processing can be performed. Note that in the case of performing light exposure by scanning with a beam such as an electron beam, a photomask is not needed.

For etching of the thin films, a dry etching method, a wet etching method, a sandblasting method, or the like can be used.

First, the conductive layer 221 and the conductive layer 291 are formed over the substrate 51. Next, the insulating layer 211 is formed over the substrate 51, the conductive layer 221, and the conductive layer 291. Then, the semiconductor layer 231 and the semiconductor layer 293 are formed over the insulating layer 211 (FIG. 5(A)).

In this manner, the conductive layer 291 serving as the back gate of the transistor 201A and the conductive layer 221 serving as the gate of the transistor 206A can be formed in the same process. The insulating layer 211 can serve as both a gate insulating layer of the transistor 201A and a gate insulating layer of the transistor 206A. Furthermore, the semiconductor layer 293 in the transistor 201A and the semiconductor layer 231 in the transistor 206A can be formed in the same process.

The substrate 51 has stiffness high enough for easy transfer and has resistance to temperatures applied during the manufacturing process. Examples of a material that can be used for the substrate 51 include glass, quartz, ceramics, sapphire, a resin, a semiconductor, a metal, and an alloy. Examples of the glass include alkali-free glass, barium borosilicate glass, and aluminoborosilicate glass.

An insulating layer such as a silicon oxide film, a silicon oxynitride film, a silicon nitride film, or a silicon nitride oxide film is preferably formed as a base film over the substrate 51. For example, in the case where glass is used as the substrate 51, the formation of the base film can prevent an impurity or the like in the glass from entering the transistor side.

The conductive layer 221 and the conductive layer 291 can be formed in such a manner that a conductive film is formed, a resist mask is formed, the conductive film is etched, and then the resist mask is removed. Other conductive layers, which will be described below, are formed by a similar method.

For the conductive layer 221 and the conductive layer 291, a single-layer structure or a stacked-layer structure including a metal such as aluminum, titanium, chromium, nickel, copper, yttrium, zirconium, molybdenum, silver, tantalum, or tungsten or an alloy containing the metal as its main component can be used.

As the insulating layer 211, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack of two or more of the above insulating films may be used.

In the case of using a metal oxide for the semiconductor layer, the insulating layer 211 preferably includes an oxide insulating layer in contact with the semiconductor layer. This can improve the characteristics of the interface with the semiconductor layer. The insulating layer 211 preferably include a nitride insulating layer over the conductive layer 221 and the conductive layer 291 and an oxide insulating layer over the nitride insulating layer, for example. It is preferable that the insulating layer 211 includes an oxide insulating layer from which oxygen is released by heating, in which case oxygen contained in the insulating layer 211 can be moved to the semiconductor layer (metal oxide) by heat treatment.

The semiconductor layer 231 and the semiconductor layer 293 can be formed in such a manner that a metal oxide film is formed, a resist mask is formed, the metal oxide film is etched, and then the resist mask is removed.

The metal oxide film preferably contains indium and is more preferably an In—M—Zn oxide (M is Al, Ti, Ga, Y, Zr, La, Ce, Nd, Sn, or Hf) film.

The energy gap of the metal oxide is preferably 2 eV or more, more preferably 2.5 eV or more, still more preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Figure 5B:
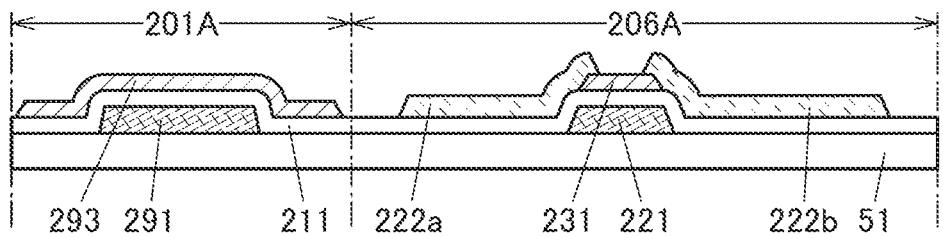
Figure 5C:
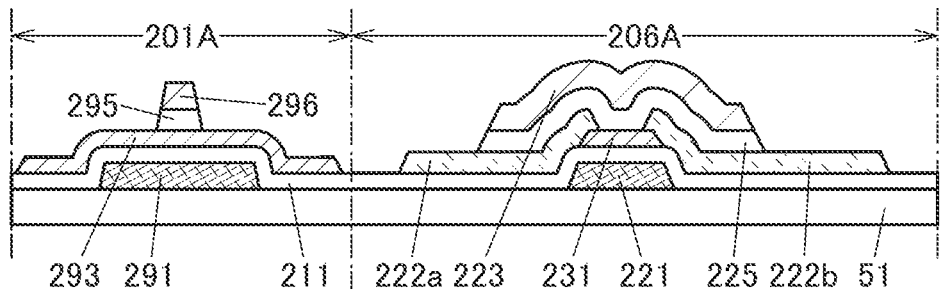
Figure 5D:
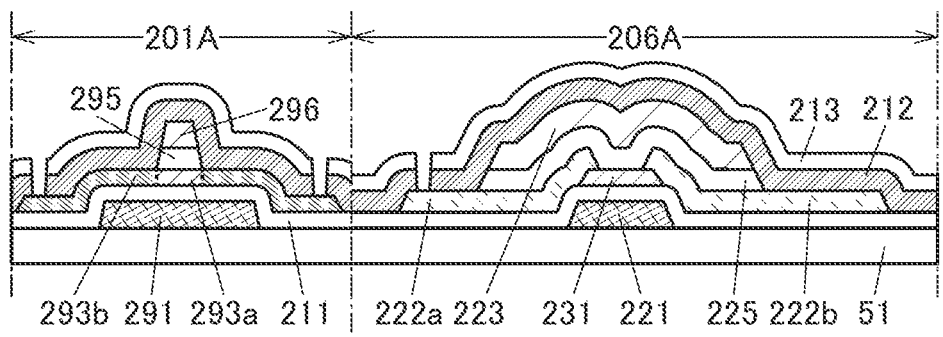
Figure 5E:
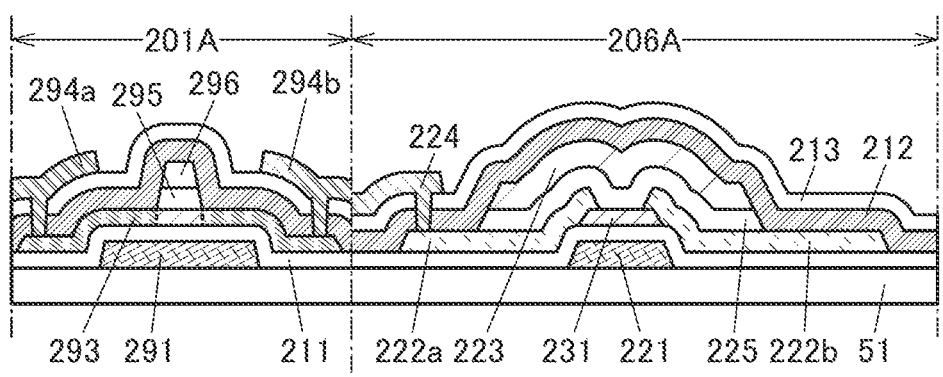

Next, the conductive layer 222*a* and the conductive layer 222*b* that are in contact with the semiconductor layer 231 are formed (FIG. 5(B)).

For the conductive layer 222*a* and the conductive layer 222*b*, a visible-light-transmitting conductive material such as indium oxide, ITO, indium zinc oxide, indium oxide containing tungsten, indium zinc oxide containing tungsten, indium oxide containing titanium, ITO containing titanium, ZnO, ZnO containing gallium, or ITSO can be used. Alternatively, the above-described oxide conductor (OC), which is obtained by reducing the resistance of a metal oxide that can be used as a material of the semiconductor layer can be used.

Next, the insulating layer 225 and the conductive layer 223 are formed over the semiconductor layer 231. Concurrently with this process, the insulating layer 295 and the conductive layer 296 are formed over the semiconductor layer 293 (see FIG. 5(C)).

In this manner, the conductive layer 296 serving as the gate of the transistor 201A and the conductive layer 223 serving as the back gate of the transistor 206A can be formed in the same process. In addition, the insulating layer 295 of the transistor 201A and the insulating layer 225 of the transistor 206A can be formed in the same process.

The insulating layer 225, the insulating layer 295, the conductive layer 223, and the conductive layer 296 can be formed in such a manner that an insulating film to be the insulating layer 225 and the insulating layer 295 and a conductive film to be the conductive layer 223 and the conductive layer 296 are formed, a resist mask is formed, the insulating film and the conductive film are etched, and then the resist mask is removed.

Here, the insulating layer 225 and the conductive layer 223 are formed such that the end portion of the insulating layer 225 and the end portion of the conductive layer 223 are positioned more outward than the end portion of the semiconductor layer 231. In addition, the insulating layer 295 and the conductive layer 296 are formed such that the end portion of the insulating layer 295 and the end portion of the conductive layer 296 are positioned more inward than the end portion of the semiconductor layer 293 in the channel length direction of the transistor 201A.

For a material for the insulating layer 225 and the insulating layer 295, the materials that can be used for the insulating layer 211 can be referred to.

In the case of using a metal oxide for the semiconductor layer, the insulating layer 225 and the insulating layer 295 preferably include an oxide insulating layer in contact with the semiconductor layer. This can improve the characteristics of the interface with the semiconductor layer. The insulating layer 225 and the insulating layer 295 preferably include an oxide insulating layer over the semiconductor layer and a nitride insulating layer over the oxide insulating layer, for example. It is preferable that the insulating layer 225 and the insulating layer 295 include an oxide insulating layer from which oxygen is released by heating, in which case oxygen contained in the insulating layer 225 and the insulating layer 295 can be moved to the semiconductor layer (metal oxide) by heat treatment.

For a material for the conductive layer 223 and the conductive layer 296, the materials (such as the metals) that can be used for the conductive layer 221 and the conductive layer 291 and the materials (such as the light-transmitting conductive materials) that can be used for the conductive layer 222*a* and the conductive layer 222*b* can be referred to. In particular, the above-described oxide conductor (OC) is preferably used.

Next, the insulating layer 212 is formed to cover the semiconductor layer 293, the insulating layer 295, the conductive layer 296, the insulating layer 225, the conductive layer 223, and the like, and the insulating layer 213 is formed over the insulating layer 212. Then, openings reaching the semiconductor layer 293 (the pair of low-resistance regions 293*b*) and an opening reaching the conductive layer 222*a* are formed in the insulating layer 212 and the insulating layer 213 (FIG. 5(D)).

The insulating layer 212 preferably contains hydrogen. Hydrogen contained in the insulating layer 212 is diffused to the semiconductor layer 293 in contact with the insulating layer 212, and the resistance of part of the semiconductor layer 293 is reduced. Since the semiconductor layer 293 in contact with the insulating layer 212 serves as the low-resistance regions 293b, the on-state current and the field-effect mobility of the transistor 201A can be increased. The portion of the semiconductor layer 293 that is in contact with the insulating layer 295 serves as the channel region 293a. The resistivity of the low-resistance region 293b is lower than that of the channel region 293a.

For a material for the insulating layer 213, the materials that can be used for the insulating layer 211 can be referred to. The insulating layer 213 preferably includes an oxide insulating layer. As the insulating layer 213, a layered film of an oxide insulating layer and a nitride insulating layer can be used, for example.

Next, the conductive layer 294a, the conductive layer 294b, and the signal line 224 are formed to fill the openings provided in the insulating layer 212 and the insulating layer 213 (FIG. 5(E)). The conductive layer 294a is connected to one of the pair of low-resistance regions 293b. The conductive layer 294b is connected to the other of the pair of low-resistance regions 293b. The signal line 224 is electrically connected to the conductive layer 222a.

Through the above process, the transistor 201A and the transistor 206A can be formed. As described above, some of the manufacturing steps for the transistor 201A and some of the manufacturing steps for the transistor 206A can be performed at the same time. Accordingly, an increase in the number of manufacturing steps for the display device can be inhibited.

[Modification Example of Display Device 100A]

Next, display devices using the transistor 201A and the transistor 206A, which are different from the display device 100A, will be described with reference to FIG. 6 and FIG. 7. These display devices are different from the display device 100A in the structure of the liquid crystal element 40. In addition, a display device 100B, in which the transistor structure in the display portion 62 is different from that of the display device 100A, will be described with reference to FIG. 8. Note that perspective views of these display devices are similar to that of the display device 100A illustrated in FIG. 3. Note that in the structure example of the display device below, components similar to those of the above display device are not described in some cases.

A display device 140A illustrated in FIG. 6(A) is different from the display device 100A described above in the shapes of the pixel electrode 111 and the common electrode 112.

Both of the pixel electrode 111 and the common electrode 112 may have a top-surface shape (also referred to as a planar shape) that is comb-like or a top-surface shape that is provided with a slit.

In the display device 140A illustrated in FIG. 6(A), the pixel electrode 111 and the common electrode 112 are provided on the same plane.

Alternatively, a shape may be employed in which the end portion of a slit in one electrode and the end portion of a slit in the other electrode are aligned with each other when seen from above. A cross-sectional view of this case is shown in FIG. 6(B).

Alternatively, the pixel electrode 111 and the common electrode 112 may have an overlapping portion when seen from above. A cross-sectional view of this case is shown in FIG. 6(C).

Alternatively, the display portion 62 may have a portion where neither the pixel electrode 111 nor the common electrode 112 is provided, when seen from above. A cross-sectional view of this case is shown in FIG. 6(D).

Figure 7:
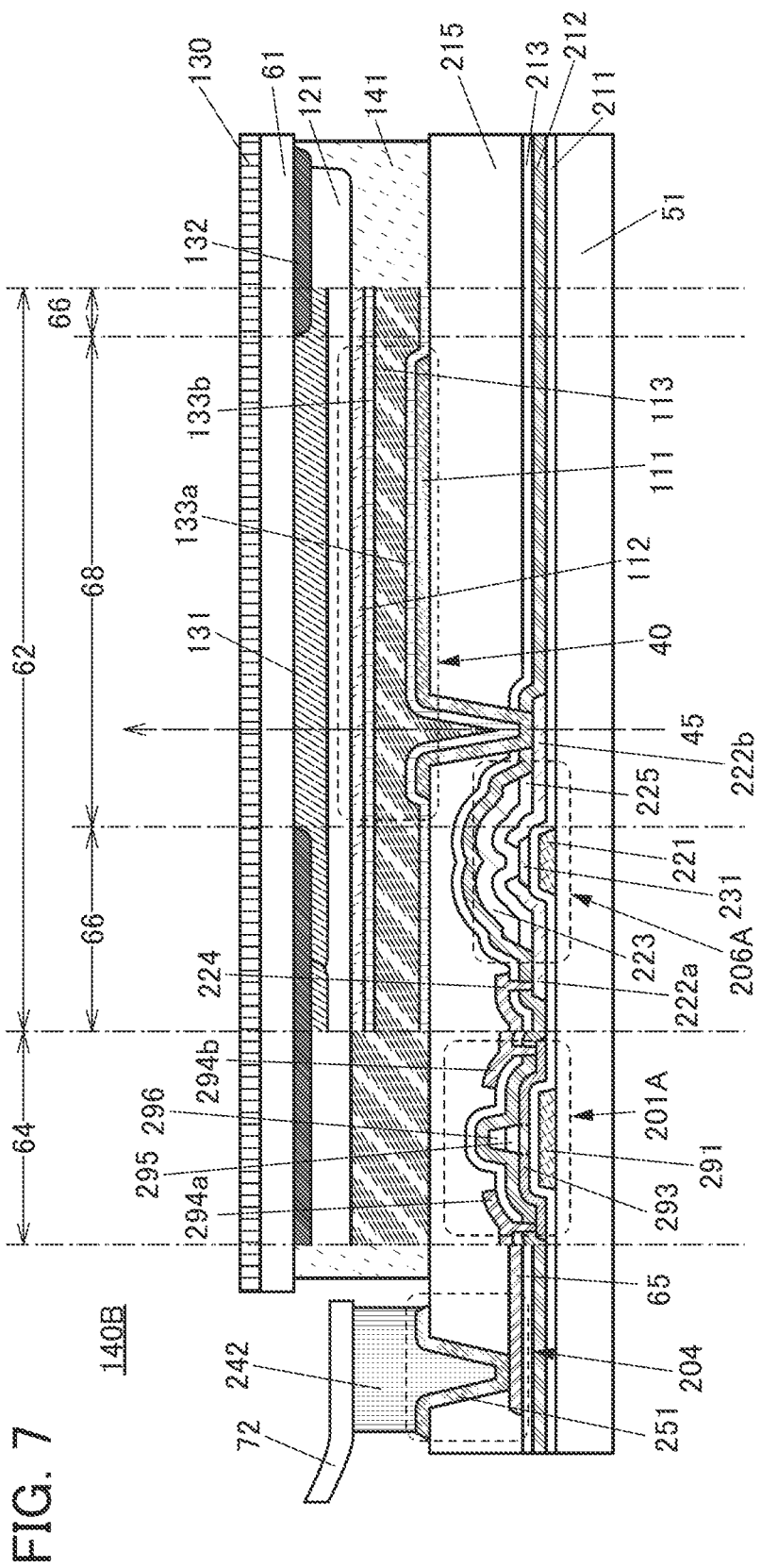
FIG. 7 is a cross-sectional view illustrating an example of a display device.

The display device 140B illustrated in FIG. 7 is an example of a transmissive liquid crystal display device using a liquid crystal element with a vertical electric field mode.

The liquid crystal element 40 includes the pixel electrode 111, the common electrode 112, and the liquid crystal layer 113. The liquid crystal layer 113 is positioned between the pixel electrode 111 and the common electrode 112. The alignment film 133a is provided in contact with the pixel electrode 111. The alignment film 133b is provided in contact with the common electrode 112.

Figure 8:
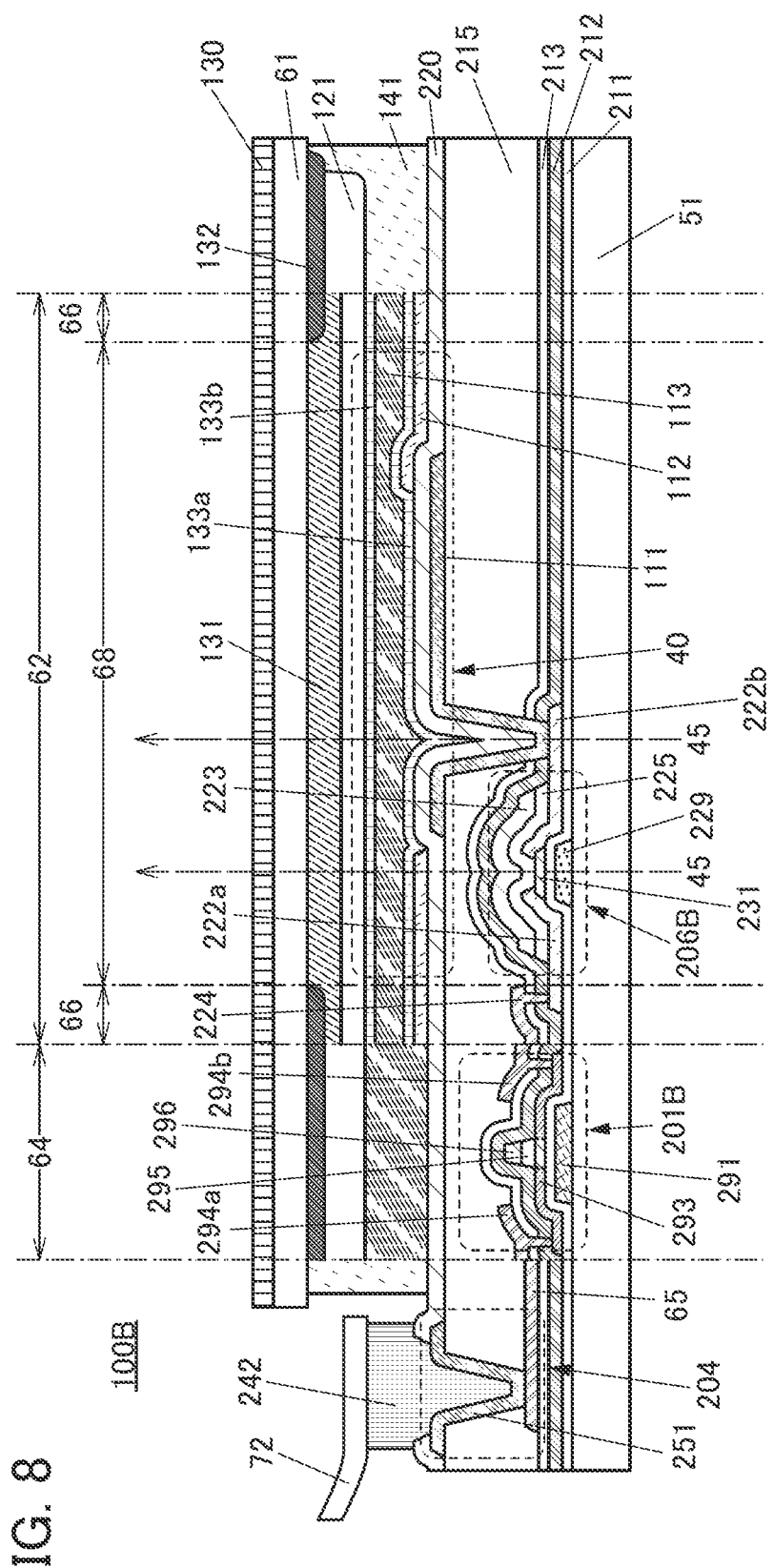
FIG. 8 is a cross-sectional view illustrating an example of a display device.

The display device 100B illustrated in FIG. 8 includes a transistor 206B in the display portion 62. The display device 100B includes a transistor 201B in the driver circuit portion 64.

The transistor 201B has the same structure as the transistor 201A (FIG. 4, for example). That is, the structure of the display device 100B is the same as that of the display device 100A except for the transistor structure in the display portion 62.

The transistor 206B is different from the transistor 206A in the structure of a conductive layer serving as a gate. The transistor 206A includes the conductive layer 221 formed using the same process and the same material as those for the conductive layer 291. Meanwhile, the transistor 206B includes a conductive layer 229 formed using a process and a material different from those for the conductive layer 291.

The conductive layer 229 is formed using a conductive material transmitting visible light. Thus, not only a connection portion between the pixel electrode 111 and the conductive layer 222b but also a portion provided with the conductive layer 229 can be provided in the display region 68. Accordingly, the aperture ratio of a subpixel can be increased. Furthermore, the power consumption of the display device can be reduced. The display device 100B illustrated in FIG. 8 has a structure in which the conductive layer 222a, the conductive layer 222b, the semiconductor layer 231, and the conductive layer 229 transmit visible light and the signal line 224 blocks visible light. Part of the conductive layer 222a, the connection portion between the conductive layer 222b and the pixel electrode 111, the semiconductor layer 231, and the conductive layer 229 in the transistor 206B are positioned in the display region 68. The connection portion between the conductive layer 222a and the signal line 224 in the transistor 206B is positioned in the non-display region 66.

When a scan line is positioned in the non-display region 66, the visible-light-transmitting property is not limited, and the scan line can be formed using a conductive material with low resistivity, such as a metal. Thus, the conductive layer 229 is preferably provided separately from the scan line. For example, it is preferable that the scan line and the conductive layer 229 that are formed using the same process and the same material as those for the conductive layer 291 be connected to each other in the non-display region 66.

The above method for manufacturing the transistor 201A and the transistor 206A is changed in such a manner that a process for forming the conductive layer 229 is added thereto and the conductive layer 221 is not formed in the process for forming the conductive layer 291, so that the transistor 201B and the transistor 206B can be manufactured. In the case where a metal oxide is used for the conductive layer 229, the metal oxide is over and in contact with the conductive layer 291, which might lead to oxidation of the conductive layer 291. Therefore, it is preferable that the conductive layer 229 be formed earlier than the conductive layer 291.

FIG. 8 illustrates an example in which one opening in the common electrode 112 is provided in the display region 68 of one subpixel. As the resolution of the display device increases, the area of the display region 68 in one subpixel decreases. Thus, the number of openings provided in the common electrode 112 is not limited to two or more and can be one. That is, in a high-resolution display device, the area of the pixel (subpixel) is small; therefore, an adequate electric field for the alignment of liquid crystal over the entire display region of the subpixel can be generated even when there is only one opening in the common electrode 112.

[Materials]

Next, the details of materials and the like that can be used for components of the display device of this embodiment will be described. Note that the description of the components already explained is omitted in some cases. The materials below can also be used as appropriate in the display device, a touch panel, and the components thereof described later.

There are no strict limitation on the material for a substrate included in the display device of one embodiment of the present invention; a variety of substrates can be used. For example, a glass substrate, a quartz substrate, a sapphire substrate, a semiconductor substrate, a ceramic substrate, a metal substrate, a plastic substrate, or the like can be used.

The use of a thin substrate can reduce the weight and thickness of the display device. Furthermore, the use of a substrate that is thin enough to have flexibility allows a flexible display device to be obtained.

A transistor included in the display device of one embodiment of the present invention may have either a top-gate structure or a bottom-gate structure. Alternatively, gate electrodes may be provided above and below a channel. A semiconductor material used in the transistor is not particularly limited, and examples of the semiconductor material include an oxide semiconductor, silicon, and germanium.

There is no particular limitation on the crystallinity of the semiconductor material used for the transistor, and either an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration in the transistor characteristics can be inhibited.

For example, a Group 14 element, a compound semiconductor, or an oxide semiconductor can be used for the semiconductor layer. Typically, a semiconductor containing silicon, a semiconductor containing gallium arsenide, an oxide semiconductor containing indium, or the like can be used for the semiconductor layer.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

The use of an oxide semiconductor makes it possible to provide a highly reliable transistor in which a change in the electrical characteristics is reduced.

For the oxide semiconductor, the above description and Embodiment 4 can be referred to, for example.

An organic insulating material or an inorganic insulating material can be used as an insulating material that can be used for the insulating layers, the overcoat, or the like included in the display device. Examples of the organic insulating material include an acrylic resin, an epoxy resin, a polyimide resin, a polyamide resin, a polyamide-imide resin, a siloxane resin, a benzocyclobutene-based resin, and a phenol resin. As inorganic insulating layers, a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like can be enumerated.

For the conductive layer for the gate, the source, and the drain of the transistor, various wirings and electrodes of the display device, and the like, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. Alternatively, a visible-light-transmitting conductive material such as indium oxide, ITO, indium zinc oxide, indium oxide containing tungsten, indium zinc oxide containing tungsten, indium oxide containing titanium, ITO containing titanium, ZnO, ZnO containing gallium, or ITSO may be used. A semiconductor such as an oxide semiconductor or polycrystalline silicon whose resistance is lowered by containing an impurity element, for example, or silicide such as nickel silicide can also be used. A film containing graphene can also be used. A semiconductor such as an oxide semiconductor containing an impurity element may also be used. Alternatively, the conductive layers may be formed using a conductive paste of silver, carbon, copper, or the like or a conductive polymer such as polythiophene. A conductive paste is preferable because it is inexpensive. A conductive polymer is preferable because it is easily applied.

Note that an oxide conductive layer may be formed by controlling the resistivity of an oxide semiconductor.

A curable resin such as a heat-curable resin, a photocurable resin, or a two-component-mixture-type curable resin can be used as the adhesive layer 141. For example, an acrylic resin, a urethane resin, an epoxy resin, or a siloxane resin can be used.

As the connector 242, for example, an anisotropic conductive film (ACF) or an anisotropic conductive paste (ACP) can be used.

The coloring layer 131 is a colored layer transmitting light in a specific wavelength range. Examples of a material that can be used for the coloring layer 131 include a metal material, a resin material, and a resin material containing a pigment or dye.

The light-blocking layer 132 is provided, for example, between adjacent coloring layers 131 for different colors. A black matrix formed with, for example, a metal material or a resin material containing a pigment or dye can be used as the light-blocking layer 132. Note that it is preferable to provide the light-blocking layer 132 also in a region other than the display portion 62, such as the driver circuit portion 64, in which case leakage due to guided light or the like can be inhibited.

Structure Example 3 of Display Device

Next, display devices of this embodiment will be described with reference to FIG. 9 to FIG. 11.

Figure 9:
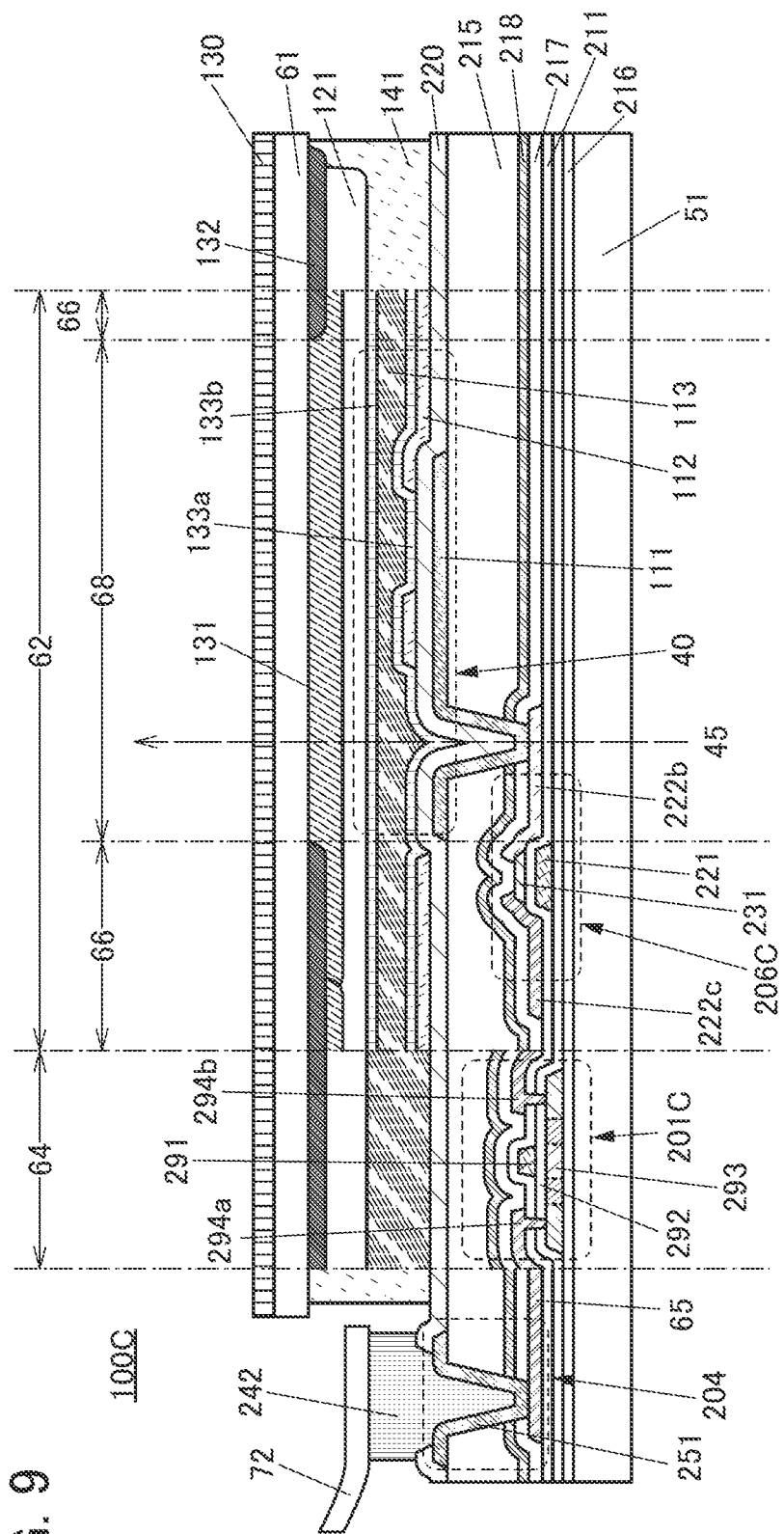
FIG. 9 is a cross-sectional view illustrating an example of a display device.

FIG. 9 shows a cross-sectional view of a display device 100C. FIG. 10 and FIG. 11 show cross-sectional views illustrating a method for manufacturing a transistor 201C and a transistor 206C included in the display device 100C.

The display device 100C is different from the display device 100A in the transistor structures in the display portion 62 and the driver circuit portion 64. Other structures are the same as those in the display device 100A; thus, the detailed description thereof is omitted.

The display device 100C includes the transistor 206C in the display portion 62. The display device 100C also includes the transistor 201C in the driver circuit portion 64.

The transistor 206C includes a region transmitting visible light, and the region is included in the display region 68. The transistor 206C includes a region blocking visible light, and the region is included in the non-display region 66.

Meanwhile, the transistor 201C is provided in the driver circuit portion 64; thus, it does not matter whether the region transmitting visible light is included.

The transistor 206C includes the conductive layer 221, the insulating layer 211, the semiconductor layer 231, the conductive layer 222b, and a conductive layer 222c.

The transistor 201C includes the conductive layer 291, an insulating layer 292, the semiconductor layer 293, the conductive layer 294a, and the conductive layer 294b.

Different materials are used for the semiconductor layers of the transistor 201C and the transistor 206C. Specifically, low-temperature polysilicon (hereinafter, LTPS) is used for the transistor 201C, and a metal oxide is used for the transistor 206C.

In the case where LTPS is used for the transistor in the driver circuit portion 64, the field-effect mobility can be increased and the on-state current can be increased, compared with the case where a metal oxide is used. Consequently, a circuit capable of high-speed operation can be manufactured. Furthermore, the area occupied by the driver circuit portion 64 can be reduced, whereby the display device can have a narrower frame.

In addition, a metal oxide is used for the transistor in the display portion 62, whereby the off-state current can be reduced and charge accumulated in a capacitor through the transistor can be held for a long time, compared with the case where LTPS is used. The use of such a transistor in the display portion 62 allows a driver circuit to stop while the gray level of a displayed image is maintained. As a result, the display device with significantly reduced power consumption can be obtained.

The semiconductor layer 231 overlaps with the conductive layer 221 with the insulating layer 211 therebetween.

The semiconductor layer 231 contains a metal oxide.

The semiconductor layer 293 overlaps with the conductive layer 291 with the insulating layer 292 therebetween. The semiconductor layer 293 includes the channel region 293a and the pair of low-resistance regions 293b as illustrated in FIG. 10(C). The semiconductor layer 293 may further include an LDD (Lightly Doped Drain) region. FIG. 10(C) and the like show an example in which an LDD region 293c is provided between the channel region 293a and the low-resistance region 293b. Note that in this specification, the drawings, and the like, the channel region 293a, the low-resistance region 293b, and the LDD region 293c may collectively be referred to as the semiconductor layer 293. The channel region 293a is provided between the pair of low-resistance regions 293b. One of the pair of low-resistance regions 293b is electrically connected to the conductive layer 294a, and the other is electrically connected to the conductive layer 294b. Note that in the transistor 201C in FIG. 10(C), the LDD region 293c does not overlap with the conductive layer 291 with the insulating layer 292 therebetween; however, the LDD region may overlap with the conductive layer 291 with the insulating layer 292 therebetween.

The semiconductor layer 293 contains LTPS.

The conductive layer 222b and the conductive layer 222c are connected to the semiconductor layer 231. One of the conductive layer 222b and the conductive layer 222c serves as a source and the other serves as a drain. The conductive layer 222c preferably serves as a signal line. The conductive layer 222b is electrically connected to the pixel electrode 111.

The conductive layer 222b is formed using a conductive material transmitting visible light. Thus, a connection portion between the pixel electrode 111 and the transistor can be provided in the display region 68. Accordingly, the aperture ratio of a subpixel can be increased. In addition, the power consumption of the display device can be reduced.

One of the conductive layer 294a and the conductive layer 294b serves as a source, and the other serves as a drain.

The conductive layer 221 and the conductive layer 291 each serve as a gate. The conductive layer 221 preferably serves as a gate and a scan line.

The conductive layer 221, the conductive layer 291, the conductive layer 222c, the conductive layer 294a, and the conductive layer 294b are preferably formed using a conductive material with low resistivity. Each of the conductive layers is preferably formed using a conductive material with low resistivity, such as a metal or an alloy. These conductive layers may be formed using a conductive material blocking visible light.

That is, in one embodiment of the present invention, a feature of the transistor in the display portion 62 is that the source electrode and the drain electrode are formed using different materials. For example, in the transistor 206C, the conductive layer 222b and the conductive layer 222c are formed using different materials.

When a conductive layer blocking visible light is used as the conductive layer 221, irradiation of a channel region of the semiconductor layer 231 with light from a backlight can be inhibited. The overlapping of the channel region and the conductive layer blocking visible light can inhibit variations in the characteristics of the transistor 206C due to light. Thus, the reliability of the transistor 206C can be increased.

The light-blocking layer 132 is provided on the substrate 61 side relative to the semiconductor layer 231, and the conductive layer 221 blocking visible light is provided on the substrate 51 side relative to the semiconductor layer 231, whereby irradiation of the channel region with external light and light from the backlight can be inhibited.

The insulating layer 211 and the insulating layer 292 serve as gate insulating layers.

The transistor 201C and the transistor 206C are covered with an insulating layer 217, an insulating layer 218, and the insulating layer 215. Note that the insulating layer 217 and the insulating layer 218 can be considered as the components of the transistors. The transistors are preferably covered with an insulating layer that has an effect of inhibiting the diffusion of impurities to the semiconductors included in the transistors. The insulating layer 215 can serve as a planarization layer.

Each of the insulating layer 211 and the insulating layer 217 preferably includes an excess oxygen region. When the insulating layers in contact with the semiconductor layer 231 include excess oxygen regions, excess oxygen can be supplied into the channel region. Oxygen vacancies that are potentially formed in the channel region can be filled with excess oxygen; thus, a highly reliable transistor can be provided.

An oxide insulating film formed in an oxygen-containing atmosphere, such as a silicon oxide film or a silicon oxynitride film, is preferably used as the insulating layer 217. Furthermore, an insulating film with low oxygen diffusibility and low oxygen permeability, such as a silicon nitride film, is preferably formed as the insulating layer 218 over the silicon oxide film or the silicon oxynitride film. The oxide insulating film formed in an oxygen-containing atmosphere can be an insulating film that easily releases a large amount of oxygen by heating. When heat treatment is performed on a stack of such an oxide insulating film that releases oxygen and an insulating film with low oxygen diffusibility and low oxygen permeability, oxygen can be supplied to the semiconductor layer 231. As a result, oxygen vacancies in the semiconductor layer 231 and defects at the interface between the semiconductor layer 231 and the insulating layer 217 can be repaired, leading to a reduction in the density of defect states. Consequently, the display device with extremely high reliability can be obtained.

An insulating film containing hydrogen is preferably formed as the insulating layer 292. In that case, hydrogen can be supplied from the insulating layer 292 containing hydrogen into the semiconductor layer 293, so that defects in the semiconductor layer 293 can be terminated with hydrogen.

[Method for Manufacturing Transistor 201C and Transistor 206C]

Next, a method for manufacturing the transistor 201C and the transistor 206C in the display device 100C will be described with reference to FIG. 10 and FIG. 11. Note that in the following method for manufacturing the transistors, steps and materials similar to those for the above method for manufacturing the transistors are not described in some cases.

Figure 10A:
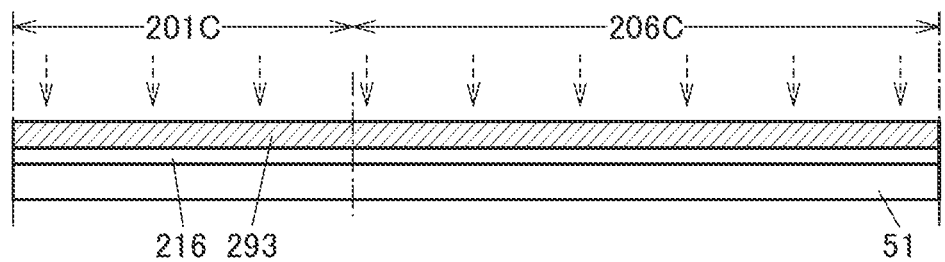
FIGS. 10A-10D are cross-sectional views illustrating an example of a method for manufacturing a transistor.

First, a base layer 216 is formed over the substrate 51 (FIG. 10(A)).

Next, a semiconductor film is formed over the base layer 216 by a sputtering method, a CVD method, or the like. In this embodiment, an amorphous silicon film is formed with a plasma CVD apparatus.

Then, heat treatment is preferably performed on the amorphous silicon film. This allows hydrogen to be released from the amorphous silicon film. Specifically, the amorphous silicon film is preferably heated at a temperature higher than or equal to 400° C. and lower than or equal to 550° C. For example, when the amount of hydrogen contained in the amorphous silicon film is smaller than or equal to 5 atomic %, manufacturing yield in the crystallization step can be improved. Note that the heat treatment may be omitted in the case where the amount of hydrogen contained in the amorphous silicon film is small.

After that, the semiconductor film is crystallized to form a semiconductor layer 293 having a crystal structure (FIG. 10(A)).

The semiconductor film can be crystallized by irradiation with laser light from above the semiconductor film (see arrows in FIG. 10(A)). The laser light with a wavelength of 193 nm, 248 nm, 308 nm, or 351 nm, for example, can be used. Alternatively, the semiconductor film may be crystallized by using a metal catalyst element (such as nickel).

The semiconductor film is preferably formed over a flat surface, in which case uniform irradiation with laser light is facilitated. For this reason, the semiconductor layer 293 is preferably formed before the other semiconductor layers and conductive layers are formed. Therefore, a part (e.g., a semiconductor film) is preferably formed earlier in the transistor using LTPS than a transistor using a metal oxide, amorphous silicon, or the like.

Next, channel doping may be performed on the semiconductor layer 293 having a crystal structure.

Figure 10B:
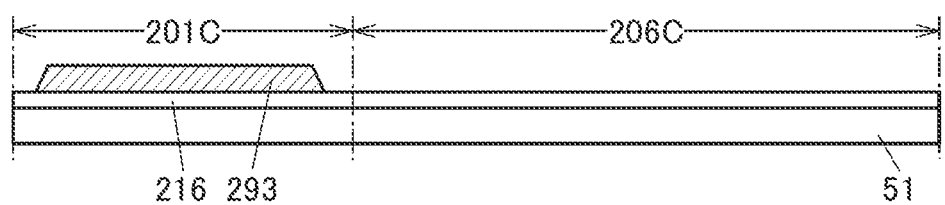
Figure 10C:
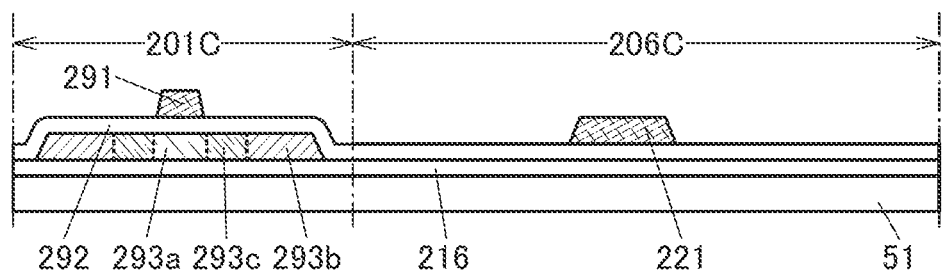

Then, the semiconductor layer 293 having a crystal structure is processed to form an island-shaped semiconductor layer 293 (FIG. 10(B)).

The semiconductor film can be processed by a wet etching method and/or a dry etching method.

Then, the insulating layer 292 is formed over the base layer 216 and the semiconductor layer 293 (FIG. 10(C)). For the insulating layer 292, the materials that can be used for the insulating layer 211 can be referred to.

After that, the conductive layer 221 and the conductive layer 291 are formed over the insulating layer 292 (FIG. 10(C)).

In this manner, the conductive layer 291 serving as a gate of the transistor 201C and the conductive layer 221 serving as a gate of the transistor 206C can be formed in the same process.

Next, an impurity element is added to part of the semiconductor layer 293, whereby the channel region 293a and the low-resistance region 293b are formed. The impurity element may be added a plurality of times (where light doping and heavy doping are performed) to form the LDD region 293c between the channel region 293a and the low-resistance region 293b. The conductive layer 291 and a mask used to form the conductive layer 291 can serve as a mask for adding the impurity element.

In the case of manufacturing an n-channel transistor, an impurity imparting n-type conductivity to the semiconductor layer 293 is used as the impurity element. For example, an element such as P, As, Sb, S, Te, or Se can be used.

In the case of manufacturing a p-channel transistor, an impurity imparting p-type conductivity to the semiconductor layer 293 is used as the impurity element. For example, an element such as B, Al, or Ga can be used.

Figure 10D:
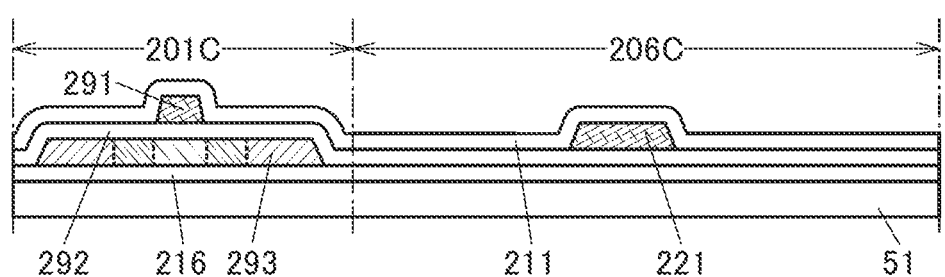

Then, the insulating layer 211 is formed over the insulating layer 292, the conductive layer 221, and the conductive layer 291 (FIG. 10(D)).

Then, heat treatment is performed. This activates the impurity added to the semiconductor layer 293. The heat treatment is preferably performed after the formation of the insulating layer 211 so as to prevent oxidation of the conductive layer 291 and the conductive layer 221.

In the case where an insulating layer containing hydrogen is used for the insulating layer 292 or the insulating layer 211, hydrogen can be supplied from the insulating layer containing hydrogen into the semiconductor layer 293 (in particular, into the channel region 293a), and defects in the semiconductor layer 293 can be terminated with hydrogen. The heat treatment is performed at a temperature lower than that for the heat treatment performed on the amorphous silicon film in order to release hydrogen.

Figure 11A:
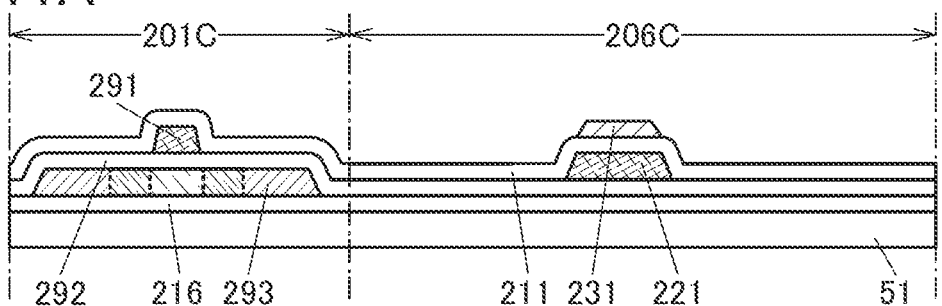
FIGS. 11A-11C are cross-sectional views illustrating an example of a method for manufacturing a transistor.
Figure 11B:
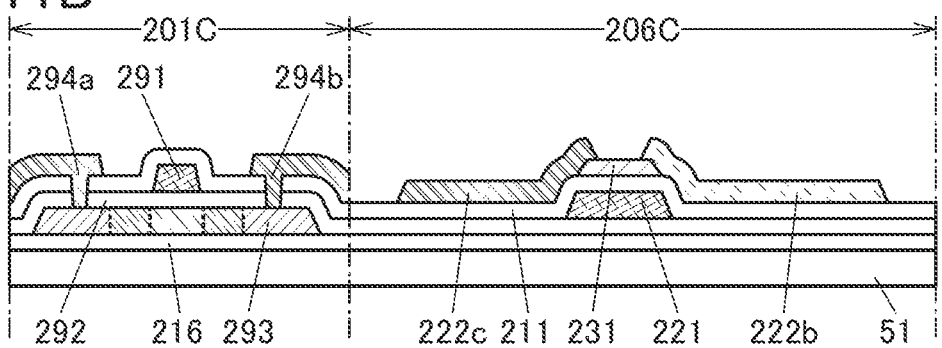

Next, the semiconductor layer 231 is formed over the insulating layer 211 (FIG. 11(A)). The description of the method for manufacturing the transistor 206A can be referred to for a method for forming the semiconductor layer 231.

Then, openings reaching the semiconductor layer 293 (the pair of low-resistance regions 293b) are formed in the insulating layer 211 and the insulating layer 292.

After that, the conductive layer 222b is formed in contact with the semiconductor layer 231. In addition, the conductive layer 222c is formed in contact with the semiconductor layer 231. The conductive layer 294a and the conductive layer 294b are formed to fill the openings provided in the insulating layer 211 and the insulating layer 292 (FIG. 11(B)). The conductive layer 294a is connected to one of the pair of low-resistance regions 293b. The conductive layer 294b is connected to the other of the pair of low-resistance regions 293b.

The conductive layer 294a, the conductive layer 294b, and the conductive layer 222c can be formed using the same process and the same material.

In the case where a metal oxide is used for the conductive layer 222b, the metal oxide is over and in contact with the conductive layer 294a, the conductive layer 294b, and the conductive layer 222c, which might result in oxidation of the conductive layers. For this reason, the conductive layer 222b is preferably formed earlier than the conductive layers.

The conductive layer 222b may be formed before the openings are provided in the insulating layer 211 and the insulating layer 292.

Figure 11C:
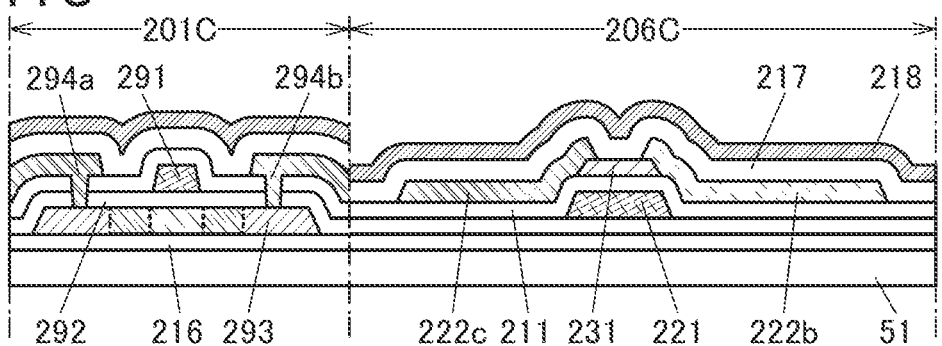

Next, the insulating layer 217 is formed to cover the semiconductor layer 231, the insulating layer 211, the conductive layer 294a, the conductive layer 294b, the conductive layer 222b, and the conductive layer 222c, and the insulating layer 218 is formed over the insulating layer 217 (FIG. 11(C)).

As described above, an oxide insulating film is preferably used for the insulating layer 217, and a nitride insulating film is preferably used for the insulating layer 218. As materials for the insulating films, the materials that can be used for the insulating layer 211 can be enumerated.

Through the above process, the transistor 201C and the transistor 206C can be formed. As described above, some of the manufacturing steps for the transistor 201C and some of the manufacturing steps for the transistor 206C can be performed at the same time. This can inhibit an increase in the number of manufacturing steps for the display device.

Structure Example 4 of Display Device

Next, a display device of this embodiment will be described with reference to FIG. 12 and FIG. 13.

Figure 12:
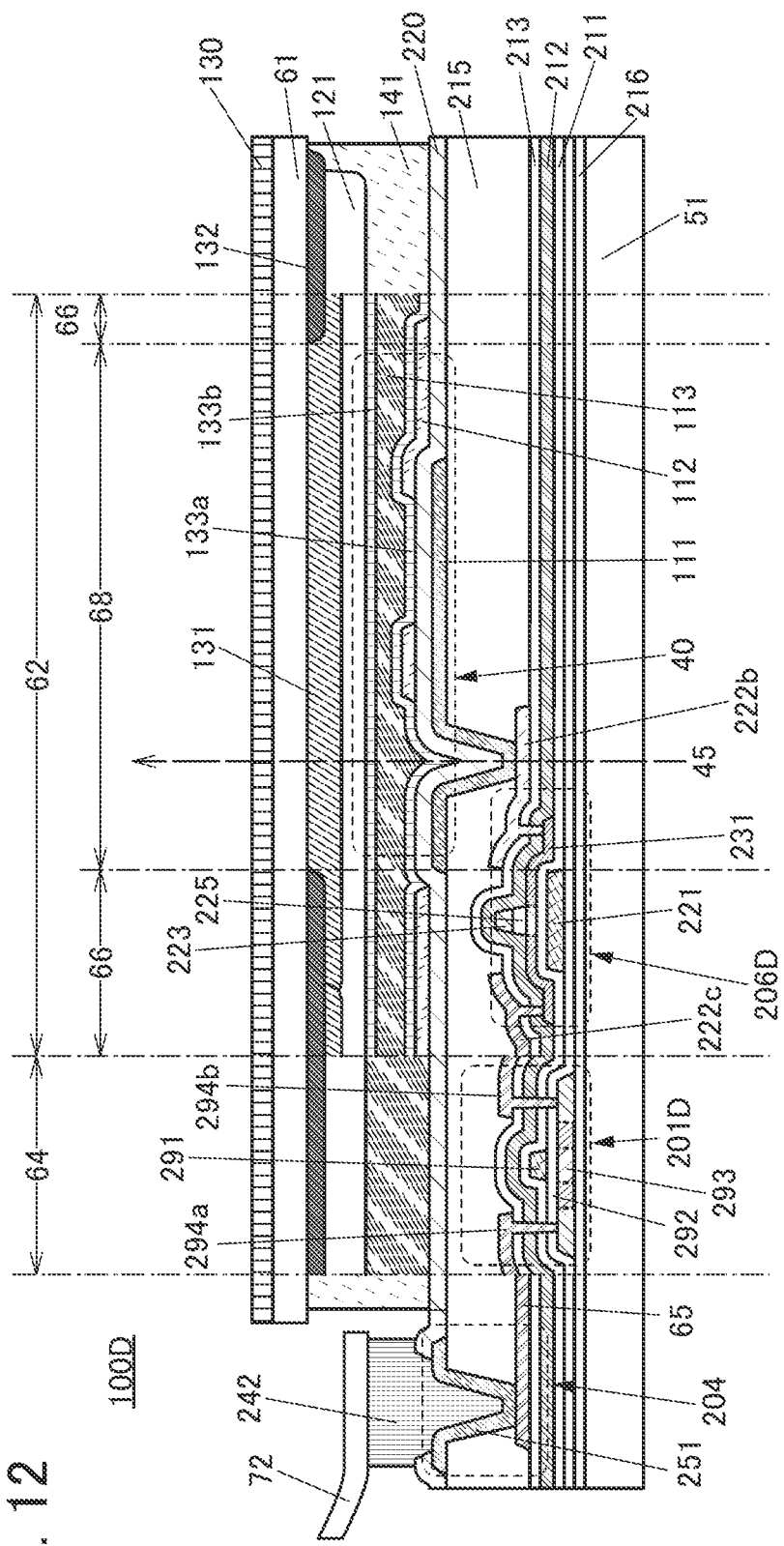
FIG. 12 is a cross-sectional view illustrating an example of a display device.

FIG. 12 shows a cross-sectional view of a display device 100D. FIG. 13 shows a cross-sectional view illustrating a method for manufacturing a transistor 201D and a transistor 206D included in the display device 100D.

The display device 100D is different from the display device 100A in the transistor structures of the display portion 62 and the driver circuit portion 64. Other structures are the same as those in the display device 100A; thus, the detailed description thereof is omitted.

The display device 100D includes the transistor 206D in the display portion 62. The display device 100D also includes the transistor 201D in the driver circuit portion 64.

The transistor 206D includes a region transmitting visible light, and the region is included in the display region 68. The transistor 206D includes a region blocking visible light, and the region is included in the non-display region 66.

Meanwhile, since the transistor 201D is provided in the driver circuit portion 64, it does not matter whether the region transmitting visible light is included.

The transistor 206D includes the conductive layer 221, the insulating layer 211, the semiconductor layer 231, the conductive layer 222b, the conductive layer 222c, the insulating layer 225, and the conductive layer 223.

The transistor 201D has the same structure as the transistor 201C; thus, the detailed description thereof is omitted. Note that in the transistor 201C, the conductive layer 294a and the conductive layer 294b are connected to the semiconductor layer 293 through the openings in the insulating layer 211 and the insulating layer 292, while in the transistor 201D, the conductive layer 294a and the conductive layer 294b are connected to the semiconductor layer 293 through openings in the insulating layer 212 and the insulating layer 213, in addition to the insulating layer 211 and the insulating layer 292.

Different materials are used for the semiconductor layers of the transistor 201D and the transistor 206D. Specifically, LTPS is used for the transistor 201D, and a metal oxide is used for the transistor 206D.

As described above, when LTPS is used for the transistor in the driver circuit portion 64, the field-effect mobility can be increased and the on-state current can be increased, compared with the case where a metal oxide is used. Consequently, the circuit capable of high-speed operation can be manufactured. Furthermore, the area occupied by the driver circuit portion 64 can be reduced, whereby the display device can have a narrower frame.

In addition, a metal oxide is used for the transistor in the display portion 62, whereby the off-state current can be reduced and charge accumulated in a capacitor through the transistor can be held for a long time, compared with the case where LTPS is used. The use of such a transistor for the display portion 62 allows a driver circuit to stop while the gray level of a displayed image is maintained. As a result, the display device with significantly reduced power consumption can be obtained.

The semiconductor layer 231 overlaps with the conductive layer 221 with the insulating layer 211 therebetween. The semiconductor layer 231 overlaps with the conductive layer 223 with the insulating layer 225 therebetween. The semiconductor layer 231 includes the channel region 231a and the pair of low-resistance regions 231b (also referred to as a source region and a drain region) as illustrated in FIG. 13(C). Note that in this specification, the drawings, and the like, the channel region 231a and the low-resistance regions 231b may collectively be referred to as the semiconductor layer 231. The channel region 231a is provided between the pair of low-resistance regions 231b. As illustrated in FIG. 12 and FIG. 13(C), one of the pair of low-resistance regions 231b is electrically connected to the conductive layer 222c, and the other is electrically connected to the conductive layer 222b.

The semiconductor layer 231 contains a metal oxide.

One of the conductive layer 222b and the conductive layer 222c serves as a source and the other serves as a drain. The conductive layer 222c preferably serves as a signal line. The conductive layer 222b is electrically connected to the pixel electrode 111. In the transistor 206D, the conductive layer 222b and the conductive layer 222c are formed using different materials.

The conductive layer 222b is formed using a conductive material transmitting visible light. Thus, a connection portion between the pixel electrode 111 and the transistor can be provided in the display region 68. Accordingly, the aperture ratio of a subpixel can be increased. In addition, the power consumption of the display device can be reduced.

The conductive layer 223 serves as a gate. The conductive layer 221 serves as a back gate. The conductive layer 221 is preferably formed using the same process and the same material as those for a scan line.

The conductive layer 221 and the conductive layer 222c are preferably formed using a conductive material with low resistivity. Each of the conductive layers is preferably formed using a conductive material with low resistivity, such as a metal or an alloy. The conductive layers may be formed using a conductive material blocking visible light.

When a conductive layer blocking visible light is used as the conductive layer 221, irradiation of the channel region of the semiconductor layer 231 with light from a backlight can be inhibited. The overlapping of the channel region and the conductive layer blocking visible light can inhibit variations in the characteristics of the transistor 206D due to light. Thus, the reliability of the transistor 206D can be increased.

The light-blocking layer 132 is provided on the substrate 61 side relative to the semiconductor layer 231, and the conductive layer 223 blocking visible light is provided on the substrate 51 side relative to the semiconductor layer 231, whereby irradiation of the channel region with external light and light from the backlight can be inhibited.

In one embodiment of the present invention, the conductive layer blocking visible light may overlap with part of the semiconductor layer and does not necessarily overlap with another part of the semiconductor layer. For example, the conductive layer blocking visible light needs to overlap with at least the channel region. Specifically, as illustrated in FIG. 12 and the like, the low-resistance region adjacent to the channel region includes a region that does not overlap with the conductive layer 221. Note that the low-resistance region may be rephrased as the oxide conductor (OC) described above. Since the oxide conductor (OC) has a visible-light-transmitting property as described above, light can be extracted through the low-resistance region.

In the case where silicon, typically amorphous silicon, low-temperature polysilicon, or the like is used for the semiconductor layer of the transistor 206D, the aforementioned low-resistance region corresponds to a region containing an impurity such as phosphorus or boron in silicon. Note that the band gap of silicon is approximately 1.1 eV. When an impurity such as phosphorus or boron is contained in silicon, the band gap becomes smaller in some cases. Accordingly, in the case of using silicon for the semiconductor layer of the transistor 206D, the low-resistance region formed in silicon has a poor visible-light-transmitting property; therefore, it is sometimes difficult for the low-resistance region to transmit light for extraction of the light. However, in one embodiment of the present invention, both the oxide semiconductor (OS) and the oxide conductor (OC) have a visible-light-transmitting property, leading to an increase in the aperture ratio of a pixel or a subpixel.

Each of the insulating layer 211, the insulating layer 225, and the insulating layer 292 serves as a gate insulating layer.

The transistor 201D and the transistor 206D are covered with the insulating layer 212, the insulating layer 213, and the insulating layer 215. The description of the display device 100A can be referred to for these layers.

[Method for Manufacturing Transistor 201D and Transistor 206D]

Next, a method for manufacturing the transistor 201D and the transistor 206D in the display device 100D will be described with reference to FIG. 13.

Figure 13A:
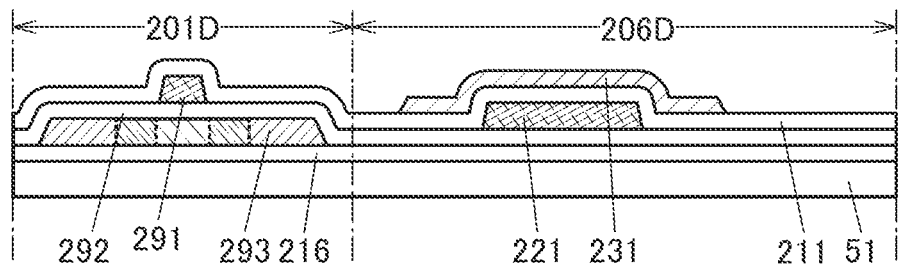
FIGS. 13A-13C are cross-sectional views illustrating an example of a method for manufacturing a transistor.

First, as in the method for manufacturing the transistor 201C and the transistor 206C (from FIG. 10(A) to FIG. 11(A)), the base layer 216, the island-like semiconductor layer 293, the insulating layer 292, the conductive layer 221, the conductive layer 291, the insulating layer 211, and the semiconductor layer 231 are formed over the substrate 51 (FIG. 13(A)).

That is, in the manufacturing process of the transistor 201D and the transistor 206D, the conductive layer 291 serving as a gate of the transistor 201D and the conductive layer 221 serving as a gate of the transistor 206D can be formed in the same process.

Figure 13B:
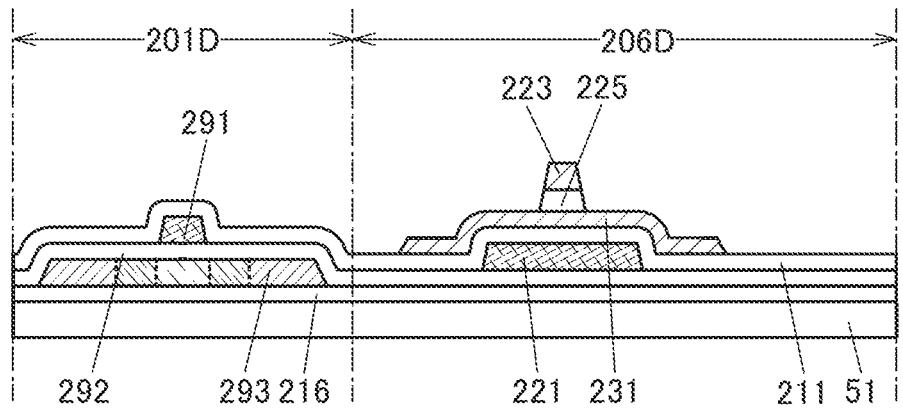
Figure 13C:
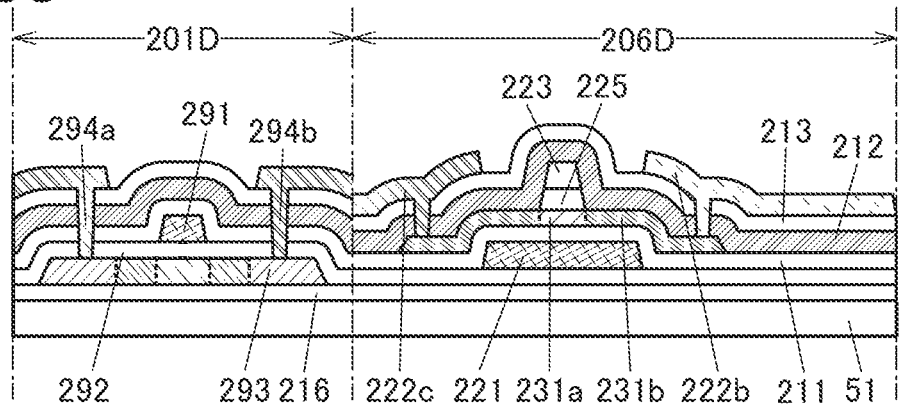

Next, the insulating layer 225 and the conductive layer 223 are formed over the semiconductor layer 231 (FIG. 13(B)). The method for manufacturing the transistor 201A and the transistor 206A can be referred to for the subsequent steps.

Here, the insulating layer 225 and the conductive layer 223 are formed such that the end portion of the insulating layer 225 and the end portion of the conductive layer 223 are positioned more inward than the end portion of the semiconductor layer 231 in the channel length direction of the transistor 206D.

Next, the insulating layer 212 is formed to cover the insulating layer 211, the semiconductor layer 231, the insulating layer 225, and the conductive layer 223, and the insulating layer 213 is formed over the insulating layer 212. Then, openings reaching the semiconductor layer 293 (the pair of low-resistance regions 293*b*) and openings reaching the semiconductor layer 231 (the pair of low-resistance regions 231*b*) are formed in the insulating layer 212 and the insulating layer 213.

Next, the conductive layer 294*a*, the conductive layer 294*b*, the conductive layer 222*b*, and the conductive layer 222*c* are formed to fill the openings provided in the insulating layer 212 and the insulating layer 213 (FIG. 13(C)). The conductive layer 294*a* is connected to one of the pair of low-resistance regions 293*b*. The conductive layer 294*b* is connected to the other of the pair of low-resistance regions 293*b*. The conductive layer 222*b* is connected to one of the low-resistance regions 231*b*. The conductive layer 222*c* is connected to the other of the pair of low-resistance regions 231*b*.

The conductive layer 294*a*, the conductive layer 294*b*, and the conductive layer 222*c* can be formed using the same process and the same material.

When a metal oxide is used for the conductive layer 222*b*, the metal oxide is over and in contact with the conductive layer 294*a*, the conductive layer 294*b*, and the conductive layer 222*c*, which might result in oxidation of the conductive layers. For this reason, the conductive layer 222*b* is preferably formed earlier than the conductive layers.

The conductive layer 222*b* may be formed before the openings are provided in the insulating layer 212 and the insulating layer 213.

Through the above process, the transistor 201D and the transistor 206D can be formed. As described above, some of the manufacturing steps for the transistor 201D and some of the manufacturing steps for the transistor 206D can be performed at the same time. Accordingly, an increase in the number of manufacturing steps for the display device can be inhibited.

Structure Example 5 of Display Device

Next, a display device of this embodiment will be described with reference to FIG. 14 and FIG. 15.

Figure 14:
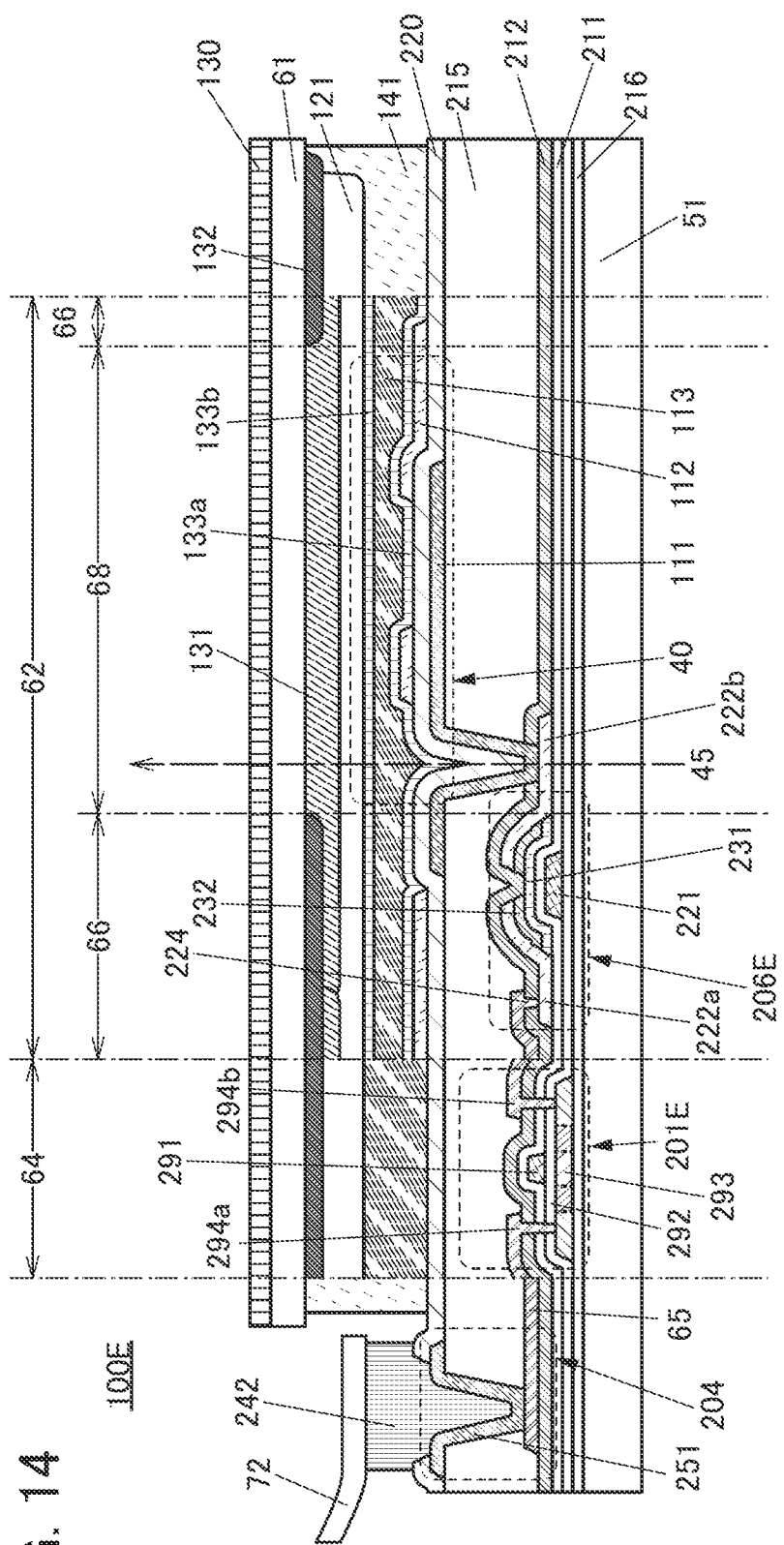
FIG. 14 is a cross-sectional view illustrating an example of a display device.

FIG. 14 shows a cross-sectional view of a display device 100E. FIG. 15 shows a cross-sectional view illustrating a method for manufacturing a transistor 201E and a transistor 206E included in the display device 100E.

The display device 100E is different from the display device 100A in the transistor structures of the display portion 62 and the driver circuit portion 64. Other structures are the same as those in the display device 100A; thus, the detailed description thereof is omitted.

The display device 100E includes the transistor 206E in the display portion 62. The display device 100E also includes the transistor 201E in the driver circuit portion 64.

The transistor 206E includes a region transmitting visible light, and the region is included in the display region 68. The transistor 206E includes a region blocking visible light, and the region is included in the non-display region 66.

Meanwhile, the transistor 201E is provided in the driver circuit portion 64, and thus it does not matter whether a region transmitting visible light is included.

The transistor 206E includes the conductive layer 221, the insulating layer 211, the semiconductor layer 231, an impurity semiconductor layer 232, the conductive layer 222a, and the conductive layer 222b.

The transistor 201E includes the conductive layer 291, the insulating layer 292, the semiconductor layer 293, the conductive layer 294a, and the conductive layer 294b.

The crystal structure of a material used for the semiconductor layer differs between the transistor 201E and the transistor 206E. Specifically, LTPS is used for the transistor 201E, and amorphous silicon is used for the transistor 206E.

When LTPS is used for the transistor in the driver circuit portion 64, the field-effect mobility can be increased and the on-state current can be increased, compared with the case where amorphous silicon is used. Consequently, the circuit capable of high-speed operation can be manufactured. Furthermore, the area occupied by the driver circuit portion 64 can be reduced, whereby the display device can have a narrower frame.

When amorphous silicon is used for the transistor in the display portion 62, the laser crystallization process for the display portion 62 is not necessary. Therefore, only the driver circuit portion 64 needs to be subjected to laser irradiation, and the entire area of the substrate does not need to be irradiated with laser light. In other words, the area where laser crystallization is performed can be reduced.

When the entire area of the substrate is irradiated with laser light, a linear laser beam is preferably used; however, a laser apparatus for linear laser beam irradiation is expensive and has high running costs. In the case where only the driver circuit portion 64 is subjected to laser irradiation, the cost can be significantly reduced compared with the case where the entire surface of the substrate is subjected to laser irradiation. In addition, application to a large-sized substrate is easy.

The semiconductor layer 231 overlaps with the conductive layer 221 with the insulating layer 211 therebetween.

The semiconductor layer 231 contains amorphous silicon.

The semiconductor layer 293 overlaps with the conductive layer 291 with the insulating layer 292 therebetween. The semiconductor layer 293 includes a channel region between a pair of low-resistance regions. One of the pair of low-resistance regions is electrically connected to the conductive layer 294a, and the other is electrically connected to the conductive layer 294b.

The semiconductor layer 293 contains LTPS.

The conductive layer 222a and the conductive layer 222b are electrically connected to the semiconductor layer 231 through the impurity semiconductor layer 232. One of the conductive layer 222a and the conductive layer 222b serves as a source and the other serves as a drain. The conductive layer 222a is electrically connected to the signal line 224. The conductive layer 222b is electrically connected to the pixel electrode 111.

The conductive layer 222a and the conductive layer 222b are formed using a conductive material transmitting visible light. Thus, a connection portion between the pixel electrode 111 and the transistor can be provided in the display region 68. Accordingly, the aperture ratio of the subpixel can be increased. In addition, the power consumption of the display device can be reduced.

One of the conductive layer 294a and the conductive layer 294b serves as a source, and the other serves as a drain.

The conductive layers 221 and the conductive layer 291 each serve as a gate. The conductive layer 221 preferably serves as a gate and a scan line.

The conductive layer 221, the conductive layer 291, the signal line 224, the conductive layer 294a, and the conductive layer 294b are preferably formed using a conductive material with low resistivity. Each of the conductive layers is preferably formed using a conductive material with low resistivity, such as a metal or an alloy. The conductive layers may be formed using a conductive material blocking visible light.

The insulating layer 211 and the insulating layer 292 each serve as a gate insulating layer.

The transistor 201E and the transistor 206E are covered with the insulating layer 212 and the insulating layer 215. The description of the display device 100A can be referred to for these layers.

[Method for Manufacturing Transistor 201E and Transistor 206E)

Next, a method for manufacturing the transistor 201E and the transistor 206E in the display device 100E will be described with reference to FIG. 15.

Figure 15A:
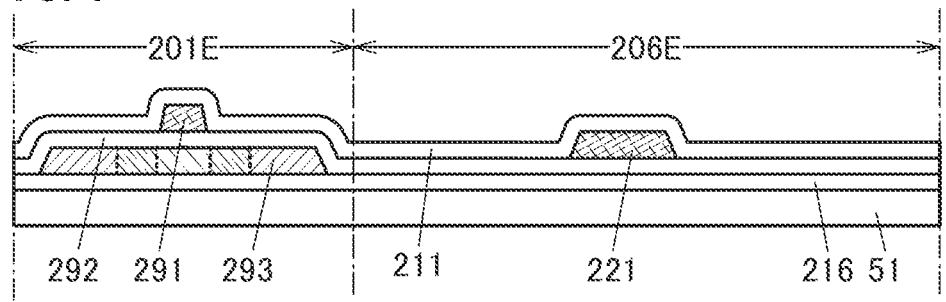
FIGS. 15A-15D are cross-sectional views illustrating an example of a method for manufacturing a transistor.

First, as in the method for manufacturing the transistor 201C and the transistor 206C (from FIG. 10(A) to FIG. 10(D)), the base layer 216, the island-like semiconductor layer 293, the insulating layer 292, the conductive layer 221, the conductive layer 291, and the insulating layer 211 are formed over the substrate 51 (FIG. 15(A)).

That is, in the manufacturing process of the transistor 201E and the transistor 206E, the conductive layer 291 serving as a gate of the transistor 201E and the conductive layer 221 serving as a gate of the transistor 206E can be formed in the same process.

Figure 15B:
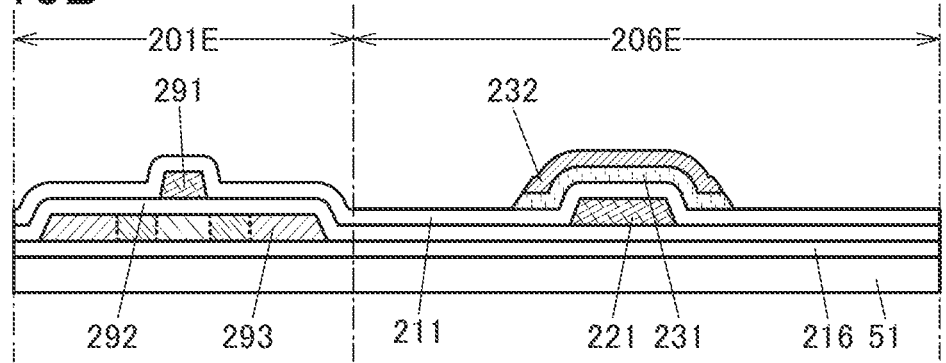

Next, the semiconductor layer 231 and the impurity semiconductor layer 232 are formed over the insulating layer 211 (FIG. 15(B)). Here, an amorphous silicon film to be the semiconductor layer 231 is formed, an amorphous silicon film to which an impurity element imparting one conductivity type is added and which is to be the impurity semiconductor layer 232 is formed, and then, a resist mask is formed and the two layers are etched at one time. After that, the resist mask is removed.

Figure 15C:
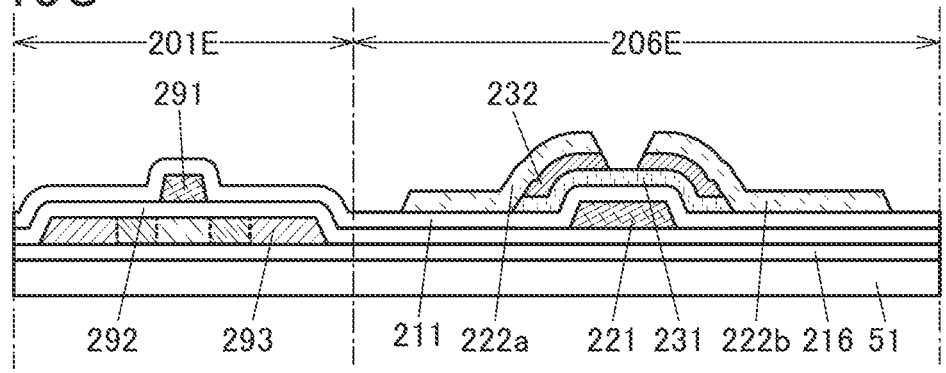

Next, the conductive layer 222a and the conductive layer 222b are formed over the insulating layer 211, the semiconductor layer 231, and the impurity semiconductor layer 232 (FIG. 15(C)). Here, when a conductive film to be the conductive layer 222a and the conductive layer 222b is etched, the impurity semiconductor layer 232 is partly etched and the semiconductor layer 231 is exposed.

Then, the insulating layer 212 is formed to cover the insulating layer 211, the semiconductor layer 231, the conductive layer 222a, and the conductive layer 222b. Then, openings reaching the semiconductor layer 293 (the pair of low-resistance regions 293b) and an opening reaching the conductive layer 222a are formed in the insulating layer 212. At that time, openings may be provided also in the insulating layer 292 and the insulating layer 211. Alternatively, openings reaching the semiconductor layer 293 may be provided in the insulating layer 292 and the insulating layer 211 in advance.

Figure 15D:
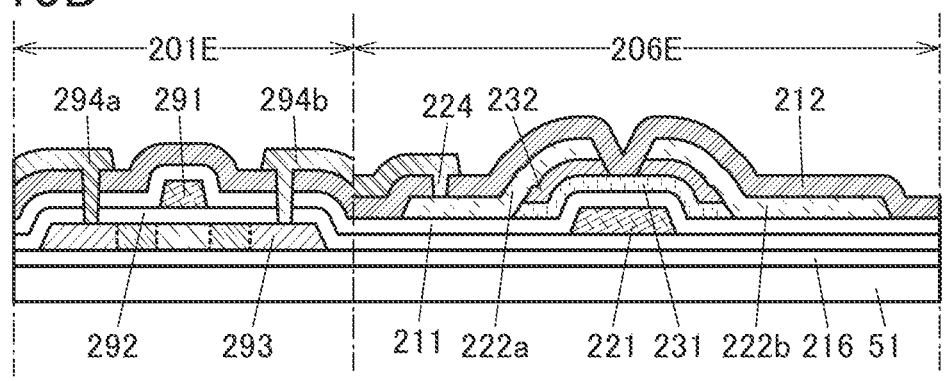

Then, the conductive layer 294a, the conductive layer 294b, and the signal line 224 are formed to fill the openings provided in the insulating layer 212 and the like (FIG. 15(D)). The conductive layer 294a is connected to one of the pair of low-resistance regions 293b. The conductive layer 294b is connected to the other of the pair of low-resistance regions 293b. The signal line 224 is connected to the conductive layer 222a.

The conductive layer 294a, the conductive layer 294b, and the signal line 224 can be formed using the same process and the same material.

Through the above process, the transistor 201E and the transistor 206E can be formed. As described above, some of the manufacturing steps for the transistor 201E and some of the manufacturing steps for the transistor 206E can be performed at the same time. Accordingly, an increase in the number of manufacturing steps for the display device can be inhibited.

Structure Example 6 of Display Device

Next, a display device of this embodiment will be described with reference to FIG. 16 and FIG. 17.

Figure 16:
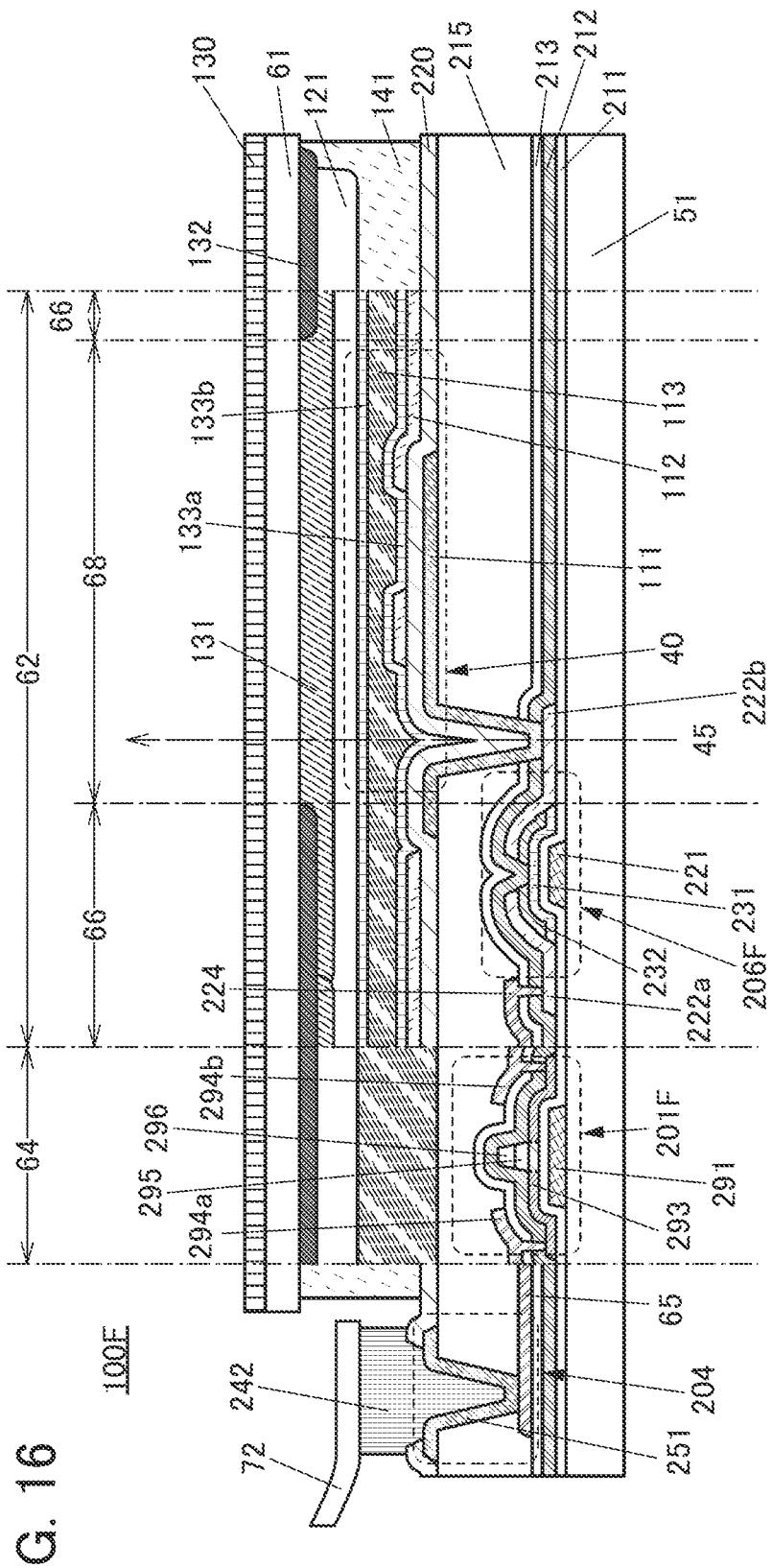
FIG. 16 is a cross-sectional view illustrating an example of a display device.

FIG. 16 shows a cross-sectional view of a display device 100F. FIG. 17 shows a cross-sectional view illustrating a method for manufacturing a transistor 201F and a transistor 206F included in the display device 100F.

The display device 100F is different from the display device 100A in the transistor structures in the display portion 62 and the driver circuit portion 64. Other structures are the same as those in the display device 100A; thus, the detailed description thereof is omitted.

The display device 100F includes the transistor 206F in the display portion 62. The display device 100F also includes the transistor 201F in the driver circuit portion 64.

The transistor 206F includes a region transmitting visible light, and the region is included in the display region 68. The transistor 206F includes a region blocking visible light, and the region is included in the non-display region 66.

Meanwhile, the transistor 201F is provided in the driver circuit portion 64, and thus it does not matter whether a region transmitting visible light is included.

The transistor 201F has the same structure as the transistor 206E; thus, the detailed description thereof is omitted. Note that the conductive layer 222a of the transistor 206E is electrically connected to the signal line 224 through the opening in the insulating layer 212, while the conductive layer 222a of the transistor 206F is electrically connected to the signal line 224 through an opening in the insulating layer 212 and the insulating layer 213.

The transistor 201F includes the conductive layer 291, the insulating layer 211, the semiconductor layer 293, the conductive layer 294a, the conductive layer 294b, the insulating layer 295, and the conductive layer 296.

Different materials are used for the semiconductor layers of the transistor 201F and the transistor 206F. Specifically, a metal oxide is used for the transistor 201F, and amorphous silicon is used for the transistor 206F.

When a metal oxide is used for the transistor in the driver circuit portion 64, the field-effect mobility can be increased and the on-state current can be increased, compared with the case where amorphous silicon is used. Consequently, the circuit capable of high-speed operation can be manufactured. Furthermore, the area occupied by the driver circuit portion 64 can be reduced, whereby the display device can have a narrower frame.

The semiconductor layer 293 overlaps with the conductive layer 291 with the insulating layer 211 therebetween. The semiconductor layer 293 overlaps with the conductive layer 296 with the insulating layer 295 therebetween. The semiconductor layer 293 includes a channel region between a pair of low-resistance regions. One of the low-resistance regions is electrically connected to the conductive layer 294a, and the other is electrically connected to the conductive layer 294b.

The semiconductor layer 293 contains a metal oxide.

One of the conductive layer 294a and the conductive layer 294b serves as a source, and the other serves as a drain.

The conductive layer 296 serves as a gate. The conductive layer 291 serves as a back gate.

The conductive layer 291, the conductive layer 294a, and the conductive layer 294b are preferably formed using a conductive material with low resistivity. Each of the conductive layers is preferably formed using a conductive material with low resistivity, such as a metal or an alloy. The conductive layers may be formed using a conductive material blocking visible light.

The insulating layer 211 and the insulating layer 295 serve as gate insulating layers.

The transistor 201F and the transistor 206F are covered with the insulating layer 212, the insulating layer 213, and the insulating layer 215. The description of the display device 100A can be referred to for these layers.

[Method for Manufacturing Transistor 201F and Transistor 206F]

Next, a method for manufacturing the transistor 201F and the transistor 206F in the display device 100F will be described with reference to FIG. 17.

Figure 17A:
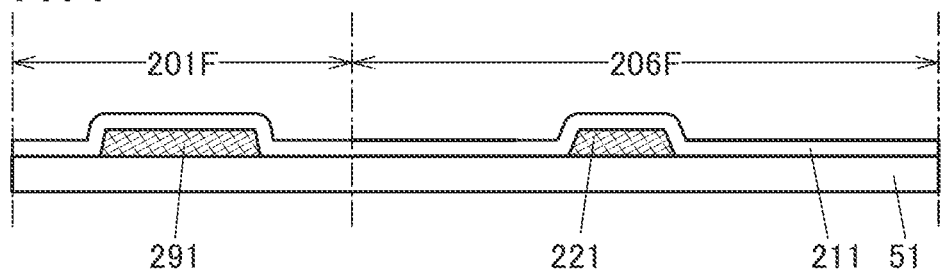
FIGS. 17A-17D are cross-sectional views illustrating an example of a method for manufacturing a transistor.

First, as in the method for manufacturing the transistor 201A and the transistor 206A (FIG. 5(A)), the conductive layer 221, the conductive layer 291, and the insulating layer 211 are formed over the substrate 51 (FIG. 17(A)).

That is, in the manufacturing process of the transistor 201F and the transistor 206F, the conductive layer 291 serving as a gate of the transistor 201F and the conductive layer 221 serving as a gate of the transistor 206F can be formed in the same process.

Figure 17B:
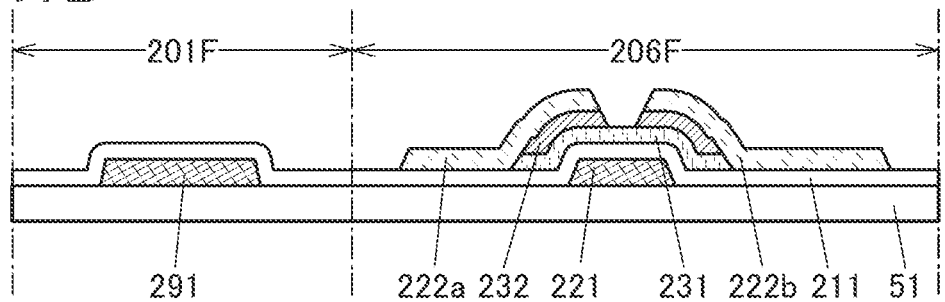

Next, as in the method for manufacturing the transistor 201E and the transistor 206E (FIGS. 15(B) and (C)), the semiconductor layer 231, the impurity semiconductor layer 232, the conductive layer 222a, and the conductive layer 222b are formed over the insulating layer 211 (FIG. 17(B)).

Figure 17C:
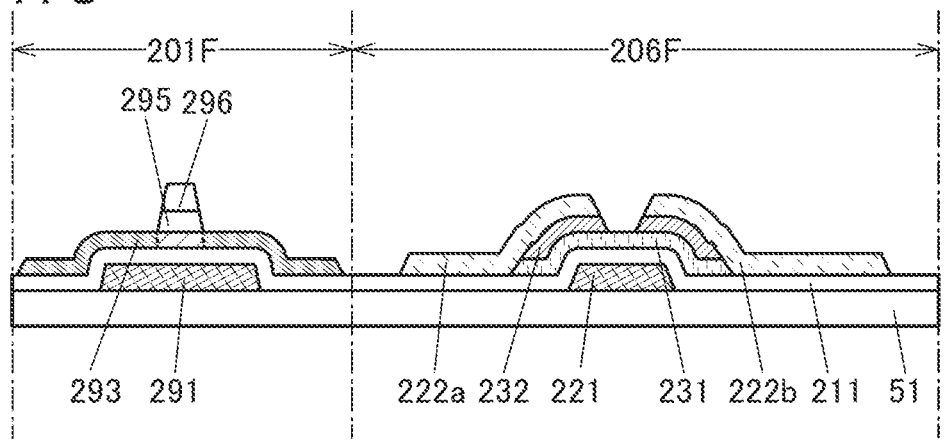

Then, as in the method for manufacturing the transistor 201D and the transistor 206D (FIGS. 13(A) and (B)), the semiconductor layer 293, the insulating layer 295, and the conductive layer 296 are formed (FIG. 17(C)).

Then, the insulating layer 212 and the insulating layer 213 are formed to cover the insulating layer 211, the semiconductor layer 231, the conductive layer 222a, the conductive layer 222b, the semiconductor layer 293, the insulating layer 295, and the conductive layer 296. After that, openings reaching the semiconductor layer 293 (the pair of low-resistance regions 293b) and an opening reaching the conductive layer 222a are formed in the insulating layer 212 and the insulating layer 213.

Figure 17D:
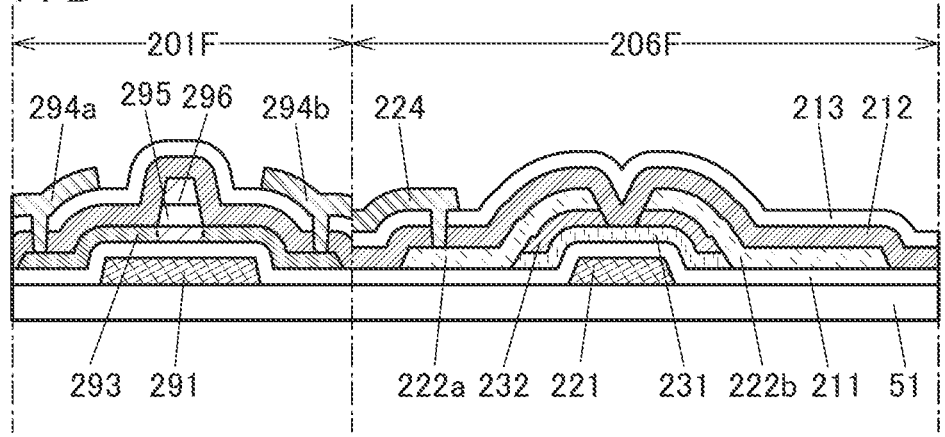

Next, the conductive layer 294a and the conductive layer 294b and the signal line 224 are formed to fill the openings provided in the insulating layer 212 and the insulating layer 213 (FIG. 17(D)). The conductive layer 294a is connected to one of the pair of low-resistance regions 293b. The conductive layer 294b is connected to the other of the pair of low-resistance regions 293b. The signal line 224 is connected to the conductive layer 222a.

The conductive layer 294a, the conductive layer 294b, and the signal line 224 can be formed using the same process and the same material.

Through the above process, the transistor 201F and the transistor 206F can be formed. As described above, some of the manufacturing steps for the transistor 201F and some of the manufacturing steps for the transistor 206F can be performed at the same time. Accordingly, an increase in the number of manufacturing steps for the display device can be inhibited.

Structure Example 7 of Display Device

Next, display devices of this embodiment will be described with reference to FIG. 18 to FIG. 20. A display device 110A to a display device 110C described below as examples are the same in that the semiconductor layer of the transistor in the driver circuit portion 64 contains a metal oxide. When the semiconductor layer of the transistor contains a metal oxide, the withstand voltage between the source and the drain can be increased. As a result, the reliability of the transistor in the driver circuit portion 64 can be increased.

Figure 18:
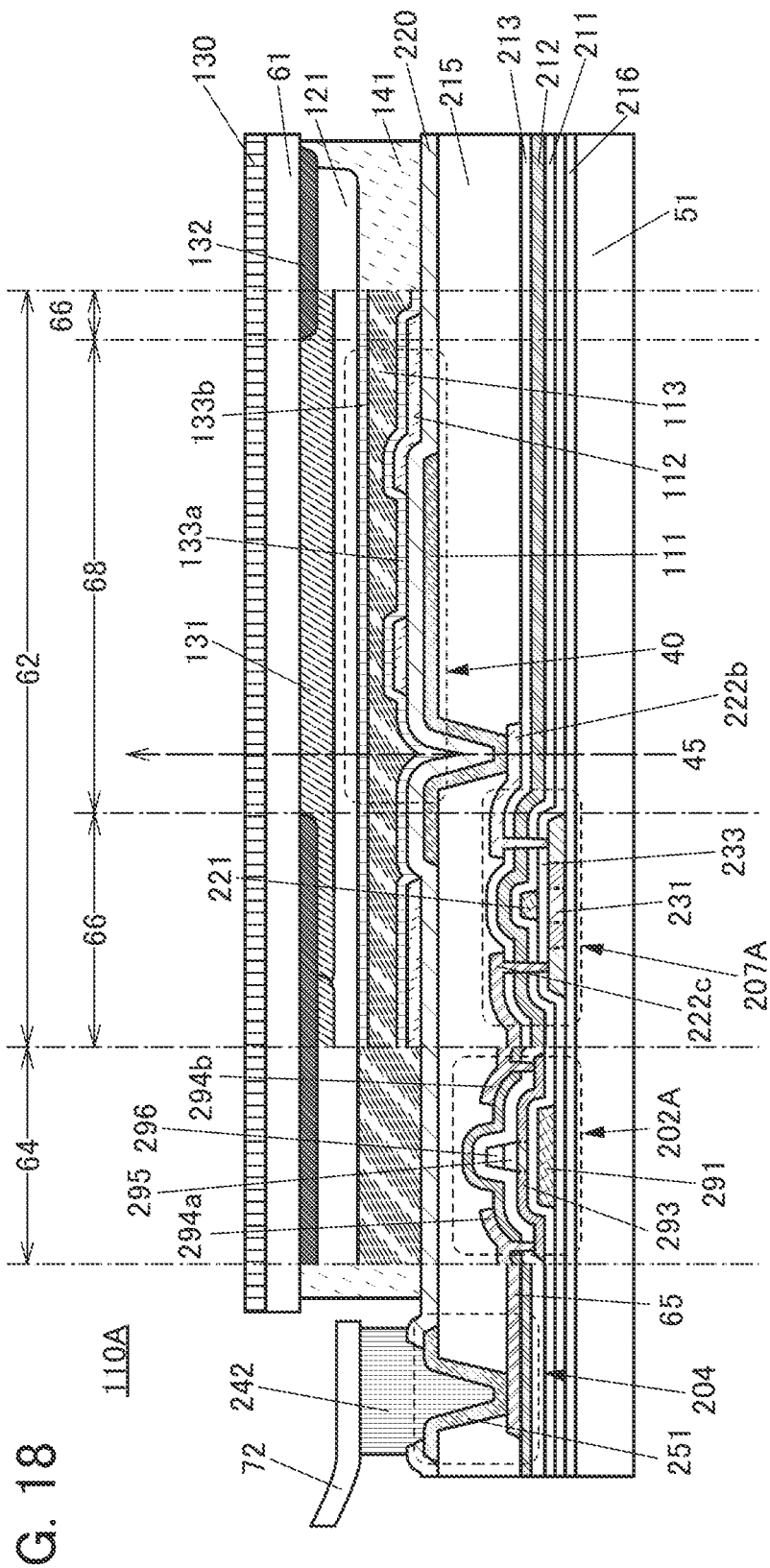
FIG. 18 is a cross-sectional view illustrating an example of a display device.

FIG. 18 shows a cross-sectional view of the display device 110A. It can be said that the display device 110A has a structure in which the transistor structure in the display portion 62 and the transistor structure in the driver circuit portion 64 in the display device 100D are switched. The structure in which the transistor structure in the display portion 62 and the transistor structure in the driver circuit portion 64 in a structure example of the display device of this embodiment are thus switched is also one embodiment of the present invention.

A transistor 202A and a transistor 207A included in the display device 110A can be manufactured with reference to the method for manufacturing the transistor 201D and the transistor 206D (FIG. 13).

Figure 19:
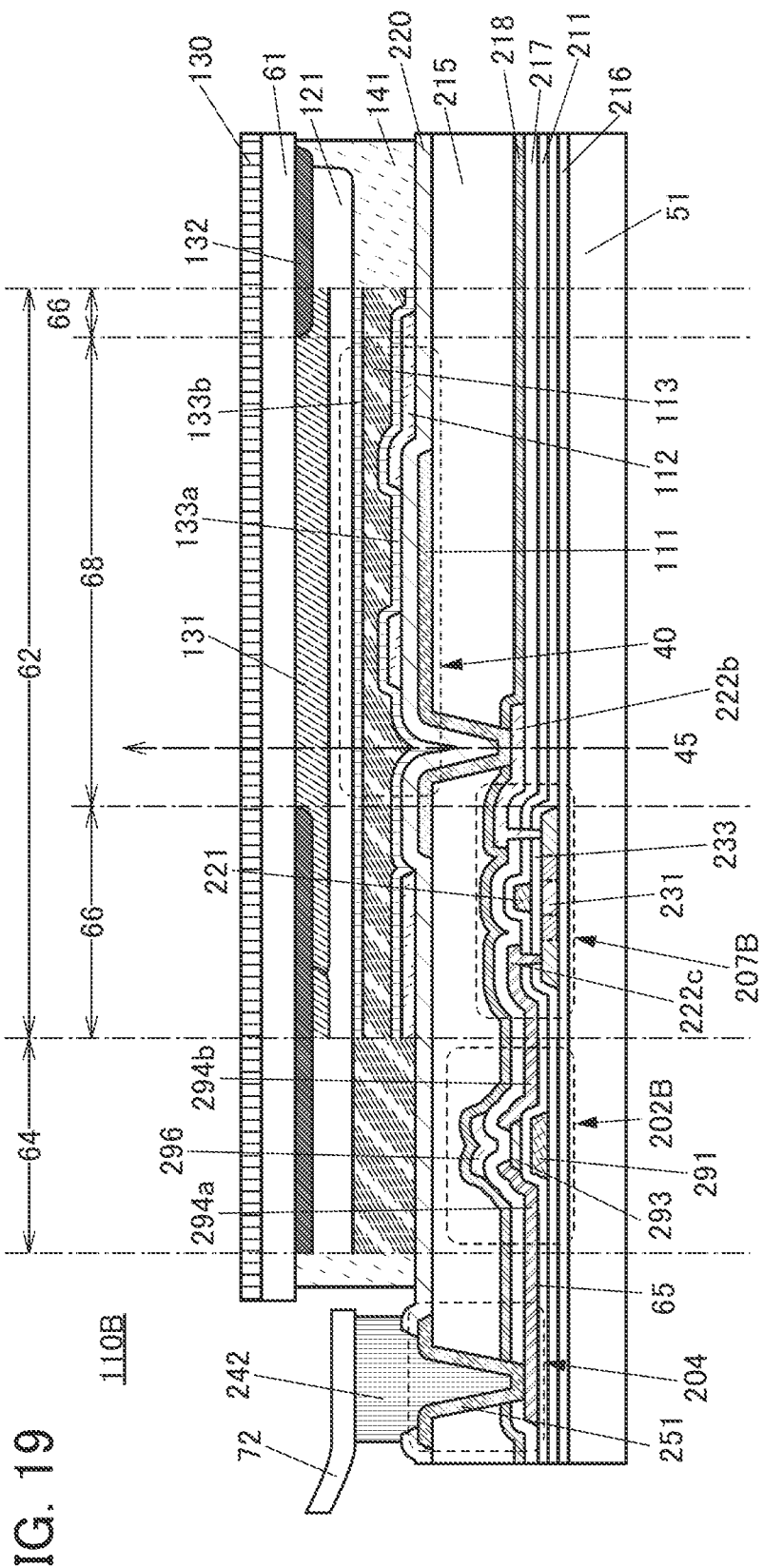
FIG. 19 is a cross-sectional view illustrating an example of a display device.

FIG. 19 shows a cross-sectional view of the display device 110B. It can be said that the display device 110B has a structure in which the transistor structure in the display portion 62 and the transistor structure in the driver circuit portion 64 in the display device 100C are switched.

The display device 110B includes a transistor 207B in the display portion 62. In addition, the display device 100C includes a transistor 202B in the driver circuit portion 64.

The transistor 207B includes a region transmitting visible light, and the region is included in the display region 68. The transistor 207B includes a region blocking visible light, and the region is included in the non-display region 66.

Meanwhile, the transistor 202B is provided in the driver circuit portion 64, and thus it does not matter whether a region transmitting visible light is included.

The transistor 207B includes the conductive layer 221, an insulating layer 233, the semiconductor layer 231, the conductive layer 222b, and the conductive layer 222c. The transistor 207B has a structure in which the conductive layer 294a or the conductive layer 294b in the structure of the transistor 201C is replaced with the conductive layer 222b.

The transistor 202B includes the conductive layer 291, the insulating layer 211, the semiconductor layer 293, the conductive layer 294a, the conductive layer 294b, the insulating layer 217, and the conductive layer 296. The transistor 202B has a structure in which the conductive layer 296 serving as a back gate is added to the transistor 206C.

Different materials are used for the semiconductor layers of the transistor 207B and the transistor 202B. Specifically, a metal oxide is used as the semiconductor layer 293 of the transistor 202B, and LTPS is used as the semiconductor layer 231 of the transistor 207B.

The conductive layer 222b and the conductive layer 296 can be formed using the same process and the same material. These conductive layers are preferably provided between the insulating layer 217 and the insulating layer 218. Here, it is preferable that an oxide semiconductor film be formed as the conductive layer 222b and the conductive layer 296 and an insulating film containing hydrogen (in particular, a nitride insulating film containing hydrogen) be formed as the insulating layer 218. Hydrogen contained in the insulating layer 218 is diffused to the conductive layer 222b and the conductive layer 296, which are in contact with the insulating layer 218, and the resistance of the conductive layer 222b and the conductive layer 296 is reduced. Thus, the conductive layer 222b and the conductive layer 296 can be made to be oxide conductive layers. The oxide conductive layers are conductive layers transmitting visible light. Thus, a connection portion between the pixel electrode 111 and the transistor can be provided in the display region 68. Accordingly, the aperture ratio of a subpixel can be increased. In addition, the power consumption of the display device can be reduced.

Figure 20:
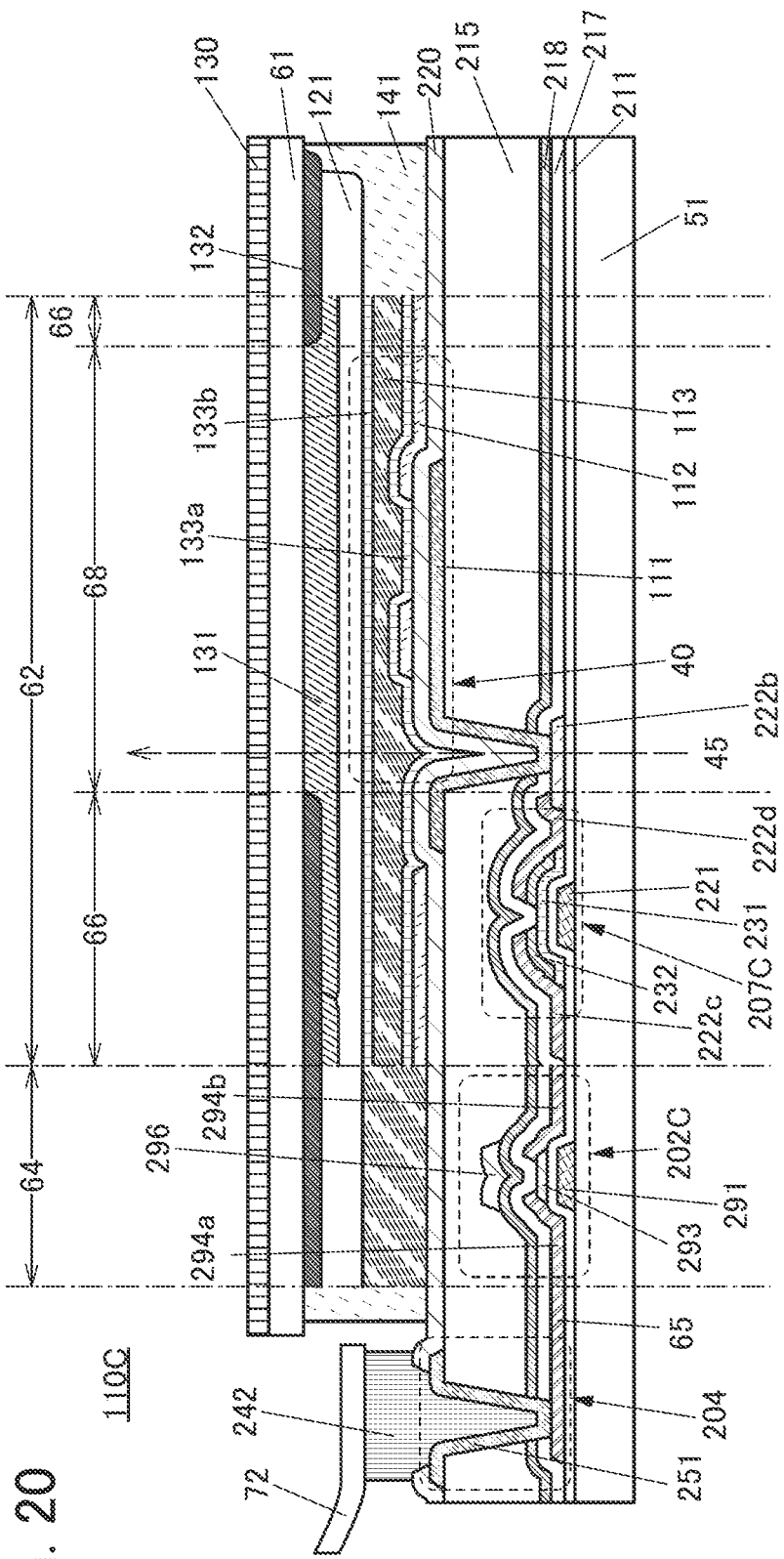
FIG. 20 is a cross-sectional view illustrating an example of a display device.

FIG. 20 shows a cross-sectional view of the display device 110C.

The display device 110C includes a transistor 207C in the display portion 62. The display device 110C also includes a transistor 202C in the driver circuit portion 64.

The transistor 207C includes the conductive layer 221, the insulating layer 211, the semiconductor layer 231, the impurity semiconductor layer 232, the conductive layer 222c, and a conductive layer 222d. The conductive layer 222d is electrically connected to the conductive layer 222b transmitting visible light.

The transistor 202C includes the conductive layer 291, the insulating layer 211, the semiconductor layer 293, the conductive layer 294a, the conductive layer 294b, the insulating layer 217, the insulating layer 218, and the conductive layer 296.

Different materials are used for the semiconductor layers of the transistor 202C and the transistor 207C. Specifically, a metal oxide is used for the transistor 202C, and amorphous silicon is used for the transistor 207C.

When a metal oxide is used for the transistor in the driver circuit portion 64, the field-effect mobility can be increased and the on-state current can be increased, compared with the case where amorphous silicon is used. Consequently, a circuit capable of high-speed operation can be manufactured. Furthermore, the area occupied by the driver circuit portion 64 can be reduced, whereby the display device can have a narrower frame.

The semiconductor layer 231 overlaps with the conductive layer 221 with the insulating layer 211 therebetween.

The semiconductor layer 231 contains amorphous silicon.

The semiconductor layer 293 overlaps with the conductive layer 291 with the insulating layer 211 therebetween. The semiconductor layer 293 overlaps with the conductive layer 296 with the insulating layer 217 and the insulating layer 218 therebetween. The semiconductor layer 293 includes a channel region between a pair of low-resistance regions. One of the low-resistance regions is electrically connected to the conductive layer 294a, and the other is electrically connected to the conductive layer 294b.

The semiconductor layer 293 contains a metal oxide.

The conductive layer 222c and the conductive layer 222d are electrically connected to the semiconductor layer 231 through the impurity semiconductor layer 232. One of the conductive layer 222c and the conductive layer 222d serves as a source, and the other serves as a drain. The conductive layer 222c preferably serves as a signal line. The conductive layer 222d is electrically connected to the pixel electrode 111 through the conductive layer 222b.

The conductive layer 222b is formed using a conductive material transmitting visible light. Thus, a connection portion between the pixel electrode 111 and the transistor can be provided in the display region 68. Accordingly, the aperture ratio of a subpixel can be increased. In addition, the power consumption of the display device can be reduced.

One of the conductive layer 294a and the conductive layer 294b serves as a source, and the other serves as a drain.

The conductive layer 221 and the conductive layer 296 serve as gates. The conductive layer 291 serves as a back gate.

The conductive layer 221, the conductive layer 291, the conductive layer 222c, the conductive layer 222d, the conductive layer 294a, and the conductive layer 294b are preferably formed using a conductive material with low resistivity. Each of the conductive layers is preferably formed using a conductive material with low resistivity, such as a metal or an alloy. The conductive layers may be formed using a conductive material blocking visible light.

The insulating layer 211, the insulating layer 217, and the insulating layer 218 serve as gate insulating layers.

For the insulating layer 217, the insulating layer 218, and the insulating layer 215, the above description of the display device 100C can be referred to.

Structure Example 8 of Display Device

Figure 21:
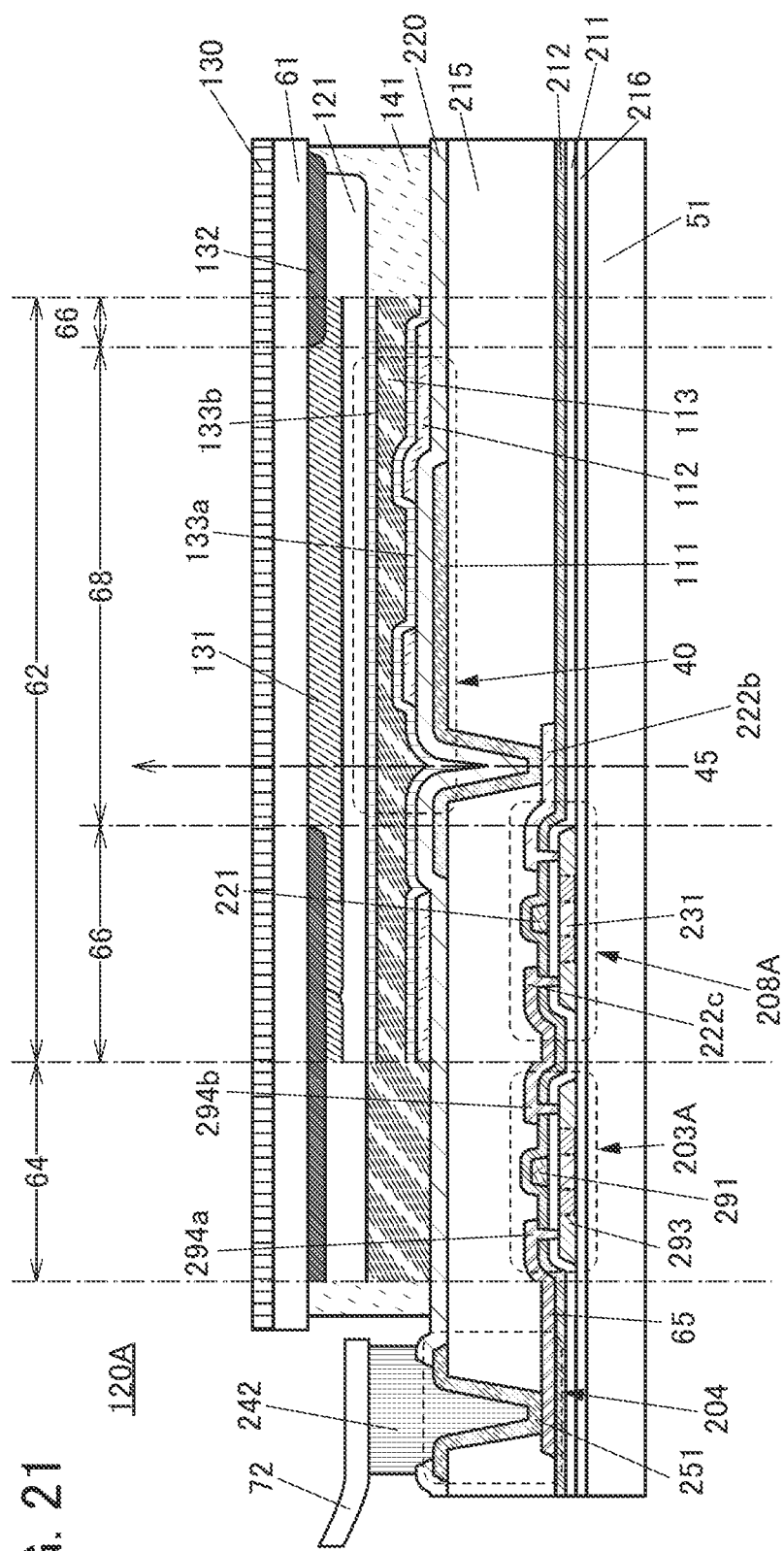
FIG. 21 is a cross-sectional view illustrating an example of a display device.
Figure 22:
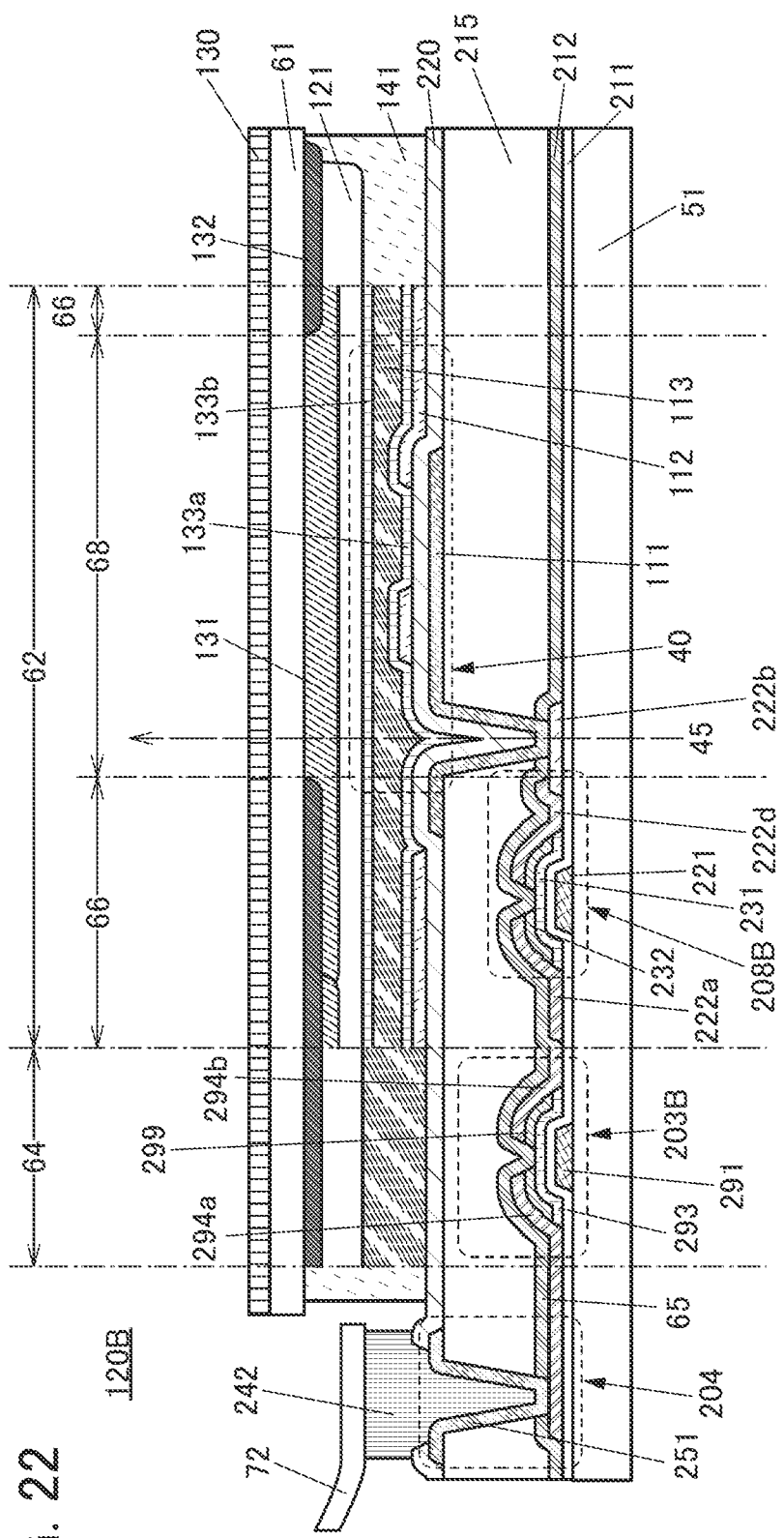
FIG. 22 is a cross-sectional view illustrating an example of a display device.

FIG. 21 shows a cross-sectional view of a display device 120A. FIG. 22 shows a cross-sectional view of a display device 120B.

The display device 120A illustrated in FIG. 21 has a structure in which transistors using LTPS are used in both the display portion 62 and the driver circuit portion 64. Specifically, LTPS is used as the semiconductor layer 293 and the semiconductor layer 231.

The conductive layer 222b included in the transistor 208A is electrically connected to the pixel electrode 111. The conductive layer 222b is formed using a material transmitting visible light. Thus, a connection portion between the conductive layer 222b and the pixel electrode 111 can be provided in the display region 68. Accordingly, the aperture ratio of a subpixel can be increased. In addition, the power consumption of the display device can be reduced.

The display device 120B illustrated in FIG. 22 has a structure in which transistors using amorphous silicon are used in both the display portion 62 and the driver circuit portion 64. Specifically, amorphous silicon is used as the semiconductor layer 293 and the semiconductor layer 231.

The conductive layer 222d included in the transistor 208B is electrically connected to the pixel electrode 111 through the conductive layer 222b. The conductive layer 222b is formed using a material transmitting visible light. Thus, a connection portion between the conductive layer 222b and the pixel electrode can be provided in the display region 68. Accordingly, the aperture ratio of the subpixel can be increased. In addition, the power consumption of the display device can be reduced.

Structure Example 9 of Display Device

One embodiment of the present invention can be applied to a display device in which a touch sensor is implemented (also referred to as an input/output device or a touch panel).

The structures of the display devices described above can be used for the touch panel. In this embodiment, an example will be mainly described in which a touch sensor is implemented in the display device 100A illustrated in FIG. 4.

There is no limitation on a sensor element included in the touch panel of one embodiment of the present invention. A variety of sensors that can sense proximity or touch of a sensing target such as a finger or a stylus can be used as the sensor element.

A variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel of one embodiment of the present invention can have a variety of structures, including a structure in which a display device and a sensor element that are separately formed are attached to each other and a structure in which electrodes and the like included in a sensor element are provided on one or both of a substrate supporting a display element and a counter substrate.

Figure 23A:
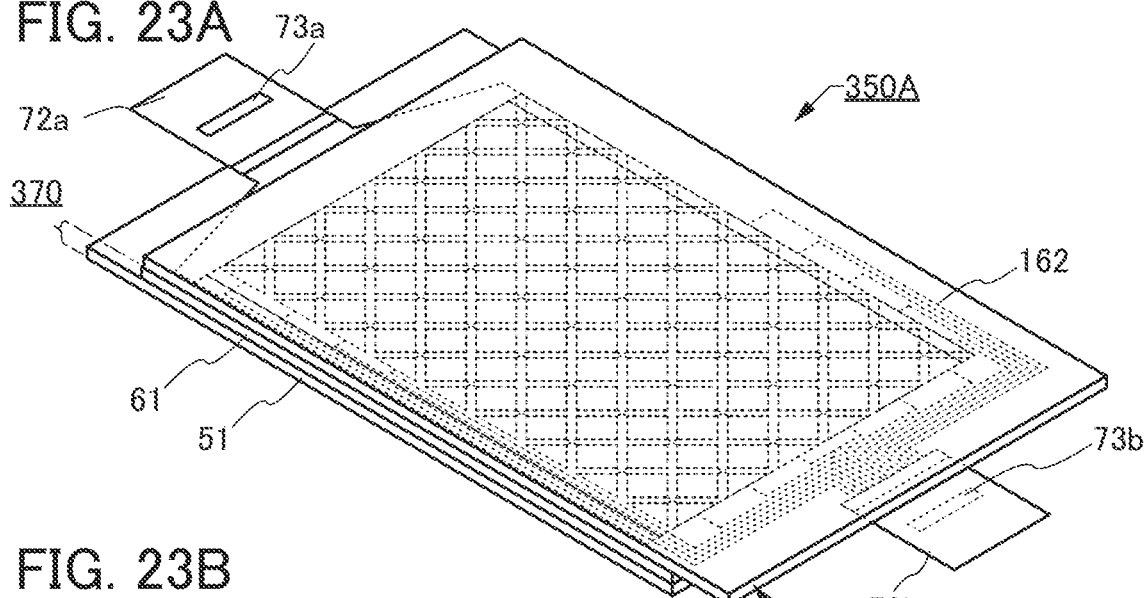
FIGS. 23A and 23B are perspective views illustrating an example of a display device.
Figure 23B:
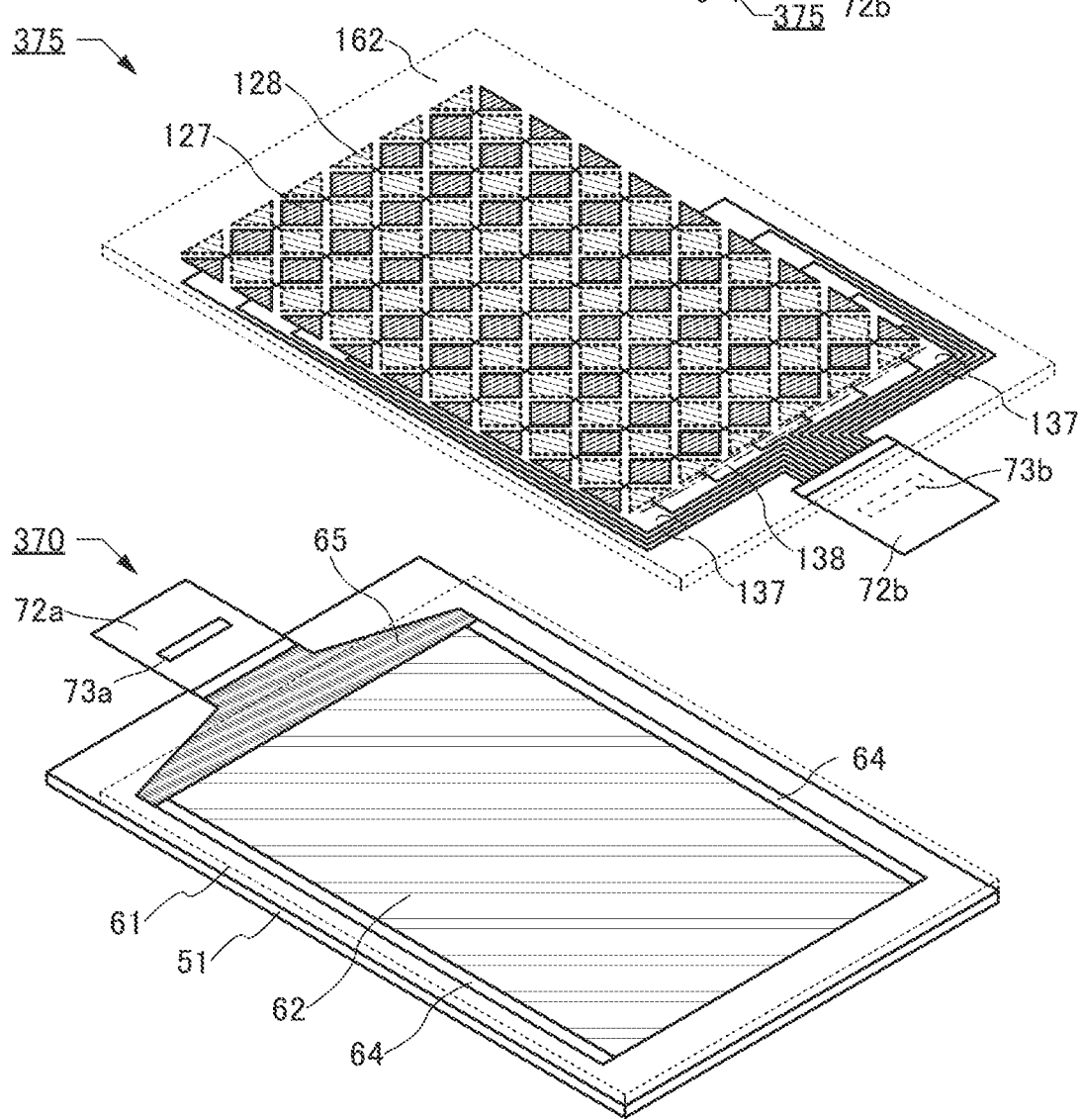
Figure 24:
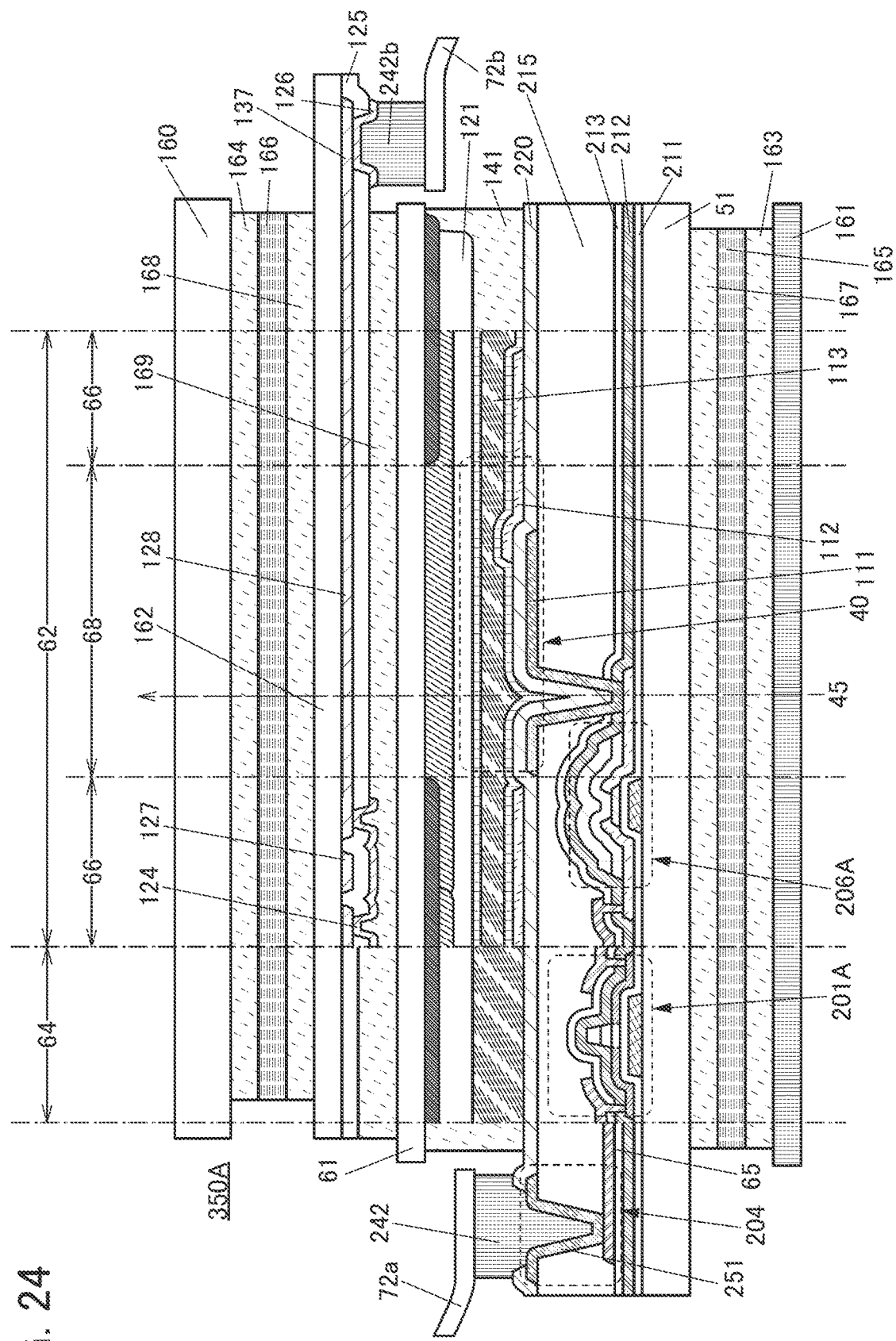
FIG. 24 is a cross-sectional view illustrating an example of a display device.

FIG. 23 and FIG. 24 illustrate an example of a touch panel. FIG. 23(A) is a perspective view of a touch panel 350A. FIG. 23(B) is a schematic perspective developed view of FIG. 23(A). Note that for simplicity, only typical components are illustrated. In FIG. 23(B), the outlines of the substrate 61 and a substrate 162 are only shown by dashed lines. FIG. 24 is a cross-sectional view of the touch panel 350A.

The touch panel 350A has a structure in which a display device and a sensor element that are separately formed are attached to each other.

The touch panel 350A includes an input device 375 and a display device 370 that are provided to overlap with each other.

The input device 375 includes the substrate 162, an electrode 127, an electrode 128, a plurality of wirings 137, and a plurality of wirings 138. An FPC 72b is electrically connected to each of the plurality of wirings 137 and the plurality of wirings 138. An IC 73b is provided on the FPC 72b.

The display device 370 includes the substrate 51 and the substrate 61 provided to face each other. The display device 370 includes the display portion 62 and the driver circuit portion 64. The wiring 65 and the like are provided over the substrate 51. An FPC 72a is electrically connected to the wiring 65. An IC 73a is provided on the FPC 72a.

The wiring 65 supplies signals and power to the display portion 62 and the driver circuit portion 64. The signals and power are input to the wiring 65 from the outside or the IC 73a, through the FPC 72a.

FIG. 24 is a cross-sectional view of the display portion 62, the driver circuit portion 64, a region that includes the FPC 72a, a region that includes the FPC 72b, and the like.

The substrate 51 and the substrate 61 are attached to each other with the adhesive layer 141. The substrate 61 and the substrate 162 are attached to each other with an adhesive layer 169. Here, the layers from the substrate 51 to the substrate 61 correspond to the display device 370. The layers from the substrate 162 to an electrode 124 correspond to the input device 375. That is, the adhesive layer 169 bonds the display device 370 and the input device 375 together.

The structure of the display device 370 illustrated in FIG. 24 is a structure similar to that of the display device 100A illustrated in FIG. 4; thus, the detailed description thereof is omitted.

A polarizer 165 is attached to the substrate 51 with an adhesive layer 167. A backlight 161 is attached to the polarizer 165 with the adhesive layer 163.

Examples of the backlight 161 include a direct-below backlight and an edge-light backlight. The use of the direct-below backlight with LEDs is preferable as it enables complex local dimming and an increase in contrast. The edge-light backlight is preferably used because the thickness of a module including the backlight can be reduced.

A polarizer 166 is attached to the substrate 162 with an adhesive layer 168. A protection substrate 160 is attached to the polarizer 166 with an adhesive layer 164. The protection substrate 160 may be used as the substrate that objects such as a finger or a stylus directly contact, when the touch panel 350A is incorporated into an electronic device. A substrate that can be used as the substrate 51 and the substrate 61 or the like can be used as the protection substrate 160. A structure where a protective layer is formed on the surface of the substrate that can be used as the substrate 51 and the substrate 61 or the like, or reinforced glass is preferably used for the protection substrate 160, for example. The protective layer can be formed with ceramic coating. The protective layer can be formed using an inorganic insulating material such as silicon oxide, aluminum oxide, yttrium oxide, or yttria-stabilized zirconia (YSZ).

The polarizer 166 may be provided between the input device 375 and the display device 370. In that case, the protection substrate 160, the adhesive layer 164, and the adhesive layer 168 that are illustrated in FIG. 24 are not necessarily provided. In other words, the substrate 162 can be positioned on the outermost surface of the touch panel 350A. The above material that can be used for the protection substrate 160 is preferably used for the substrate 162.

The electrode 127 and the electrode 128 are provided on the substrate 61 side of the substrate 162. The electrode 127 and the electrode 128 are formed on the same plane. An insulating layer 125 is provided to cover the electrode 127 and the electrode 128. The electrode 124 is electrically connected to two electrodes 128 between which the electrode 127 is positioned, through openings provided in the insulating layer 125.

For the conductive layers (e.g., the electrode 127 and the electrode 128) that overlap with the display region 68 among the conductive layers included in the input device 375, a material transmitting visible light is used.

The wiring 137 that is obtained by processing the same conductive layer as the electrode 127 and the electrode 128 is connected to a conductive layer 126 that is obtained by processing the same conductive layer as the electrode 124. The conductive layer 126 is electrically connected to the FPC 72b through a connector 242b.

Structure Example 10 of Display Device

FIG. 25 illustrates an example of a touch panel. FIG. 25(A) is a perspective view of a touch panel 350B. FIG. 25(B) is a schematic perspective developed view of FIG. 25(A). Note that for simplicity, only typical components are illustrated. In FIG. 25(B), the outlines of the substrate 61 are only shown by dashed lines.

The touch panel 350B is an in-cell touch panel that has a function of displaying an image and a function of a touch sensor.

The touch panel 350B has a structure in which electrodes and the like included in a sensor element are provided only on the counter substrate. Such a structure can make the touch panel thin and lightweight or reduce the number of components within the touch panel, compared with a structure in which the display device and the sensor element are fabricated separately and then are attached to each other.

In FIGS. 25(A) and (B), an input device 376 is provided on the substrate 61. The wiring 137 and the wiring 138 and the like of the input device 376 are electrically connected to the FPC 72 provided in a display device 379. Specifically, in a connection portion 63, one of the wirings 137 (or the wirings 138) and the conductive layer provided on the substrate 51 side are electrically connected to each other through a connector (e.g., conductive particles).

With such a structure, the FPC connected to the touch panel 350B can be provided only on one substrate side (here, on the substrate 51 side). Although two or more FPCs may be attached to the touch panel 350B, it is preferable that the touch panel 350B be provided with one FPC 72 and signals be supplied from the FPC 72 to both the display device 379 and the input device 376 as illustrated in FIGS. 25(A) and (B), for the simplicity of the structure.

The touch panel 350B is supplied with a signal for driving a pixel and a signal for driving a sensor element from one FPC. Thus, the touch panel 350B can easily be incorporated into an electronic device and allows a reduction in the number of components.

The IC 73 may have a function of driving the input device 376. Another IC that drives the input device 376 may be provided over the FPC 72. Alternatively, an IC that drives the input device 376 may be mounted on the substrate 51.

Structure Example 11 of Display Device

Figure 26A:
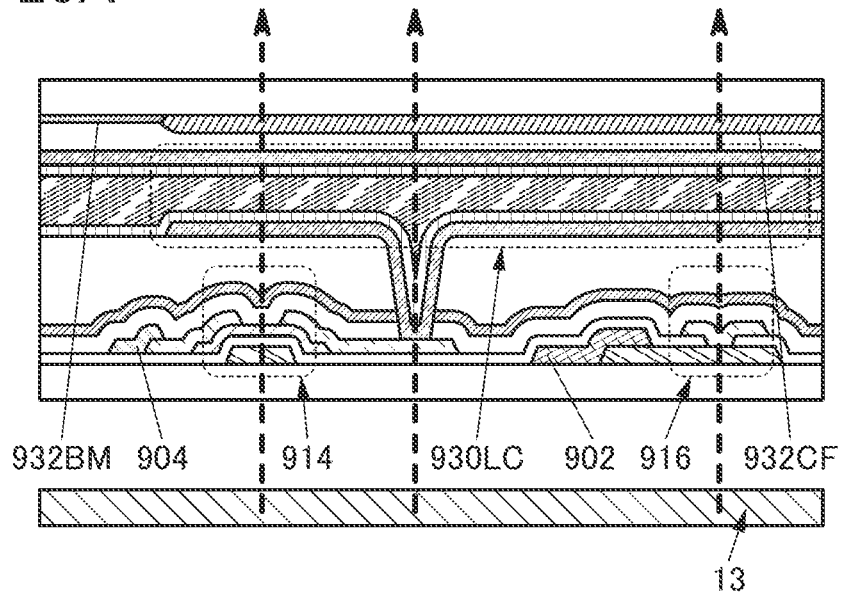
FIGS. 26A and 26B are cross-sectional views illustrating examples of display devices.

FIGS. 26(A) and (B) show cross-sectional views of examples of the pixel included in the display device of this embodiment. The cross-sectional views in FIGS. 26(A) and (B) can also be referred to as modification examples of the cross-sectional view in FIG. 2(B).

FIGS. 26(A) and (B) are examples of transmissive liquid crystal display devices. As illustrated in FIGS. 26(A) and (B), light is emitted from the backlight unit 13 in the direction shown by dashed arrows.

In FIGS. 26(A) and (B), light from the backlight unit 13 is extracted to the outside through the contact portion between the transistor 914 and the liquid crystal element 930LC, the transistor 914, a wiring contact portion 916, and the like.

FIG. 26(A) illustrates an example in which a gate electrode, a semiconductor layer, a source electrode, and a drain electrode of the transistor 914 have a visible-light-transmitting property. One of the source electrode and the drain electrode is electrically connected to the liquid crystal element 930LC, and the other is electrically connected to the wiring 904.

In FIG. 26(A), two conductive layers having a visible-light-transmitting property are connected to each other in the wiring contact portion 916. Specifically, a first conductive layer formed using the same process and the same material as those for the source electrode and the drain electrode and a second conductive layer formed using the same process and the same material as those for the gate electrode are connected to each other. In addition, the second conductive layer is connected to the wiring 902. Thus, the first conductive layer, the second conductive layer, and the wiring 902 can be electrically connected to each other. The wiring 902 and the wiring 904 are preferably formed using a conductive material with low resistivity. The wiring 902 and the wiring 904 may have a light-blocking property.

Figure 26B:
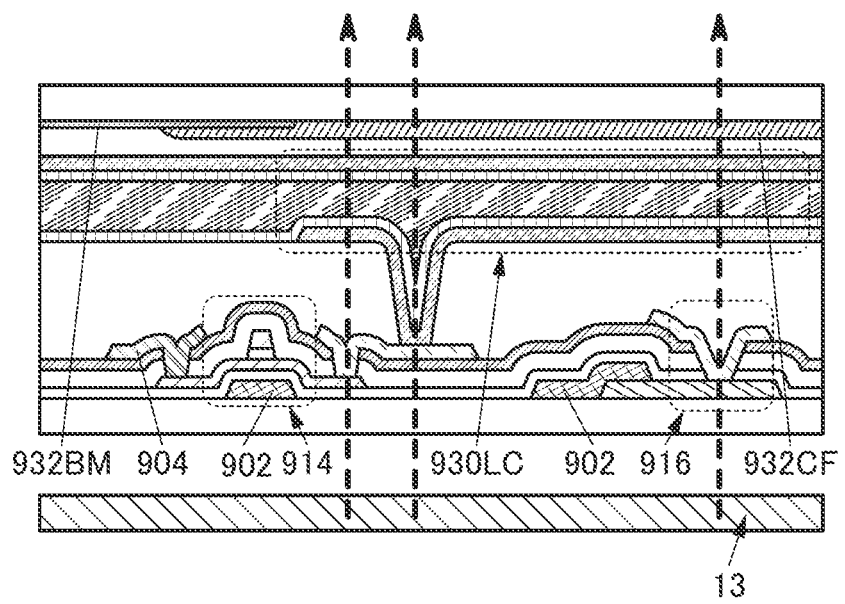

FIG. 26(B) illustrates an example in which a semiconductor layer of the transistor 914 and one of a source electrode and a drain electrode of the transistor 914 have a visible-light-transmitting property. The one of the source electrode and the drain electrode is electrically connected to the liquid crystal element 930LC.

In FIG. 26(B), the wiring 904 serves as the other of the source electrode and the drain electrode of the transistor 914. The wiring 902 serves as a gate of the transistor 914. The wirings are preferably formed using a conductive material with low resistivity. The wiring 902 and the wiring 904 may have a light-blocking property. The transistor 914 in FIG. 26(B) includes a back gate. The light-transmitting property of the back gate is not particularly limited.

In FIG. 26(B), two conductive layers having a visible-light-transmitting property are connected to each other in the wiring contact portion 916. Specifically, a first conductive layer formed using the same process and the same material as those for the one of the source electrode and the drain electrode and a second conductive layer are connected to each other. In addition, the second conductive layer is connected to the wiring 902. Thus, the first conductive layer, the second conductive layer, and the wiring 902 can be electrically connected to each other.

As the area of light-transmitting regions of the transistor 914, the wiring contact portion 916, and the like increases, light from the backlight unit 13 can be used more efficiently.

As described above, in the display device of this embodiment, the transistor in the display portion includes a visible-light-transmitting region. Thus, the aperture ratio of a pixel can be increased, resulting in higher light extraction efficiency. Therefore, the power consumption of the display device can be reduced.

In the display device of this embodiment, the transistor structure in the display portion is different from that in the driver circuit portion. In the manufacturing method for the display device, some of the manufacturing steps for the transistor in the driver circuit portion also serve as some of the manufacturing steps for the transistor in the display portion. Accordingly, the transistors with respective structures suitable for the display portion and the driver circuit can be employed while an increase in the number of manufacturing steps for the display device is inhibited. Therefore, the performance of the display device can be improved while the manufacturing cost is suppressed.

This embodiment can be combined with the other embodiments as appropriate. Moreover, in this specification, in the case where a plurality of structure examples are shown in one embodiment, the structure examples can be combined as appropriate.

Embodiment 2

In this embodiment, an operation mode which can be performed in the display device of one embodiment of the present invention will be described with reference to FIG. 27.

Note that a normal driving mode (Normal mode) with a normal frame frequency (typically, higher than or equal to 60 Hz and lower than or equal to 240 Hz) and an idling stop (IDS) driving mode with a low frame frequency will be described below as examples.

Note that the IDS driving mode refers to a driving method in which after image data is written, rewriting of image data is stopped. Increasing the interval between writing of image data and subsequent writing of image data can reduce the power that would be consumed by writing of image data in that interval. The IDS driving mode can be performed at a frame frequency which is approximately $1/100$ to $1/10$ of that of the normal driving mode, for example. Video signals for a still image are the same between consecutive frames. Thus, the IDS driving mode is particularly effective when a still image is displayed. When an image is displayed using IDS driving, power consumption is reduced, flickering (flicker) in an image area is suppressed, and eyestrain can be reduced.

Figure 27A:
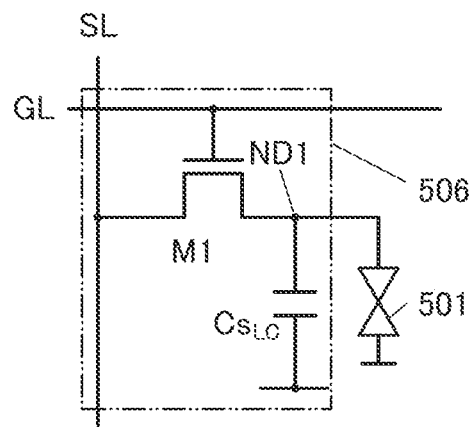
FIGS. 27A-27C are a circuit diagram illustrating an example of a pixel circuit and charts showing examples of operation modes.
Figure 27B:
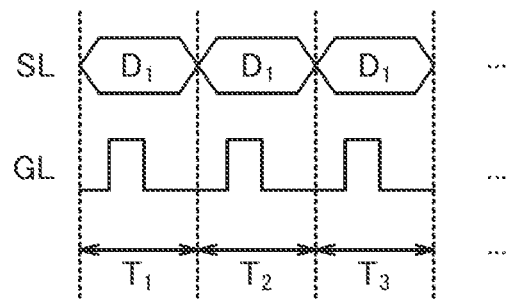
Figure 27C:
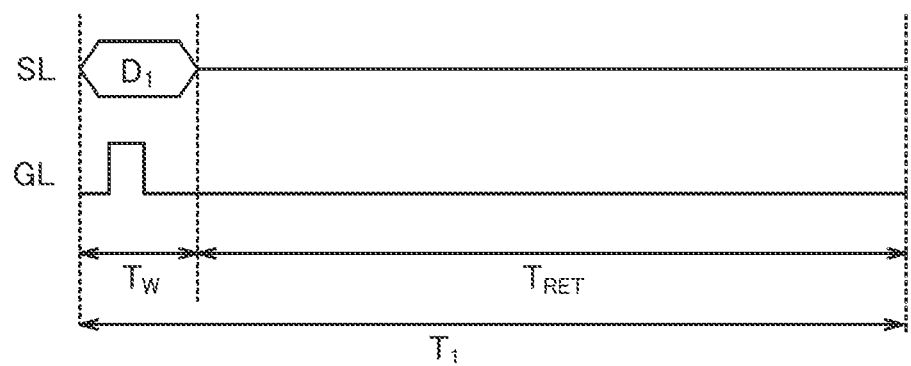

FIG. 27(A) to FIG. 27(C) are a pixel circuit and timing charts illustrating a normal driving mode and an IDS driving mode. Note that in FIG. 27(A), a first display element 501 (here, a reflective liquid crystal element) and a pixel circuit 506 electrically connected to the first display element 501 are illustrated. In the pixel circuit 506 illustrated in FIG. 27(A), a signal line SL, a gate line GL, a transistor M1 connected to the signal line SL and the gate line GL, and a capacitor $C_{SLC}$ connected to the transistor M1 are illustrated.

The transistor M1 can be a leakage path of data $D_1$. Thus, the off-state current of the transistor M1 is preferably as low as possible. A transistor including a metal oxide in a semiconductor layer in which a channel is formed is preferably used as the transistor M1. A metal oxide having at least one of an amplification function, a rectification function, and a switching function can be referred to for a metal oxide semiconductor or an oxide semiconductor, abbreviated as OS. As a typical example of a transistor, a transistor using an oxide semiconductor in a semiconductor layer in which a channel is formed (also referred to as an "OS transistor") will be described below. The OS transistor has a feature of an extremely low leakage current (off-state current) in an off state compared with a transistor using polycrystalline silicon or the like. When the OS transistor is used as the transistor M1, charge supplied to the node ND1 can be held for a long period.

Note that in the circuit diagram illustrated in FIG. 27(A), a liquid crystal element LC is a leakage path of the data $D_1$. Therefore, to perform IDS driving appropriately, the resistivity of the liquid crystal element LC is preferably higher than or equal to $1.0 \times 10^{14}$ $\Omega \times$cm.

Note that for example, an In—Ga—Zn oxide or an In—Zn oxide can be suitably used for a channel region of the above OS transistor. For the above In—Ga—Zn oxide, a composition of In:Ga:Zn=4:2:4.1 [atomic ratio] or a neighborhood thereof can typically be employed.

FIG. 27(B) is a timing chart showing the waveforms of signals supplied to the signal line SL and the gate line GL in the normal driving mode. In the normal driving mode, operation is performed at a normal frame frequency (e.g., 60 Hz). FIG. 27(B) shows periods $T_1$ to $T_3$. In each frame period, a scan signal is supplied to the gate line GL and the data $D_1$ is written from the signal line SL to the node ND1. This operation is performed both to write the same data $D_1$ in the periods $T_1$ to $T_3$ and to write different data in the periods $T_1$ to $T_3$.

Meanwhile, FIG. 27(C) is a timing chart showing the waveforms of signals supplied to the signal line SL and the gate line GL in the IDS driving mode. In the IDS driving, operation is performed at a low frame frequency (e.g., 1 Hz). One frame period is shown as a period $T_1$, wherein a data writing period is shown as $T_W$ and a data retention period is shown as a period $T_{RET}$. In the IDS driving mode, a scan signal is supplied to the gate line GL and the data $D_1$ of the signal line SL is written in the period $T_W$, the gate line GL is fixed to a low-level voltage in the period $T_{RET}$, and the transistor M1 is turned off so that the written data $D_1$ is retained. Note that the low frame frequency may be higher than or equal to 0.1 Hz and lower than 60 Hz, for example.

This embodiment can be combined with the other embodiments as appropriate.

Embodiment 3

Figure 28A:
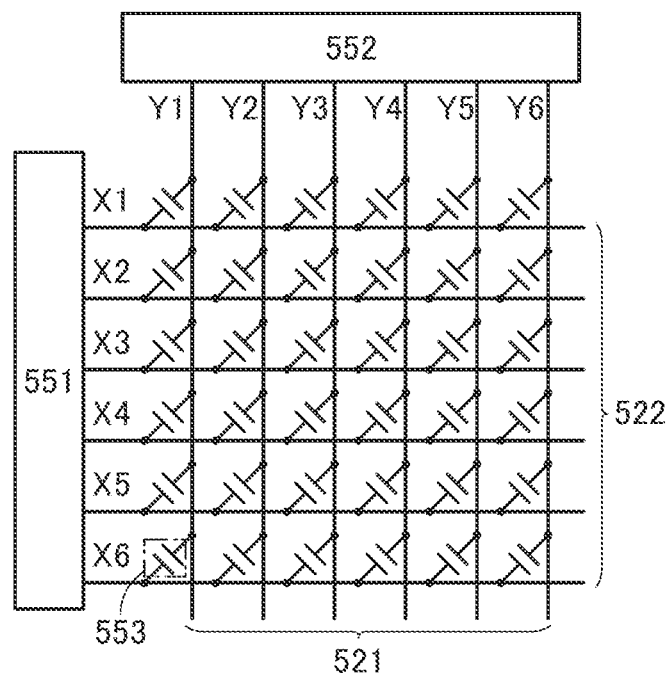
FIGS. 28A and 28B are a block diagram and a timing chart of a touch sensor.

In this embodiment, an example of a driving method of a touch sensor will be described with reference to drawings.
<Example of Sensing Method for Sensor>
FIG. 28(A) is a block diagram illustrating the configuration of a mutual capacitive touch sensor. FIG. 28(A) illustrates a pulse voltage output circuit 551 and a current sensing circuit 552. Note that in FIG. 28(A), six wirings X1 to X6 represent electrodes 521 to which a pulse voltage is applied, and six wirings Y1 to Y6 represent electrodes 522 that sense changes in current. FIG. 28(A) also illustrates a capacitor 553 that is formed where the electrode 521 and the electrode 522 overlap with each other. Note that functional replacement between the electrode 521 and the electrode 522 is possible.

The pulse voltage output circuit 551 is a circuit for sequentially applying a pulse voltage to the wirings X1 to X6. By application of a pulse voltage to the wirings X1 to X6, an electric field is generated between the electrode 521 and the electrode 522 constituting the capacitor 553. The approach or contact of a sensing target can be sensed by utilizing a change caused in mutual capacitance in the capacitor 553 when the electric field generated between the electrodes is blocked, for example.

The current sensing circuit 552 is a circuit for sensing changes in current through the wirings Y1 to Y6 that are due to the change in mutual capacitance in the capacitor 553. No change in current value is sensed by the wirings Y1 to Y6 when there is no approach or contact of a sensing target, whereas a change of a decrease in current value is sensed when mutual capacitance is decreased owing to the approach or contact of a sensing target. Note that an integrator circuit or the like is used for sensing of current.

Note that one or both of the pulse voltage output circuit 551 and the current sensing circuit 552 may be formed over the substrate 51 or the substrate 61 that is shown in FIG. 4 or the like. For example, it is preferable to form one or both of the pulse voltage output circuit 551 and the current sensing circuit 552 at the same time as the display portion 62, the driver circuit portion 64, and the like because the process can be simplified and the number of components used to drive the touch sensor can be reduced. One or both of the pulse voltage output circuit 551 and the current sensing circuit 552 may be mounted on the IC 73.

In particular, in the case of using crystalline silicon such as polycrystalline silicon or single crystal silicon for the semiconductor layer where a channel is formed in the transistor formed over the substrate 51, the driving performance of a circuit such as the pulse voltage output circuit 551 or the current sensing circuit 552 is improved and the sensitivity of the touch sensor can be thus increased.

Figure 28B:
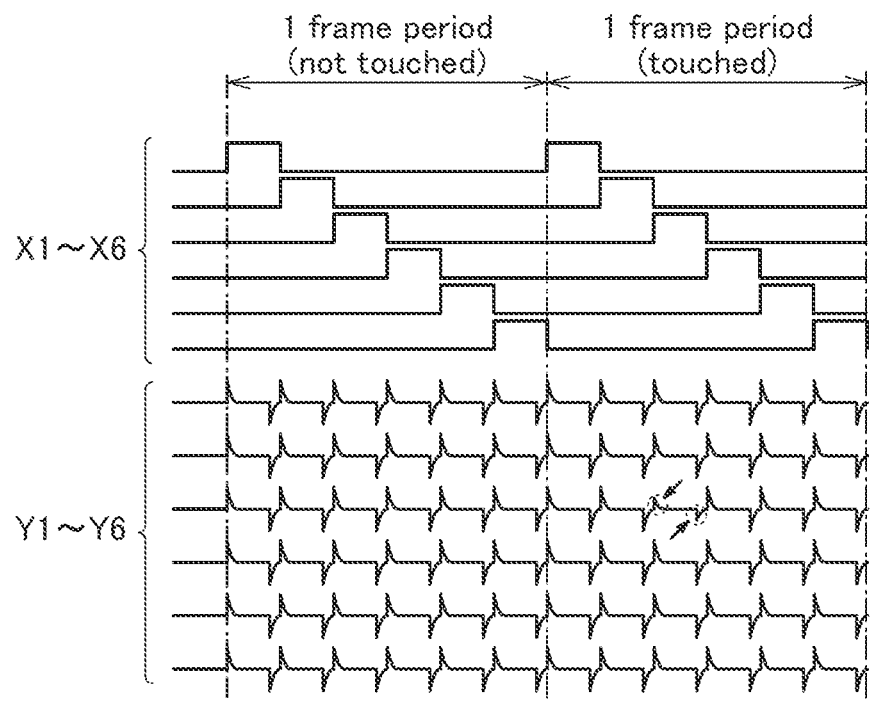

FIG. 28(B) shows a timing chart of input and output waveforms in the mutual capacitive touch sensor illustrated in FIG. 28(A). In FIG. 28(B), sensing of a sensing target is performed in all the rows and columns in one frame period. FIG. 28(B) shows two cases: a case where a sensing target is not sensed (not touched) and a case where a sensing target is sensed (touched). Note that the waveforms of voltage values corresponding to sensed current values of the wirings Y1 to Y6 are shown.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

Figure 29A:
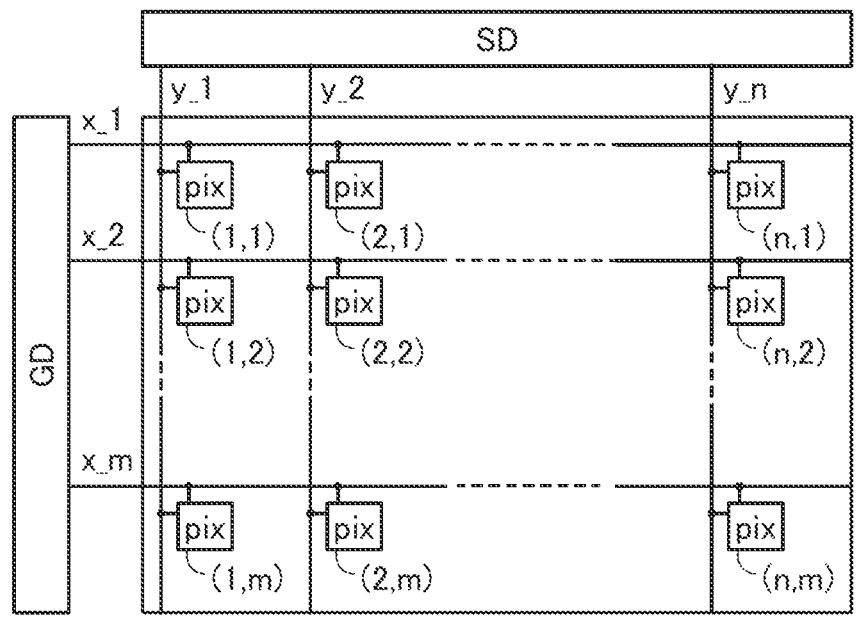
FIGS. 29A and 29B are a block diagram and a timing chart of a display device.

By sensing a change in mutual capacitance in this manner, the approach or contact of a sensing target can be sensed.
<Example of driving Method of Display Device>
FIG. 29(A) is a block diagram illustrating a configuration example of a display device. FIG. 29(A) illustrates a gate driver circuit GD (scan line driver circuit), a source driver circuit SD (signal line driver circuit), and a display portion including a plurality of pixels pix. Note that in FIG. 29(A), the pixels pix are denoted by (1, 1) to (n, m), corresponding to gate lines x_1 to x_m (m is a natural number) electrically connected to the gate driver circuit GD and source lines y_1 to y_n (n is a natural number) electrically connected to the source driver circuit SD.

Figure 29B:
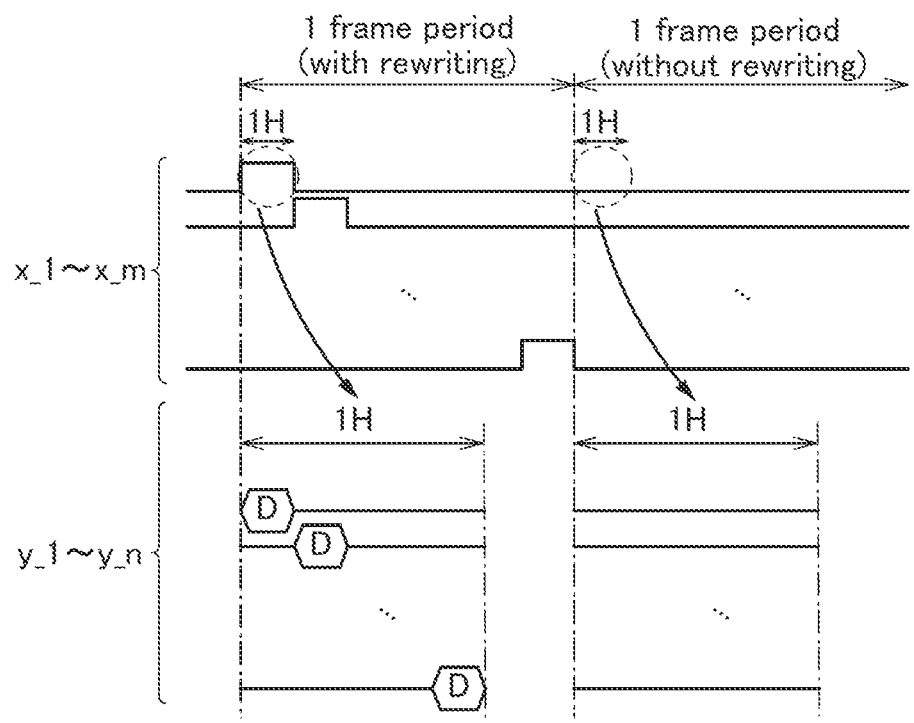

FIG. 29(B) is a timing chart of signals supplied to the gate lines and the source lines in the display device shown in FIG. 29(A). In FIG. 29(B), the case where data signals are rewritten every frame period and the case where data signals are not rewritten are separately shown. Note that periods such as a retrace period are not taken into consideration in FIG. 29(B).

In the case where data signals are rewritten every frame period, scan signals are sequentially supplied to the gate lines x_1 to x_m. In a horizontal scanning period 1H, during which the scan signal is at an H level, data signals D are supplied to the source lines y_1 to y_n in the columns.

In the case where data signals are not rewritten every frame period, supply of scan signals to the gate lines x_1 to x_m is stopped. In the horizontal scanning period 1H, supply of data signals to the source lines y_1 to y_n in the columns is stopped.

A driving method in which data signals are not rewritten every frame period is effective particularly when an oxide semiconductor is used for the semiconductor layer where a channel is formed in the transistor included in the pixel pix. A transistor using an oxide semiconductor can have a much lower off-state current than a transistor using a semiconductor such as silicon. Thus, a data signal written in the previous period can be held without rewriting data signals every frame period, and the gray levels of pixels can be held for 1 second or longer, preferably 5 seconds or longer, for example.

In the case where polycrystalline silicon or the like is used for a semiconductor layer where a channel is formed in a transistor included in the pixel pix, the storage capacitance of the pixel is preferably increased in advance. The larger the storage capacitance is, the longer the gray level of the pixel can be held. The storage capacitance may be set depending on leakage current of a transistor or a display element which is electrically connected to the storage capacitor. For example, the storage capacitance per pixel is set to 5 fF to 5 pF inclusive, preferably 10 fF to 5 pF inclusive, more preferably 20 fF to 1 pF inclusive, so that a data signal written in the previous period can be held without rewriting data signals every frame period. For example, the gray level of a pixel can be held for several frame periods or several tens of frame periods.

<Example of Driving Method of Display Portion and Touch Sensor>

Figure 30A:
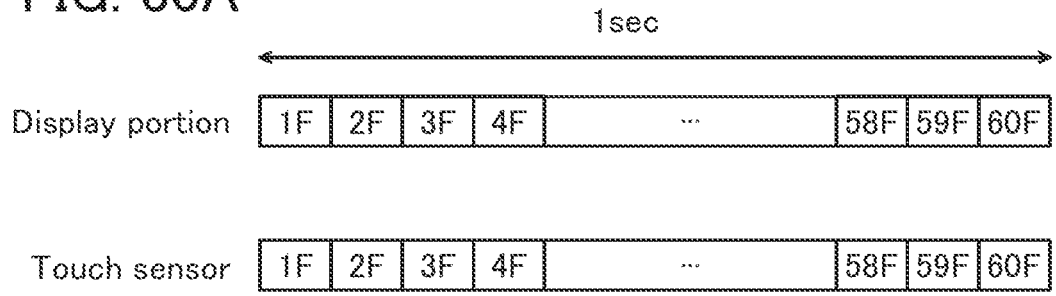
FIGS. 30A-30D are charts for explaining the operations of a display device and a touch sensor.

FIGS. 30(A) to (D) are diagrams illustrating, as examples, the operations of the touch sensor described with reference to FIGS. 28(A) and (B) and the display portion described with reference to FIGS. 29(A) and (B) in successive frame periods when they are driven for 1 sec (one second). Note that FIG. 30(A) illustrates the case where one frame period for the display portion is 16.7 ms (frame frequency: 60 Hz), and one frame period for the touch sensor is 16.7 ms (frame frequency: 60 Hz). In FIG. 30 and FIG. 31, 1F, 2F, ... each denote a frame of the display portion or the touch sensor.

Figure 30B:
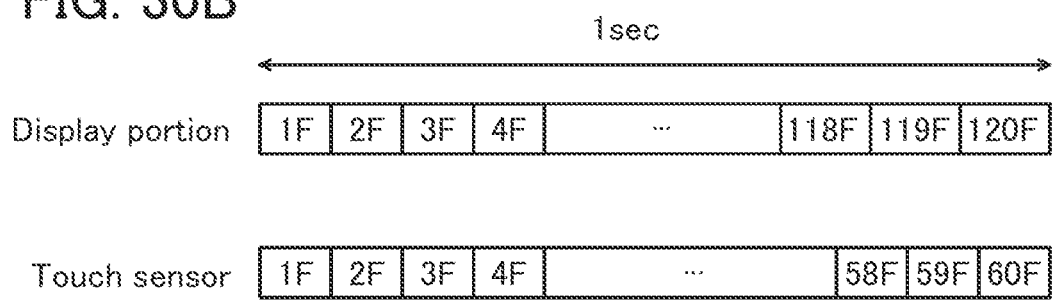

In the display device of one embodiment of the present invention, the display portion and the touch sensor operate independently of each other, and a touch sensing period concurrent with a display period can be provided. That is why one frame period for the display portion and one frame period for the touch sensor can be both set to 16.7 ms (frame frequency: 60 Hz) as shown in FIG. 30(A). The frame frequency for the touch sensor may differ from that of the display portion. For example, as shown in FIG. 30(B), one frame period for the display portion can be set to 8.3 ms (frame frequency: 120 Hz) and one frame period for the touch sensor can be set to 16.7 ms (frame frequency: 60 Hz). Although not shown, the frame frequency for the display portion may be set to 33.3 ms (frame frequency: 30 Hz).

The frame frequency for the display portion can be changeable; the frame frequency in displaying moving images may be increased (e.g., 60 Hz or more, or 120 Hz or more) and the frame frequency in displaying still images may be decreased (e.g., 60 Hz or less, 30 Hz or less, or 1 Hz or less), so that the power consumption of the display device can be reduced. The frame frequency for the touch sensor may be changeable, and the frame frequency in waiting may differ from the frame frequency in sensing a touch.

Figure 30C:
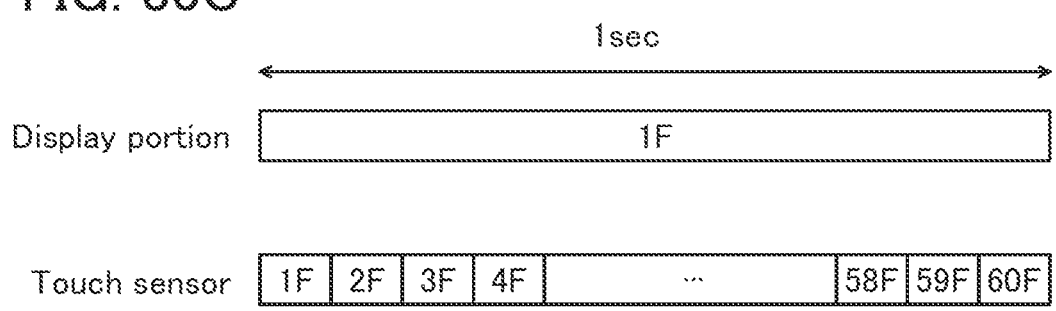

Moreover, in the display device of one embodiment of the present invention, a data signal rewritten in the previous period is held without rewriting data signals in the display portion, in that case one frame period of the display portion can be longer than 16.7 ms. Thus, as shown in FIG. 30(C), one frame period for the display portion can be set to 1 sec. (frame frequency: 1 Hz) and one frame period for the touch sensor can be set to 16.7 ms (frame frequency: 60 Hz).

Note that for the structure in which data signals are not rewritten in the display portion and a data signal rewritten in the previous period is held, the above-described IDS driving mode can be referred to. As the IDS driving mode, a partial IDS driving mode may be employed in which data signals are rewritten only in a specific region of the display portion. The partial IDS driving mode is a structure in which data signals are rewritten only in a specific region of the display portion and a data signal rewritten in the previous period is held in the other region.

Figure 30D:
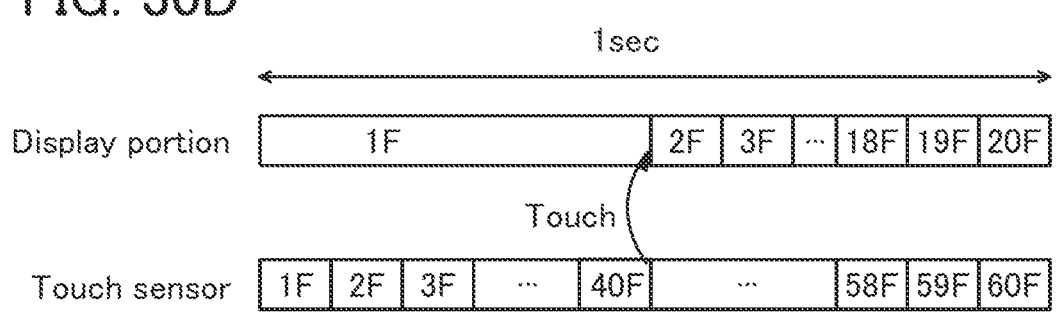

Furthermore, by the driving method of a touch sensor that is disclosed in this embodiment, the touch sensor can be continuously driven in the case where operation is performed as shown in FIG. 30(C). Thus, data signals in the display portion can be rewritten at the timing when the approach or contact of a sensing target is sensed by the touch sensor, as shown in FIG. 30(D).

If rewriting of data signals in a display portion is performed during a sensing period of a touch sensor, noise caused by rewriting of the data signals travels through the touch sensor and the sensitivity of the touch sensor might decrease. For this reason, operation is preferably performed such that the period of rewriting data signals in the display portion and a sensing period of the touch sensor do not overlap with each other.

Figure 31A:
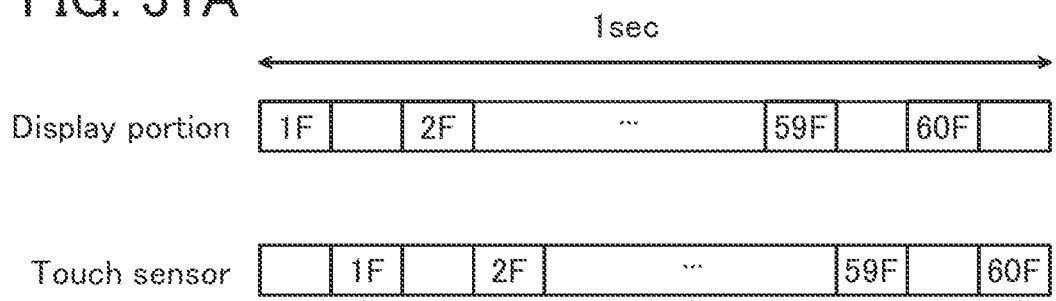
FIGS. 31A-31D are charts for explaining the operations of a display device and a touch sensor.
Figure 31B:
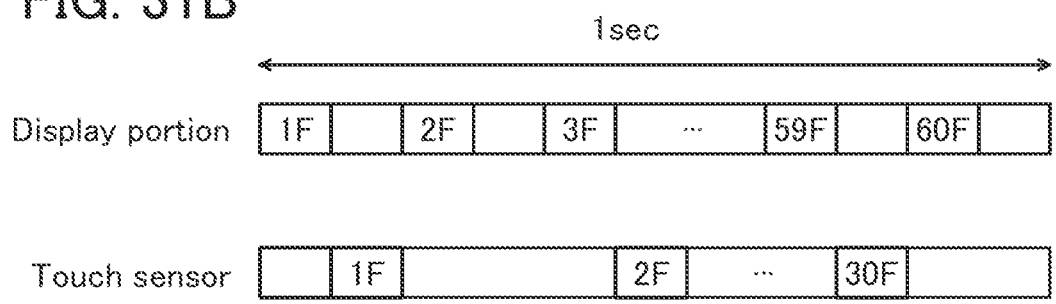

FIG. 31(A) shows an example in which rewriting of data signals in the display portion and sensing by the touch sensor are performed alternately. FIG. 31(B) shows an example in which sensing by the touch sensor is performed once every two rewritings of data signals in the display portion. Note that sensing by the touch sensor is not limited to this example and may be performed once every three or more rewritings.

In the case where an oxide semiconductor is used in a semiconductor layer where a channel is formed in the transistor used in the pixel pix, the off-state current can be significantly reduced and the frequency of rewriting data signals can be sufficiently reduced. Specifically, a sufficiently long break period can be set between rewriting of data signals and next rewriting of data signals. The break period can be 0.5 seconds or longer, 1 second or longer, or 5 seconds or longer, for example. The upper limit of the break period depends on the leakage current of a capacitor or a display element connected to the transistor; for example, 1 minute or shorter, 10 minutes or shorter, 1 hour or shorter, or 1 day or shorter.

In the case where LTPS or amorphous silicon is used for a semiconductor layer where a channel is formed in the transistor used in the pixel pix, a configuration may be employed in which a node where a data signal of a pixel is provided with an SRAM and the data signal is held in the node. With the configuration, the frequency of rewriting data signals can be sufficiently reduced. Note that the frequency of rewriting data signals can be equivalent to that of the case where an oxide semiconductor is used for the semiconductor layer.

Figure 31C:
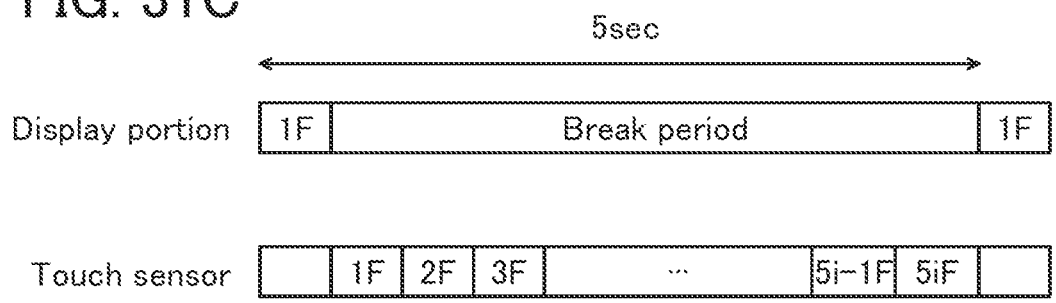
Figure 31D:
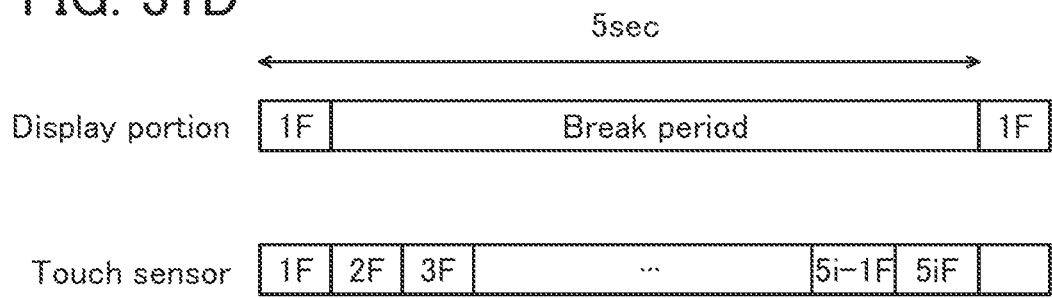

FIG. 31(C) shows an example in which rewriting of data signals in the display portion is performed once every 5 seconds. In FIG. 31(C), a break period for stopping the rewriting operation of the display portion is set between rewriting of data signals and next rewriting of data signals. In the break period, a touch sensor can be operated at a frame frequency of i Hz (i is more than or equal to the frame frequency of the display device; here, 0.2 Hz or more). Preferably, sensing by the touch sensor is performed in a break period 5i times and is not performed in a rewriting period of data signals in the display portion as shown in FIG. 31(C), so that the sensitivity of the touch sensor can be increased. When rewriting of data signals in the display portion and sensing by the touch sensor are performed at the same time as shown in FIG. 31(D), signals for operation can be simplified.

In a break period during which rewriting of data signals in the display portion is not performed, not only the supply of data signals to the display portion but also the operation of one or both of the gate driver circuit GD and the source driver circuit SD may be stopped. The supply of power to one or both of the gate driver circuit GD and the source driver circuit SD may also be stopped. Thus, noise is further reduced, and the sensitivity of the touch sensor can be further increased. Moreover, the power consumption of the display device can be further reduced.

The display device of one embodiment of the present invention includes a display portion and a touch sensor between two substrates. Thus, the distance between the display portion and the touch sensor can be significantly reduced. At this time, noise is easily transmitted to the touch sensor in driving the display portion, which might reduce the sensitivity of the touch sensor. When the driving method exemplified in this embodiment is employed, a display device including a touch sensor, which has both reduced thickness and high sensitivity, can be obtained.

This embodiment can be combined with the other embodiments as appropriate.

Embodiment 4

Described in this embodiment is a metal oxide that can be used for a semiconductor layer of a transistor disclosed in one embodiment of the present invention. Note that in the case where a metal oxide is used for a semiconductor layer of a transistor, the metal oxide may be rephrased as an oxide semiconductor.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

The aforementioned non-single-crystal oxide semiconductor or CAC-OS can be suitably used for a semiconductor layer of a transistor disclosed in one embodiment of the present invention. As the non-single-crystal oxide semiconductor, an nc-OS or a CAAC-OS can be suitably used.

In one embodiment of the present invention, a CAC-OS is preferably used for a semiconductor layer of a transistor. The use of the CAC-OS allows the transistor to have high electrical characteristics or high reliability.

The CAC-OS will be described in detail below.

A CAC-OS or a CAC-metal oxide has a conducting function in a part of the material and has an insulating function in a part of the material; as a whole, the CAC-OS or the CAC-metal oxide has a function of a semiconductor. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions containing the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium. It is particularly preferable that a metal oxide contain indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked structure of two or more kinds of films with different compositions. For example, a two-layer structure of a film containing In as a main component and a film containing Ga as a main component is not included.

Note that a clear boundary cannot sometimes be observed between the region containing $GaO_{X3}$ as a main component and the region containing $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the flow rate ratio of the oxygen gas is higher than or equal to 0% and lower than 30%, preferably higher than or equal to 0% and lower than or equal to 10%.

A feature of the CAC-OS is that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, a ring-like high-luminance region and a plurality of bright spots in the ring region are observed in an electron diffraction pattern of the CAC-OS which is obtained by irradiation with an electron beam with a probe diameter of 1 nm (also referred to as a nanobeam electron beam). It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions containing $GaO_{X3}$ as a main component and regions containing $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions containing $GaO_{X3}$ or the like as a main component and regions containing $In_{X2}Zn_{Y2}O_{Z2}$ or $InO_{X1}$ as a main component are phase-separated from each other and form a mosaic pattern.

Here, a region containing $In_{X2}Zn_{Y2}O_{Z2}$ or $InO_{X1}$ as a main component is a region whose conductivity is higher than that of a region containing $GaO_{X3}$ or the like as a main component. In other words, when carriers flow through the regions containing $In_{X2}Zn_{Y2}O_{Z2}$ or $InO_{X1}$ as a main component, the conductivity of an oxide semiconductor is exhibited. Accordingly, when the regions containing $In_{X2}Zn_{Y2}O_{Z2}$ or $InO_{X1}$ as a main component are distributed like a cloud in an oxide semiconductor, high field-effect mobility (μ) can be achieved.

In contrast, a region containing $GaO_{X3}$ or the like as a main component is a region whose insulating property is higher than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is most suitable for a variety of semiconductor devices such as displays.

This embodiment can be combined with the other embodiments as appropriate.

Embodiment 5

In this embodiment, electronic devices of embodiments of the present invention will be described.

Examples of electronic devices include a television set, a desktop or notebook personal computer, a monitor for a computer or the like, a digital camera, a digital video camera, a digital photo frame, a mobile phone, a portable game machine, a portable information terminal, an audio reproducing device, and a large game machine such as a pachinko machine.

Figure 32A:
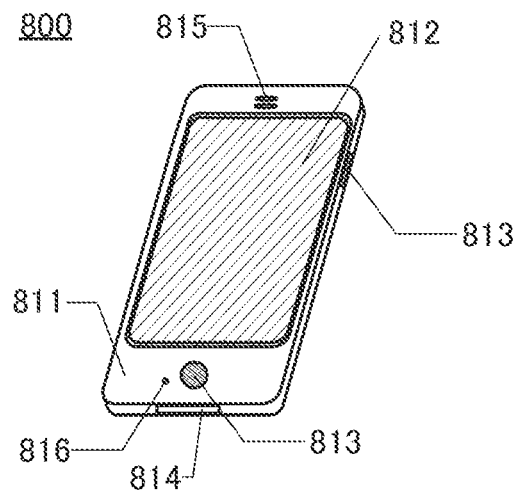
FIGS. 32A-32C are drawings illustrating examples of electronic devices.
Figure 32B:
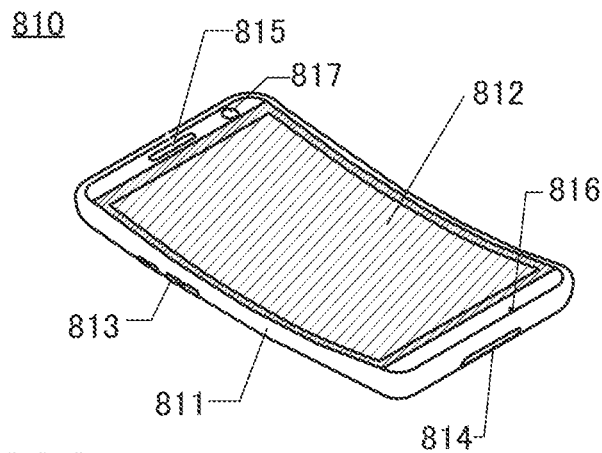
Figure 32C:
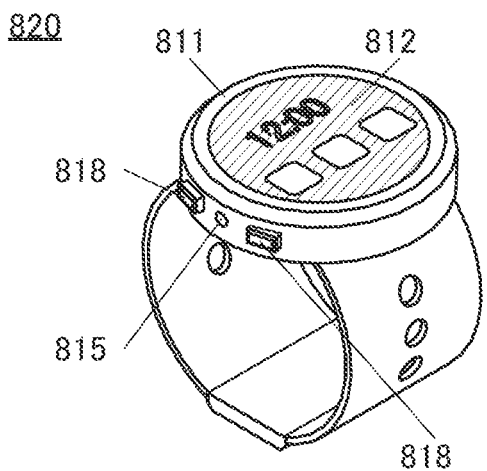

FIGS. 32(A) to (C) illustrate portable information terminals. The portable information terminals in this embodiment each have one or more functions selected from, for example, a telephone set, a notebook, an information browsing system, and the like. Specifically, the portable information terminals in this embodiment can each be used as a smartphone or a smart watch. The portable information terminals in this embodiment are capable of executing a variety of applications such as mobile phone calls, e-mailing, text reading and editing, music replay, video replay, Internet communication, and a game, for example.

The portable information terminals illustrated in FIGS. 32(A) to (C) can have a variety of functions; they can have, for example, a function of displaying a variety of data (a still image, a moving image, a text image, and the like) on the display portion, a touch panel function, a function of displaying a calendar, date, time, and the like, a function of controlling a process with a variety of types of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the functions of the portable information terminals illustrated in FIGS. 32(A) to (C) are not limited to these functions, and the portable information terminals may have other functions.

The portable information terminals illustrated in FIGS. 32(A) to (C) are capable of executing a variety of applications such as mobile phone calls, e-mailing, text reading and editing, music replay, Internet communication, and a computer game. The portable information terminals illustrated in FIGS. 32(A) to (C) can perform near field communication conformable to a communication standard. For example, mutual communication between a watch-type portable information terminal 820 illustrated in FIG. 32(C) and a headset capable of wireless communication is performed, whereby hands-free calling is possible.

A portable information terminal 800 illustrated in FIG. 32(A) includes a housing 811, a display portion 812, operation buttons 813, an external connection port 814, a speaker 815, a microphone 816, and the like. The display portion 812 of the portable information terminal 800 has a flat surface.

A portable information terminal 810 illustrated in FIG. 32(B) includes the housing 811, the display portion 812, the operation buttons 813, the external connection port 814, the speaker 815, the microphone 816, a camera 817, and the like. The display portion 812 of the portable information terminal 810 has a curved surface.

Figure 33A:
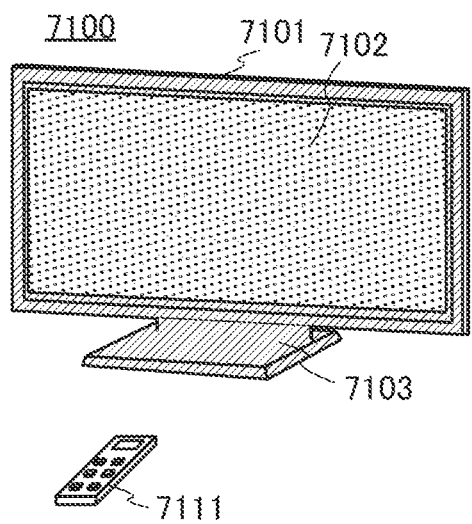
FIGS. 33A-33C are drawings illustrating examples of electronic devices.
Figure 33B:
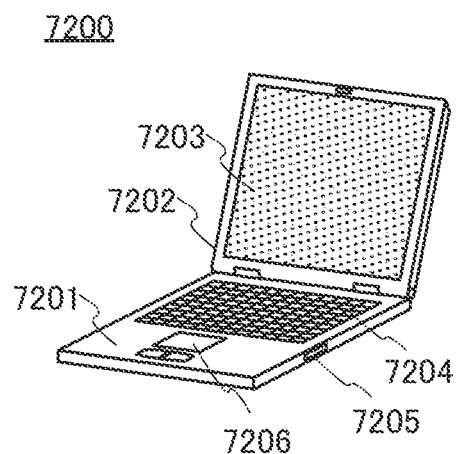
Figure 33C:
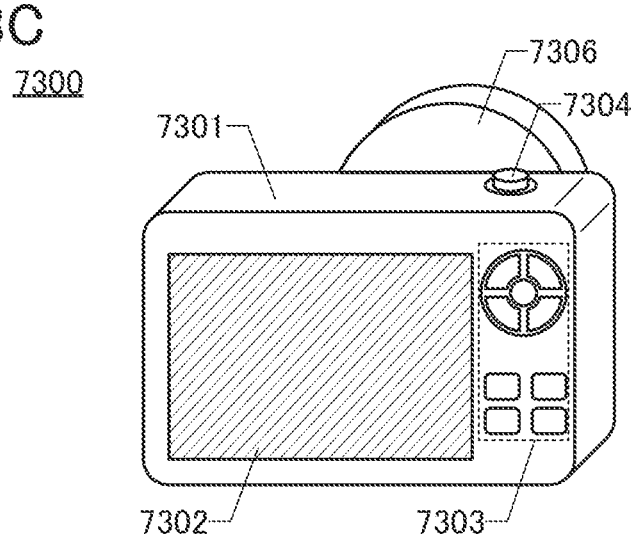

FIG. 33(C) illustrates the watch-type portable information terminal 820. The watch-type portable information terminal 820 includes the housing 811, the display portion 812, the speaker 815, operation keys 818 (including a power switch or an operation switch), and the like. The external shape of the display portion 812 of the portable information terminal 820 is circular. The display portion 812 of the portable information terminal has a flat surface.

The display device of one embodiment of the present invention can be used for the display portion 812. Thus, the portable information terminal having a display portion with a high aperture ratio can be fabricated.

In the portable information terminal in this embodiment, the display portion 812 is provided with a touch sensor. All operations including making a call and inputting text can be performed by touch on the display portion 812 with a finger, a stylus, or the like.

In addition, the operation of the operation button 813 can switch the power ON and OFF operations and types of images displayed on the display portion 812. For example, switching from a mail creation screen to a main menu screen can be performed.

Moreover, when a sensing device such as a gyroscope sensor or an acceleration sensor is provided inside the portable information terminal, the orientation (horizontal or vertical) of the portable information terminal can be determined so that the direction of display on the screen of the display portion 812 can be automatically changed. Furthermore, the direction of display on the screen can be changed by touch on the display portion 812, operation with the operation button 813, sound input using the microphone 816, or the like.

In a television set 7100 illustrated in FIG. 33(A), a display portion 7102 is incorporated in a housing 7101. The display portion 7102 is capable of displaying images. The display device of one embodiment of the present invention can be used for the display portion 7102. Accordingly, a television set having a display portion with a high aperture ratio can be fabricated. In addition, here, a structure is illustrated in which the housing 7101 is supported by a stand 7103.

The television set 7100 can be operated with an operation switch provided in the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television set 7100 is provided with a receiver, a modem, and the like. With the receiver, general television broadcasts can be received. Moreover, when the television set is connected to a communication network with or without wires via the modem, one-way (from a sender to a receiver) or two-way (between a sender and a receiver or between receivers) information communication can be performed.

A computer 7200 illustrated in FIG. 33(B) includes a main body 7201, a housing 7202, a display portion 7203, a keyboard 7204, an external connection port 7205, a pointing device 7206, and the like. Note that the computer is fabricated by using the display device of one embodiment of the present invention for the display portion 7203. Thus, the computer having a display portion with a high aperture ratio can be fabricated.

A camera 7300 illustrated in FIG. 33(C) includes a housing 7301, a display portion 7302, operation buttons 7303, a shutter button 7304, and the like. Moreover, a detachable lens 7306 is attached to the camera 7300.

The display device of one embodiment of the present invention can be used for the display portion 7302. Thus, the camera having a display portion with a high aperture ratio can be fabricated.

Here, the camera 7300 is configured such that the lens 7306 is replaceable and detachable from the housing 7301; however, the lens 7306 and the housing 7301 may be integrated with each other.

The camera 7300 can take still images or moving images with the push of the shutter button 7304. In addition, the display portion 7302 has a function of a touch panel, and images can also be taken by touch on the display portion 7302.

Note that the camera 7300 can be additionally equipped with a stroboscope, a viewfinder, and the like. Alternatively, they may be incorporated into the housing 7301.

This embodiment can be combined with the other embodiments as appropriate.

Example 1

In this example, results of reliability tests performed on transistors that were fabricated to be used for the display device of one embodiment of the present invention will be described.

In this example, two kinds of transistors using metal oxides (oxide semiconductors) in semiconductor layers were fabricated.

A transistor with a bottom-gate top-contact (BGTC) structure was fabricated as Sample 1. The channel length of the transistor is 3.25 μm and the channel width thereof is 2 μm. The transistor was provided with a back gate. A metal oxide film transmitting visible light was used as each of the pair of gate electrodes. A metal oxide film transmitting visible light was also used as a source electrode and a drain electrode.

A transistor with a top-gate self-alignment (TGSA) structure was fabricated as Sample 2. The channel length of the transistor is 3 μm and the channel width thereof is 3 μm. The transistor was provided with a back gate electrode. A metal oxide film transmitting visible light was used as a gate electrode (upper gate electrode). As the back gate electrode, a source electrode, and a drain electrode, metal films were used.

Sample 1 and Sample 2 were subjected to a GBT (Gate Bias Temperature) stress test while irradiated with light. A GBT stress test is a kind of reliability test and can measure a change in transistor characteristics due to long-term use. The samples were irradiated with light from above. That is, during the test, light is delivered to a channel region of the semiconductor layer through the upper gate electrode that is a metal oxide film transmitting visible light in Sample 1 and Sample 2.

In a GBT stress test, the temperature of a substrate over which a transistor is formed is set at a fixed temperature. A source and a drain of the transistor are set at the same potential, and a first gate is supplied with a potential different from the source potential and the drain potential for a certain period.

In this example, in a GBT stress test, a first gate potential Vg of −30 V, a drain potential Vd of 0 V, a source potential Vs of 0 V, and a second gate (back gate) potential Vbg of −30 V were applied for one hour in an environment where the sample temperature was 60° C. and light irradiation (light irradiation with a white LED at approximately 10000 lx) was performed.

As an index of the amount of change in the electrical characteristics of the transistor, variation over time in the threshold voltage (hereinafter also referred to as Vth) of the transistor (hereinafter also referred to as ΔVth) was used. Note that in the Id-Vg characteristics, Vth is defined as the value of Vg when Id=$1.0 \times 10^{-12}$ [A] is satisfied. Here, if Vth when the stress starts to be applied is +0.50 V and Vth after the stress is applied for 100 seconds is −0.55 V, for example, ΔVth after the stress is applied for 100 seconds is −1.05 V.

Figure 34:
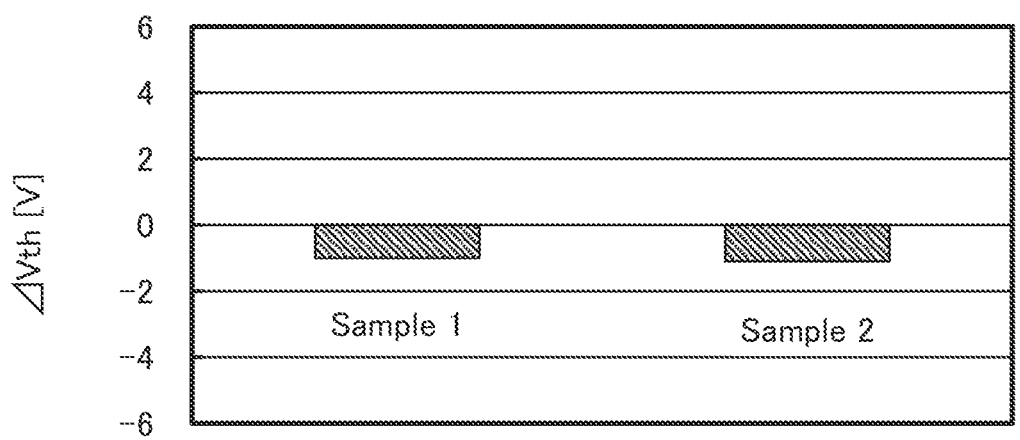
FIG. 34 is a graph showing the results of a reliability test in Example 1.

FIG. 34 shows the GBT stress test results of Sample 1 and Sample 2. Note that in FIG. 34, the left axis represents the amount of change in transistor threshold voltage (ΔVth).

As shown in FIG. 34, the amount of change in the threshold voltage (ΔVth) of Sample 1 was −1.0 V and the ΔVth of Sample 2 was −1.1 V. Thus, it was found that Sample 1 and Sample 2 have high reliability.

The transistor fabricated in this example has high reliability and a small amount of change in electrical characteristics even when irradiated with light. Thus, the transistor can be provided in a display region of a pixel, so that the aperture ratio of the pixel can be increased.

Example 2

In this example, transistors that can be used for a display device of one embodiment of the present invention were fabricated and the characteristics thereof were evaluated.

Specifically, in this example, three transistors corresponding to the transistor 201A illustrated in FIG. 4 and the like were fabricated, and the Id-Vg measurement, a GBT stress test, and a constant-current stress test were performed. Note that the channel length L and the channel width W of the transistors fabricated in this example are 2 μm and 3 μm, respectively.

[Fabrication of Transistors]

First, the conductive layer 291 serving as a back gate was formed over a glass substrate. The conductive layer 291 was formed in such a manner that an approximately 100-nm-thick tungsten film was formed with a sputtering apparatus and then the tungsten film was processed.

Next, the insulating layer 211 serving as a gate insulating layer was formed over the substrate and the conductive layer 291. The insulating layer 211 was formed in such a manner that an approximately 50-nm-thick silicon nitride film, an approximately 300-nm-thick silicon nitride film, an approximately 50-nm-thick silicon nitride film, and an approximately 50-nm-thick silicon oxynitride film were sequentially formed with a plasma-enhanced chemical vapor deposition (PECVD) apparatus.

Next, the semiconductor layer 293 was formed over the insulating layer 211. The semiconductor layer 293 was formed in such a manner that two metal oxide layers (a first metal oxide layer and a second metal oxide layer) were sequentially formed with a sputtering apparatus and then the two metal oxide layers were processed into an island shape.

An approximately 40-nm-thick In—Ga—Zn film was used for the first metal oxide layer, and an approximately 5-nm-thick In—Ga—Zn film was used for the second metal oxide layer. The first metal oxide layer contains CAC-IGZO, and the second metal oxide layer contains CAAC-IGZO.

The first metal oxide layer was formed in such a manner that the substrate temperature was set to 130° C., an argon gas at a flow rate of 180 sccm and an oxygen gas at a flow rate of 20 sccm were introduced into a chamber of a sputtering apparatus, the pressure was set to 0.6 Pa, and an alternating-current power of 2.5 kw was applied to a metal oxide target containing indium, gallium, and zinc (In:Ga:Zn=4:2:4.1 [atomic ratio]). Note that the proportion of oxygen in the whole deposition gas may be referred to as an "oxygen flow rate ratio". The oxygen flow rate ratio at the time of the formation of the first metal oxide layer is 10%.

The second metal oxide layer was formed under the deposition conditions for the first metal oxide layer except for the flow rate of a sputtering gas. Specifically, the second metal oxide layer was formed in such a manner that the introduction of the argon gas into the chamber was stopped, and an oxygen gas at a flow rate of 200 sccm was introduced into the chamber of the sputtering apparatus. The oxygen flow rate ratio at the time of the formation of the second metal oxide layer is 100%.

Next, an approximately 150-nm-thick silicon oxynitride film to be the insulating layer 295 was formed over the insulating layer 211 and the semiconductor layer 293 with a PECVD apparatus. Then, heat treatment was performed at a temperature of 350° C. for one hour in a nitrogen atmosphere.

After that, oxygen plasma treatment was performed using a PECVD apparatus, as oxygen supply treatment.

Then, two metal oxide layers (a third metal oxide layer and a fourth metal oxide layer) to be the conductive layer 296 were sequentially formed over the silicon oxynitride film with a sputtering apparatus.

An approximately 10-nm-thick In—Ga—Zn film was used for the third metal oxide layer, and an approximately 90-nm-thick In—Ga—Zn film was used for the fourth metal oxide layer.

The third metal oxide layer was formed in such a manner that the substrate temperature was set to 170° C., an oxygen gas at a flow rate of 200 sccm was introduced into a chamber of a sputtering apparatus, the pressure was set to 0.6 Pa, and an alternating-current power of 2.5 kw was applied to a metal oxide target containing indium, gallium, and zinc (In:Ga:Zn=4:2:4.1 [atomic ratio]). The oxygen flow rate ratio at the time of the formation of the third metal oxide layer is 100%.

The fourth metal oxide layer was formed under the deposition conditions for the third metal oxide layer except for the flow rate of a sputtering gas. Specifically, the fourth metal oxide layer was formed in such a manner that an argon gas at a flow rate of 180 sccm and an oxygen gas at a flow rate of 20 sccm were introduced into a chamber of a sputtering apparatus. The oxygen flow rate ratio at the time of the formation of the fourth metal oxide layer is 10%.

Next, the insulating layer 295 serving as a gate insulating layer and the conductive layer 296 serving as a gate were formed by processing the silicon oxynitride film and the two metal oxide layers into island shapes.

Then, plasma treatment was performed on an exposed region of the semiconductor layer 293 in an atmosphere of argon and nitrogen, so that a low-resistance region was formed.

Then, the insulating layer 212 and the insulating layer 213 were formed over the semiconductor layer 293, the insulating layer 295, and the conductive layer 296. As the insulating layer 212, an approximately 100-nm-thick silicon nitride film was formed with a PECVD apparatus. As the insulating layer 213, an approximately 300-nm-thick silicon oxynitride film was formed with a PECVD apparatus. After that, heat treatment was performed at a temperature of 350° C. for one hour in a nitrogen atmosphere.

Next, the conductive layer 294a and the conductive layer 294b serving as a source and a drain were formed over the insulating layer 213. The conductive layer 294a and the conductive layer 294b were formed in such a manner that an approximately 50-nm-thick titanium film, an approximately 400-nm-thick aluminum film, and an approximately 100-nm-thick titanium film were sequentially formed with a sputtering apparatus, and then the three conductive films were processed.

Then, an approximately 1.5-μm-thick acrylic film was formed as the insulating layer 215 over the insulating layer 213, the conductive layer 294a, and the conductive layer 294b. After that, heat treatment was performed at a temperature of 250° C. for one hour in a nitrogen atmosphere.

[Id-Vg Characteristics of Transistors]

Next, measurement results of the Id-Vg characteristics of the transistors will be described. As for conditions for measuring the Id-Vg characteristics of the transistors, voltages from −15 V to +20 V were applied in increments of 0.25 V to the conductive layer 296 serving as the gate (as gate voltage (Vg)) and to the conductive layer 291 serving as a back gate (as back gate voltage (Vbg)). Voltage applied to the conductive layer serving as a source (source voltage (Vs)) was 0 V (comm), and voltage applied to the conductive layer serving as a drain (drain voltage (Vd)) was 0.1 V and 20 V.

Figure 35:
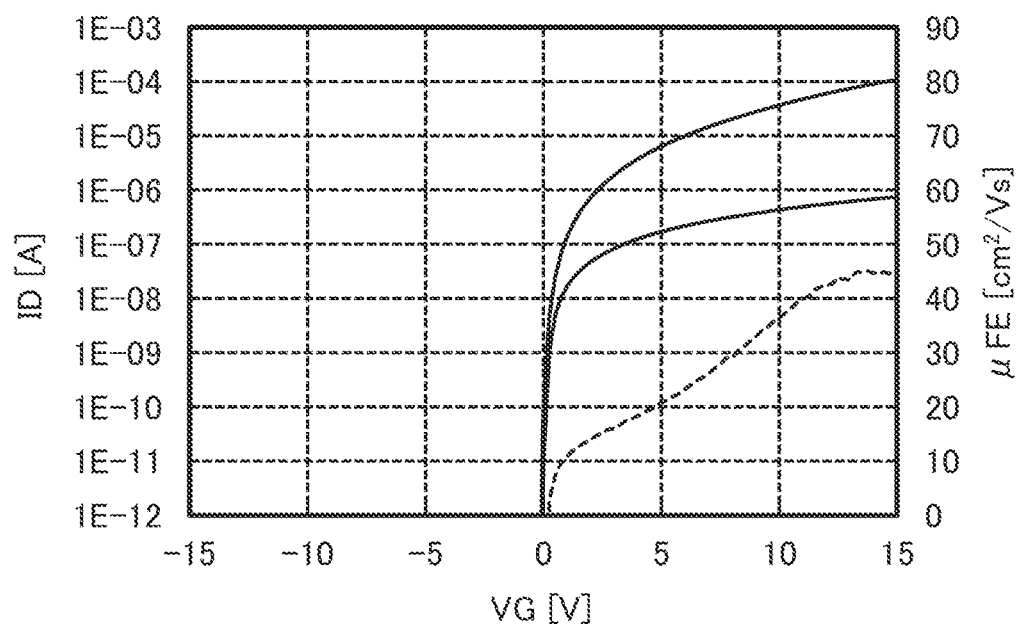
FIG. 35 is a graph showing the measurement results of Id-Vg characteristics in Example 2.

FIG. 35 shows the measurement results of the Id-Vg characteristics. In FIG. 35, the first vertical axis represents Id (A), the second vertical axis represents field-effect mobility (μFE (cm²/Vs)), and the horizontal axis represents Vg (V). Note that the field-effect mobility was measured when Vd was 20 V.

In FIG. 35, the subthreshold swing (S value) was 0.15 V/dec, the threshold voltage Vth was 0.13 V, and μFE was 44 cm²/Vs. Thus, in this example, the transistors having high field-effect mobility and excellent switching characteristics were fabricated.

[GBT Stress Test]

Next, GBT test results of the transistors will be described. In this example, as a GBT stress test, a test in which a positive voltage is applied to a gate (PBTS) and a test in which a negative voltage is applied to a gate while the gate was irradiated with light (NBITS) were performed. In PBTS, a substrate over which the transistor was formed was held at 60° C., a voltage of 0 V was applied to a source and a drain of the transistor, and a voltage of 30 V was applied to a gate; this state was held for one hour. In NBITS, a voltage of −30 V was applied to the gate under light irradiation with a white LED at 10000 lx; this state was held for 3600 seconds.

Figure 36:
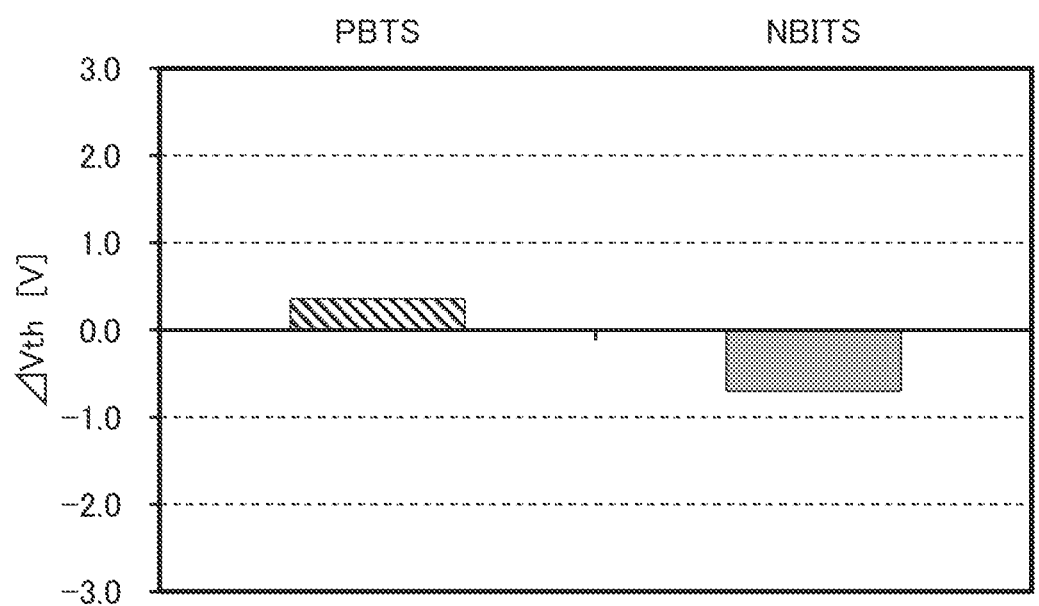
FIG. 36 is a graph showing the results of GBT stress tests in Example 2.

FIG. 36 shows the results of the GBT stress test. FIG. 36 indicates that favorable results are obtained in which the amount of change in threshold value (ΔVth) is smaller than or equal to ±1 V. A factor contributing to the favorable results obtained in the GBT stress test is presumably as follows, for example: the transistor of this example includes as the semiconductor layer 293 a stack of the CAC-OS film and the CAAC-OS film and thus a buried channel is formed.

[Constant-Current Stress Test]

Next, results of the constant-current stress test performed on the transistors will be described. The constant-current stress test was performed under an air atmosphere in a dark state (Dark). In the constant-current stress test, the substrate temperature was set to 60° C., the source potential was set to a ground potential (GND), the drain potential was set to 10 V, and the gate potential was set to 0.82 V; this state was held for approximately 18 hours.

Figure 37:
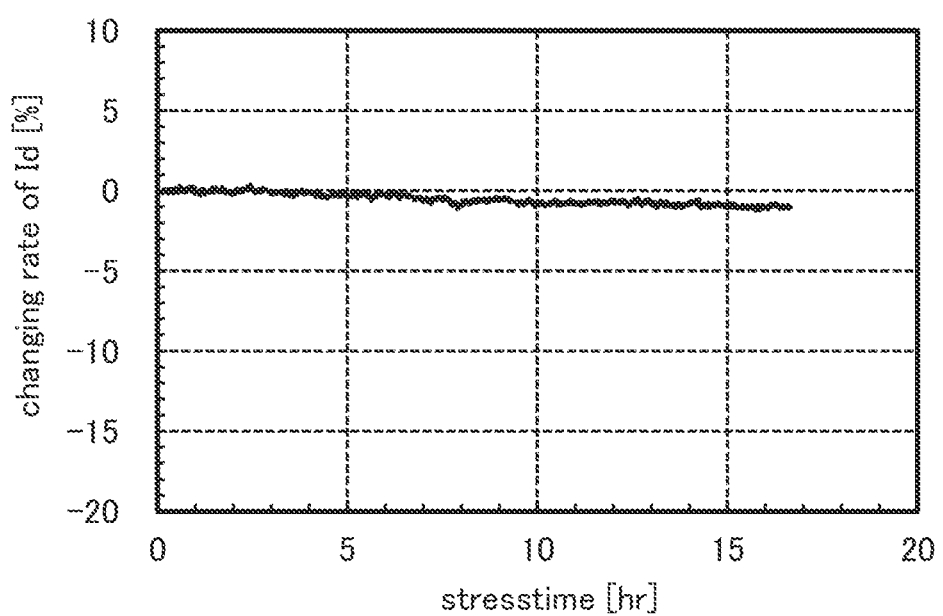
FIG. 37 is a graph showing the results of constant-current stress tests in Example 2.

FIG. 37 shows results of the constant-current stress test. In FIG. 37, the vertical axis represents the degradation rate of drain current (Id) (changing rate of Id), and the horizontal axis represents stress time. As shown in FIG. 37, a variation in the current value of the transistors of this example is small. The transistors of this example include as the semiconductor layer 293 the stack of the CAC-OS film and the CAAC-OS film and thus tend to have a smaller variation in current value than an OS transistor or an LTPS transistor without these films.

Since the transistors in this example have high field-effect mobility and excellent switching characteristics, they are suitable for a transistor included in a driver circuit portion. Furthermore, the transistors in this example have small variations in the current values; thus, they are suitable for a pixel transistor of an organic EL display and help inhibit the luminance decay of the display.

Example 3

In this example, a transistor that can be used for a display device of one embodiment of the present invention was fabricated and the characteristics thereof were evaluated.

Specifically, in this example, a transistor corresponding to the transistor 201A illustrated in FIG. 4 and the like was fabricated and the Id-Vd characteristics of the transistor were measured. Note that the channel length L of the transistor fabricated in this example was 3 μm and the channel width W thereof was 3 μm.

[Fabrication of Transistor]

First, the conductive layer 291 serving as a back gate was formed over a glass substrate. The conductive layer 291 was formed in such a manner that an approximately 100-nm-thick tungsten film was formed with a sputtering apparatus and then the tungsten film was processed.

Next, the insulating layer 211 serving as a gate insulating layer was formed over the substrate and the conductive layer 291. The insulating layer 211 was formed in such a manner that an approximately 250-nm-thick silicon nitride film, an approximately 50-nm-thick silicon nitride film, and an approximately 5-nm-thick silicon oxynitride film were sequentially formed with a plasma-enhanced chemical vapor deposition (PECVD) apparatus.

Next, the semiconductor layer 293 was formed over the insulating layer 211. The semiconductor layer 293 was formed in such a manner that two metal oxide layers (a first metal oxide layer and a second metal oxide layer) were sequentially formed with a sputtering apparatus and then the two metal oxide layers were processed into an island shape.

An approximately 40-nm-thick In—Ga—Zn film was used for the first metal oxide layer, and an approximately 5-nm-thick In—Ga—Zn film was used for the second metal oxide layer. The first metal oxide layer contains CAC-IGZO, and the second metal oxide layer contains CAAC-IGZO.

The first metal oxide layer was formed in such a manner that the substrate temperature was set to 130° C., an argon gas at a flow rate of 180 sccm and an oxygen gas at a flow rate of 20 sccm were introduced into a chamber of a sputtering apparatus, the pressure was set to 0.6 Pa, and an alternating-current power of 2.5 kw was applied to a metal oxide target containing indium, gallium, and zinc (In:Ga:Zn=4:2:4.1 [atomic ratio]). Note that the proportion of oxygen in the whole deposition gas may be referred to as an "oxygen flow rate ratio". The oxygen flow rate ratio at the time of the formation of the first metal oxide layer is 10%.

The second metal oxide layer was formed under the deposition conditions for the first metal oxide layer except for the flow rate of a sputtering gas. Specifically, the second metal oxide layer was formed in such a manner that the introduction of the argon gas into the chamber was stopped, and an oxygen gas at a flow rate of 200 sccm was introduced into the chamber of the sputtering apparatus. The oxygen flow rate ratio at the time of the formation of the second metal oxide layer is 100%.

Next, heat treatment was performed. As the heat treatment, heat treatment at a heating temperature of 350° C. in a nitrogen atmosphere for one hour and then heat treatment in a mixed gas atmosphere of nitrogen and oxygen for one hour were performed.

Next, an approximately 150-nm-thick silicon oxynitride film to be the insulating layer 295 was formed over the insulating layer 211 and the semiconductor layer 293 with a PECVD apparatus. After that, heat treatment was performed at a temperature of 350° C. for one hour in a nitrogen atmosphere. Then, oxygen plasma treatment was performed using a PECVD apparatus as oxygen supply treatment. Then, an approximately 20-nm-thick aluminum oxide film to be the insulating layer 295 was formed over the silicon oxynitride film.

Next, three conductive layers to be the conductive layer 296 were formed over the aluminum oxide film with a sputtering apparatus. Specifically, an approximately 50-nm-thick titanium film, an approximately 200-nm-thick aluminum film, and a 50-nm-thick titanium film were sequentially formed with a sputtering apparatus.

Next, the insulating layer 295 serving as a gate insulating layer and the conductive layer 296 serving as a gate were formed by processing the silicon oxynitride film, the aluminum oxide film, and the three conductive layers into island shapes.

Then, plasma treatment was performed on an exposed region of the semiconductor layer 293 in an atmosphere of argon and nitrogen, so that a low-resistance region was formed.

Then, the insulating layer 212 and the insulating layer 213 were formed over the semiconductor layer 293, the insulating layer 295, and the conductive layer 296. As the insulating layer 212, an approximately 100-nm-thick silicon nitride film was formed with a PECVD apparatus. As the insulating layer 213, an approximately 300-nm-thick silicon oxynitride film was formed with a PECVD apparatus. After that, heat treatment was performed at a temperature of 350° C. for one hour in a nitrogen atmosphere.

Next, the conductive layer 294a and the conductive layer 294b serving as a source and a drain were formed over the insulating layer 213. The conductive layer 294a and the conductive layer 294b were formed in such a manner that an approximately 100-nm-thick molybdenum film was formed with a sputtering apparatus and then processed.

Then, an approximately 1.5-μm-thick acrylic film was formed as the insulating layer 215 over the insulating layer 213, the conductive layer 294a, and the conductive layer 294b. After that, heat treatment was performed at a temperature of 250° C. for one hour in a nitrogen atmosphere.

[Id-Vd Characteristics of Transistor]

Next, measurement results of the Id-Vd characteristics of the transistor will be described. The Id-Vd characteristics of the transistor were measured under the conditions where the gate voltage was 1.6 V and the drain voltage was swept from 0 V to 15 V in increments of 0.2 V.

Figure 38:
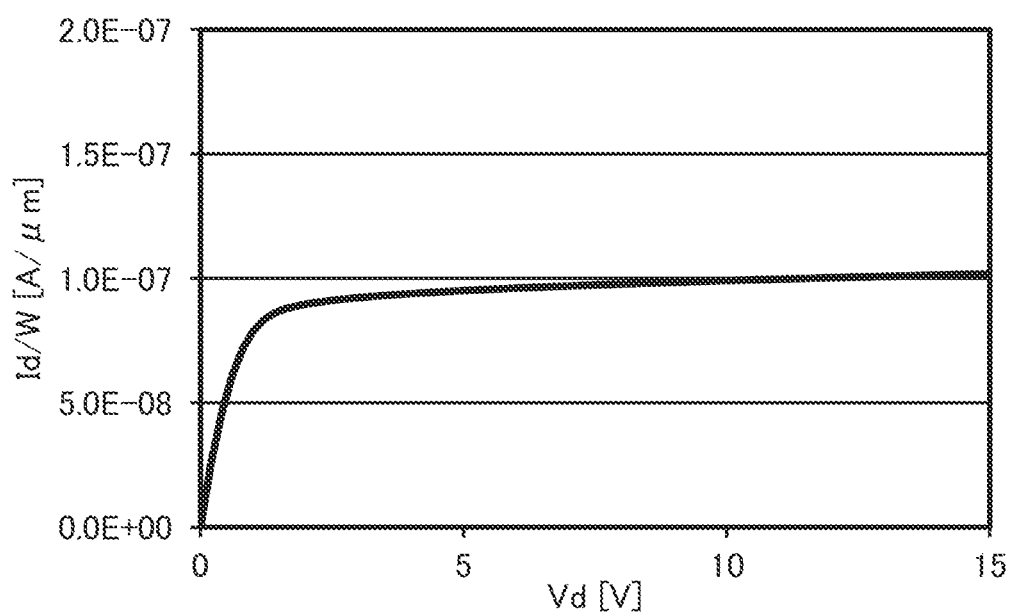
FIG. 38 is a graph showing the measurement results of Id-Vd characteristics in Example 3.

FIG. 38 shows the measurement results of the Id-Vd characteristics. In FIG. 38, the vertical axis represents Id/W (A/μm) and the horizontal axis represents Vd (V). As shown in FIG. 38, Id was little changed even when Vd was changed in the transistor in this example.

Meanwhile, when a transistor that has a structure similar to that in this example and has a channel length L of 2 μm and a channel width W of 20 μm was fabricated and the gate voltage Vg and the drain voltage Vd were set to 10 V and 5 V, respectively, the on-state current was $2.18 \times 10^{-4}$ A. This value is comparable to that of an LTPS transistor. It was found that an OS transistor, which has a short channel length difficult to achieve in an LTPS transistor, can have an on-state current comparable to that of the LTPS transistor.

The transistor in this example has a high on-state current and is suitable as a transistor included in a driver circuit portion. Furthermore, Id was little changed even when Vd was changed in the transistor in this example; thus, the transistor is suitable for a pixel transistor of an organic EL display and helps inhibit the luminance decay of the display.

REFERENCE NUMERALS 10A to 10 C display device
11 substrate
12 substrate
13 backlight unit
14 transistor
15 liquid crystal element
16 transistor
21 pixel electrode
22 liquid crystal layer
23 common electrode
25 conductive layer
26 insulating layer
27 conductive layer
28 conductive layer
29 connector
31 touch sensor unit
32 insulating layer
40 liquid crystal element
45 light
45a light 45b light
51 substrate
61 substrate
62 display portion
63 connection portion
64 driver circuit portion
65 wiring
66 non-display region
68 display region
72 FPC
72a FPC
72b FPC
73 IC
73a IC
73b IC
100A to 100F display device
110A to 110C display device
111 pixel electrode
112 common electrode
113 liquid crystal layer
120A to 120B display device
121 overcoat
124 electrode
125 insulating layer
126 conductive layer
127 electrode
128 electrode
130 polarizer
131 coloring layer
132 light-blocking layer
133a alignment film
133b alignment film
137 wiring
138 wiring
140A and 140B display device
141 adhesive layer
160 protection substrate
161 backlight
162 substrate
163 adhesive layer
164 adhesive layer
165 polarizer
166 polarizer
167 adhesive layer
168 adhesive layer
169 adhesive layer
201A to 201F transistor
202A to 202C transistor
204 connection portion
206A to 206F transistor
207A to 207C transistor
208A and 208B transistor
211 insulating layer
212 insulating layer
213 insulating layer
215 insulating layer
216 base layer
217 insulating layer
218 insulating layer
220 insulating layer
221 conductive layer
222a to 222d conductive layer
223 conductive layer
224 signal line
225 insulating layer
229 conductive layer
231 semiconductor layer
231a channel region
231b low-resistance region
232 impurity semiconductor layer
233 insulating layer
242 connector
242b connector
251 conductive layer
291 conductive layer
292 insulating layer
293 semiconductor layer
293a channel region
293b low-resistance region
293c LDD region
294a conductive layer
294b conductive layer
295 insulating layer
296 conductive layer
900 pixel
900s light-blocking region
900t transmissive region
902 wiring
904 wiring
914 transistor
915 capacitor
916 wiring contact portion
918B display region
918G display region
918R display region
918W display region
930LC liquid crystal element
932BM light-blocking film
932CF coloring film

The invention claimed is:
1. A display device comprising:
a display portion; and
a driver circuit portion,
wherein the display portion comprises a liquid crystal element, a first transistor, a scan line, and a signal line,
wherein the driver circuit portion comprises a second transistor,
wherein the liquid crystal element comprises a pixel electrode, a liquid crystal layer, and a common electrode,
wherein each of the scan line and the signal line is electrically connected to the first transistor,
wherein the scan line and the signal line each comprise a metal layer,
wherein a structure of the first transistor is different from a structure of the second transistor,
wherein each of a first semiconductor layer of the first transistor and a second semiconductor layer of the second transistor is provided over and in direct contact with a first insulating layer,
wherein the first semiconductor layer comprises a first metal oxide,
wherein the second semiconductor layer comprises a second metal oxide,
wherein the first transistor comprises a first region directly connected to the pixel electrode,
wherein the second transistor comprises a second insulating layer over the second semiconductor layer and a first upper gate electrode over the second insulating layer,
wherein the first upper gate electrode comprises an oxide conductor comprising an impurity element, wherein an upper end of a side surface of the second insulating layer and a lower end of a side surface of the first upper gate electrode coincide with each other,
wherein each of the pixel electrode, the common electrode, and the first region comprises a conductive material transmitting visible light, and
wherein visible light passes through the first region and the liquid crystal element and is emitted to an outside of the display device.

2. The display device according to claim 1,
wherein the first transistor comprises a first lower gate electrode overlapped with the first semiconductor layer, and
wherein the first upper gate electrode overlaps with the second semiconductor layer.

3. The display device according to claim 2,
wherein a portion of the scan line is the first lower gate electrode.

4. The display device according to claim 2,
wherein the first transistor further comprises a second upper gate electrode overlapping with the first semiconductor layer.

5. The display device according to claim 2,
wherein the second transistor further comprises a second lower gate electrode overlapped with the second semiconductor layer.

6. The display device according to claim 1,
wherein the first region comprises a third metal oxide, and
wherein the third metal oxide in the first region contains one or more kinds of metal elements contained in the first metal oxide.

7. A display module comprising:
the display device according to claim 1; and
a circuit board.

8. An electronic device comprising:
the display module according to claim 7; and
at least any one of an antenna, a battery, a housing, a camera, a speaker, a microphone, and an operation button.

9. A display device comprising:
a display portion; and
a driver circuit portion,
wherein the display portion comprises a liquid crystal element, a first transistor, a scan line, and a signal line,
wherein the driver circuit portion comprises a second transistor,
wherein the liquid crystal element comprises a pixel electrode, a liquid crystal layer, and a common electrode,
wherein each of the scan line and the signal line is electrically connected to the first transistor,
wherein the scan line and the signal line each comprise a metal layer,
wherein the first transistor comprises:
 a first lower gate electrode;
 a first insulating layer over the first lower gate electrode;
 a first semiconductor layer over and in direct contact with the first insulating layer; and
 a first conductive layer over and in contact with the first semiconductor layer, the first conductive layer directly connected to the pixel electrode,
wherein the second transistor comprises:
 a second semiconductor layer over and in direct contact with the first insulating layer;
 a second insulating layer over the second semiconductor layer; and
 a first upper gate electrode over the second insulating layer,
wherein the first upper gate electrode comprises an oxide conductor comprising an impurity element,
wherein each of the first semiconductor layer and the second semiconductor layer comprises a metal oxide,
wherein each of the pixel electrode, the common electrode, and the first conductive layer comprises a conductive material transmitting visible light, and
wherein an upper end of a side surface of the second insulating layer and a lower end of a side surface of the first upper gate electrode coincide with each other.

10. A display module comprising:
the display device according to claim 9; and
a circuit board.

11. An electronic device comprising:
the display module according to claim 10; and
at least any one of an antenna, a battery, a housing, a camera, a speaker, a microphone, and an operation button.

12. The display device according to claim 9,
wherein the first transistor further comprises a second upper gate electrode overlapping with the first semiconductor layer.

13. The display device according to claim 9,
wherein the second transistor further comprises a second lower gate electrode overlapped with the second semiconductor layer.

14. A display device comprising:
a display portion; and
a driver circuit portion,
wherein the display portion comprises a liquid crystal element, a first transistor, a scan line, and a signal line,
wherein the driver circuit portion comprises a second transistor,
wherein the liquid crystal element comprises a pixel electrode, a liquid crystal layer, and a common electrode,
wherein each of the scan line and the signal line is electrically connected to the first transistor,
wherein the scan line and the signal line each comprise a metal layer,
wherein the first transistor comprises:
 a first lower gate electrode;
 a first insulating layer over the first lower gate electrode;
 a first semiconductor layer over and in direct contact with the first insulating layer, the first semiconductor layer comprising a first metal oxide and overlapping with the first lower gate electrode; and
 a first conductive layer over and in contact with the first semiconductor layer, the first conductive layer directly connected to the pixel electrode,
wherein the second transistor comprises:
 a second semiconductor layer over and in direct contact with the first insulating layer, the second semiconductor layer comprising a second metal oxide;
 a second insulating layer over the second semiconductor layer; and
 a first upper gate electrode over the second insulating layer, the first upper gate electrode overlapping with the second semiconductor layer,
wherein the first upper gate electrode comprises an oxide conductor comprising an impurity element,
wherein each of the pixel electrode, the common electrode, and the first conductive layer comprises a conductive material transmitting visible light, and wherein an upper end of a side surface of the second insulating layer and a lower end of a side surface of the first upper gate electrode coincide with each other.

15. A display module comprising:
the display device according to claim 14; and
a circuit board.

16. An electronic device comprising:
the display module according to claim 15; and
at least any one of an antenna, a battery, a housing, a camera, a speaker, a microphone, and an operation button.

17. The display device according to claim 14,
wherein the first transistor further comprises a second upper gate electrode overlapping with the first semiconductor layer.

18. The display device according to claim 14,
wherein the second transistor further comprises a second lower gate electrode overlapped with the second semiconductor layer.

* * * * *